United States Patent
Hatakeyama et al.

(10) Patent No.: US 7,771,914 B2
(45) Date of Patent: *Aug. 10, 2010

(54) RESIST COMPOSITION AND PATTERNING PROCESS

(75) Inventors: Jun Hatakeyama, Joetsu (JP); Takao Yoshihara, Joetsu (JP); Yuji Harada, Joetsu (JP); Wataru Kusaki, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 8 days.

This patent is subject to a terminal disclaimer.

(21) Appl. No.: 11/872,952

(22) Filed: Oct. 16, 2007

(65) Prior Publication Data

US 2008/0090172 A1 Apr. 17, 2008

(30) Foreign Application Priority Data

Oct. 17, 2006 (JP) .............................. 2006-282203

(51) Int. Cl.
*G03F 7/039* (2006.01)
*G03F 7/038* (2006.01)
*G03F 7/20* (2006.01)
*G03F 7/30* (2006.01)

(52) U.S. Cl. ............... 430/270.1; 430/907; 430/910; 430/325; 430/326; 430/330; 430/942

(58) Field of Classification Search .................. None
See application file for complete search history.

(56) References Cited

U.S. PATENT DOCUMENTS

| | | | |
|---|---|---|---|
| 5,714,625 | A | 2/1998 | Hada et al. |
| 6,004,724 | A | 12/1999 | Yamato et al. |
| 6,063,953 | A | 5/2000 | Hada et al. |
| 6,261,738 | B1 | 7/2001 | Asakura et al. |
| 6,512,020 | B1 | 1/2003 | Asakura et al. |
| 6,869,744 | B2 | 3/2005 | Hatakeyama |
| 6,916,591 | B2 | 7/2005 | Ohsawa et al. |
| 2003/0078352 | A1* | 4/2003 | Miyazawa et al. .......... 526/245 |
| 2005/0147920 | A1* | 7/2005 | Lin et al. ................ 430/311 |
| 2005/0221221 | A1* | 10/2005 | Hatakeyama et al. .... 430/270.1 |
| 2007/0003867 | A1 | 1/2007 | Hatakeyama et al. |
| 2007/0099114 | A1 | 5/2007 | Watanabe et al. |
| 2007/0122741 | A1 | 5/2007 | Hatakeyama et al. |
| 2007/0231738 | A1* | 10/2007 | Kaneko et al. ........... 430/270.1 |

FOREIGN PATENT DOCUMENTS

| | | | |
|---|---|---|---|
| JP | 9-95479 | A | 4/1997 |
| JP | 9-230588 | A | 9/1997 |
| JP | 9-301948 | A | 11/1997 |
| JP | 2906999 | B2 | 6/1999 |
| JP | 2000-314956 | A | 11/2000 |
| JP | 2005-232095 | A | 9/2005 |
| JP | 2005-264131 | A | 9/2005 |
| JP | 2006-145777 | A | 6/2006 |
| JP | 2007-25634 | A | 2/2007 |
| WO | 2004-074242 | A2 | 9/2004 |

OTHER PUBLICATIONS

B. J. Lin; "Semiconductor Foundry, Lithography, and Partners", Micropatterning Division, TSMC, Inc., SPIE, vol. 4690, pp. xxix-xlii.
Soichi Owa et al.; "Immersion lithography; its potential performance and issues", SPIE, vol. 5040, pp. 724-733, 2003.
Taku Hirayama; "Resist and Cover Material Investigation for Immersion Lithography", 2nd. Immersion Workshop, Jul. 11, 2003.
Koji Arimitsu et al.; "Sensitivity Enhancement of Chemical-Amplification-Type Photoimaging Materials by Acetoacetic Acid Derivatives"; Journal of Photopolymer Science and Technology, vol. 8, No. 1, pp. 43-44, 1995.
Koji Arimitsu et al.; "Effect of Phenolic Hydroxyl Residues on the Improvement of Acid-Proliferation-Type Photoimaging Materials"; Journal of Photopolymer Science and Technology, vol. 9, No. 1, pp. 29-30, 1996.

* cited by examiner

*Primary Examiner*—Sin J. Lee
(74) *Attorney, Agent, or Firm*—Westerman, Hattori, Daniels & Adrian, LLP

(57) ABSTRACT

A resist composition comprises a polymer comprising recurring units having formula (1) wherein $R^1$, $R^4$, $R^7$, and $R^{14}$ are H or methyl, $R^2$, $R^3$, $R^{15}$, and $R^{16}$ are H, alkyl or fluoroalkyl, R is F or H, $R^5$ is alkylene, $R^6$ is fluorinated alkyl, $R^8$ is a single bond or alkylene, $R^{10}$ and $R^{11}$ are H, F, methyl or trifluoromethyl, $R^{12}$ and $R^{13}$ are a single bond, —O— or —$CR^{18}R^{19}$—, $R^9$, $R^{18}$, and $R^{19}$ are H, F, methyl or trifluoromethyl, $R^{17}$ is alkylene, $X^1$, $X^2$ and $X^3$ are —C(=O)—O—, —O—, or —C(=O)—$R^{20}$—C(=O)—O— wherein $R^{20}$ is alkylene, $0 \leq (a-1) < 1$, $0 \leq (a-2) < 1$, $0 \leq (a-3) < 1$, $0 < (a-1)+(a-2)+(a-3) < 1$, $0 < b < 1$, and $0 < (a-1)+(a-2)+(a-3)+b \leq 1$.

18 Claims, No Drawings

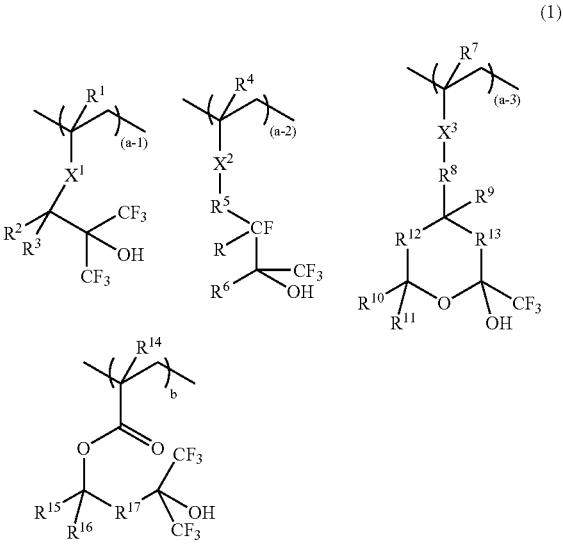

(1)

RESIST COMPOSITION AND PATTERNING PROCESS

CROSS-REFERENCE TO RELATED APPLICATION

This non-provisional application claims priority under 35 U.S.C. §119(a) on Patent Application No. 2006-282203 filed in Japan on Oct. 17, 2006, the entire contents of which are hereby incorporated by reference.

TECHNICAL FIELD

This invention relates to resist compositions for use in the lithography technology for the microfabrication of semiconductor devices or the like, especially the immersion photolithography utilizing an ArF excimer laser of wavelength 193 nm as the light source and interposing water between a projection lens and a wafer. It also relates to a patterning process using the resist compositions.

BACKGROUND ART

In the recent drive for higher integration and operating speeds in LSI devices, the pattern rule is made drastically finer. The photolithography which is currently on widespread use in the art is approaching the essential limit of resolution determined by the wavelength of a light source.

As the light source used in the lithography for resist pattern formation, g-line (436 nm) or i-line (365 nm) from a mercury lamp was widely used. One means believed effective for further reducing the feature size is to reduce the wavelength of exposure light. For the mass production process of 64 MB dynamic random access memories (DRAM, processing feature size 0.25 µm or less) and later ones, the exposure light source of i-line (365 nm) was replaced by a KrF excimer laser having a shorter wavelength of 248 nm.

However, for the fabrication of DRAM with a degree of integration of 256 MB and 1 GB or more requiring a finer patterning technology (processing feature size 0.2 µm or less), a shorter wavelength light source is required. Over a decade, photolithography using ArF excimer laser light (193 nm) has been under active investigation.

It was expected at the initial that the ArF lithography would be applied to the fabrication of 180-nm node devices. However, the KrF excimer lithography survived to the mass-scale fabrication of 130-nm node devices. So, the full application of ArF lithography started from the 90-nm node. The ArF lithography combined with a lens having an increased numerical aperture (NA) of 0.9 is considered to comply with 65-nm node devices.

For the next 45-nm node devices which required an advancement to reduce the wavelength of exposure light, the $F_2$ lithography of 157 nm wavelength became a candidate. However, for the reasons that the projection lens uses a large amount of expensive $CaF_2$ single crystal, the scanner thus becomes expensive, hard pellicles are introduced due to the extremely low durability of soft pellicles, the optical system must be accordingly altered, and the etch resistance of resist is low; the postponement of F, lithography and the early introduction of ArF immersion lithography were advocated (see Proc. SPIE Vol. 4690 xxix).

In the ArF immersion lithography, the space between the projection lens and the wafer is filled with water. Since water has a refractive index of 1.44 at 193 nm, pattern formation is possible even using a lens with NA of 1.0 or greater. Theoretically, it is possible to increase the NA to 1.35. The resolution is improved by an increment of NA. A combination of a lens having NA of at least 1.2 with ultra-high resolution technology suggests a way to the 45-nm node (see Proc. SPIE Vol. 5040, p 724).

Several problems associated with the presence of water on resist were pointed out. Because the photoacid generator in the resist film, the acid generated therefrom upon exposure, and the amine compound added to the resist as a quencher can be leached in water in contact with the resist film, pattern profile changes occur. The pattern collapses due to swelling of the resist film with water.

With respect to the leaching of resist components into water, a study started from the standpoint of preventing the projection lens of the lithography system from contamination. Several lithography system manufacturers proposed the limit of leach-outs.

For overcoming these problems, it was proposed to provide a protective coating of perfluoroalkyl compound between the resist film and water (see the 2nd Immersion Workshop, Jul. 11, 2003, Resist and Cover Material Investigation for Immersion Lithography). The provision of such a protective coating avoids direct contact between the resist film and water and inhibits the resist film from being leached with water.

However, protective coatings made of perfluoroalkyl compounds use fluorocarbons like Freon® as the diluent for controlling a coating thickness. As is well known, the use of fluorocarbons is a consideration in view of environmental protection. In addition, the protective coating must be stripped prior to development of the resist film. Therefore, special units for coating and stripping of the protective film must be added to the existing system. Fluorocarbon solvents add to the expense. These factors raise serious problems on practical use.

One means proposed for mitigating practical drawbacks of the protective film of solvent stripping type is a protective film of the type which is soluble in alkaline developer (JP-A 2005-264131). The alkali-soluble protective film is epoch-making in that it eliminates a need for a stripping step or a special stripping unit because it can be stripped off at the same time as the development of a photoresist film. However, on use of a protective film of alkaline developer soluble type, the step of coating a protective film is still necessary. Also, the diluent solvent necessary to form a coating solution of protective film material must be selected from those solvents in which the photoresist film is not readily dissolved, because the solvent should not attack the underlying film or photoresist film. To avoid troubles like resin precipitation resulting from mixing of the resist and protective film coating solutions, a special unit for coating of a protective film is needed.

As discussed above, the immersion lithography suffers from drawbacks including an increased cost due to use of a protective film. One effort taken to overcome these problems is the development of a resist composition for the immersion lithography which is endowed with a barrier property against water and thus eliminates a need for protective film. This will achieve a cost reduction as well.

The ArF immersion lithography systems commercially available at the present are designed such that water is partly held between the projection lens and the wafer rather than immersing the resist-coated substrate fully in water, and exposure is carried out by scanning the wafer-holding stage at a speed of 300 to 550 mm/sec. Because of such high-speed scanning, water cannot be held between the projection lens and the wafer, and water droplets are left on the surface of the resist film or protective film after scanning. It is believed that residual droplets cause defective pattern formation.

To eliminate the droplets remaining on the surface of the resist or protective film after scanning, it is necessary to improve the flow or mobility of water on the relevant coating film. It is reported that the number of defects associated with the immersion lithography can be reduced by increasing the receding contact angle of the resist or protective film with water. See 2nd International Symposium on Immersion Lithography, 12-15 Sep., 2005, Defectivity data taken with a full-field immersion exposure tool, Nakano et al.

However, no compromise has been established between barrier property and receding contact angle. There is a need for a resist composition capable of meeting both the requirements.

Resist compositions for mask blanks suffer from problems including a change of sensitivity during long-term exposure in vacuum and long-term stability after coating. With respect to the stability in vacuum, an improvement is made by a combination of acid labile groups of acetal and tertiary ester types (U.S. Pat. No. 6,869,744). It is believed that after coating of a resist composition, an amine component is adsorbed to the resist film surface whereby the resist varies its sensitivity or profile. A method of preventing adsorption of an amine component or surface modification of the resist film is believed effective for improving the stability after coating.

It is reported that the profile of a line-and-space pattern differs between a bright pattern where a peripheral portion around the pattern is exposed and a dark pattern where a peripheral portion around the pattern is not exposed. When a peripheral portion around the pattern is exposed, the acid generated in the peripheral portion can evaporate during PEB to cover the pattern area, whereby the line pattern undergoes a film slimming. When a peripheral portion around the pattern is not exposed, no acid is supplied from the peripheral portion and inversely, amine evaporates whereby the line pattern takes a bulged top profile. This difference of profile, which is referred to as "dark-bright difference," occurs in the immersion lithography, but a similar phenomenon also occurs in dry lithography and electron beam vacuum lithography. The dark-bright difference can be reduced by providing a protective coating on the resist film.

DISCLOSURE OF THE INVENTION

An object of the invention is to provide a resist composition which forms a resist film having good barrier property against water, effective for preventing leaching with water, and having a high receding contact angle with water enough to eliminate residual droplets without a need for a protective coating, and which has improved process adaptability for use in the immersion lithography. Another object is to provide a patterning process using the resist composition.

Making experimentation to attain the above and other objects, the inventors have arrived at the following discovery. JP-A 2005-232095 discloses a methacrylate ester having both a bulky alkyl group and a hexafluoroalcohol group. A homopolymer of this ester has a very high water repellency, but is insoluble in alkali, with a risk that when added to a resist composition, it can cause defects after development. Then, by copolymerizing with alkali-soluble units for use in resist protective coatings as described in JP-A 2006-145777, JP-A 2007-25634, and Japanese Patent Application No. 2007-012135, a material capable of meeting both water repellency and alkali solubility was developed. This material, however, is suited for forming a protective coating on a resist film in the immersion lithography.

The present invention provides a resist composition comprising a polymer comprising recurring units having the general formula (I).

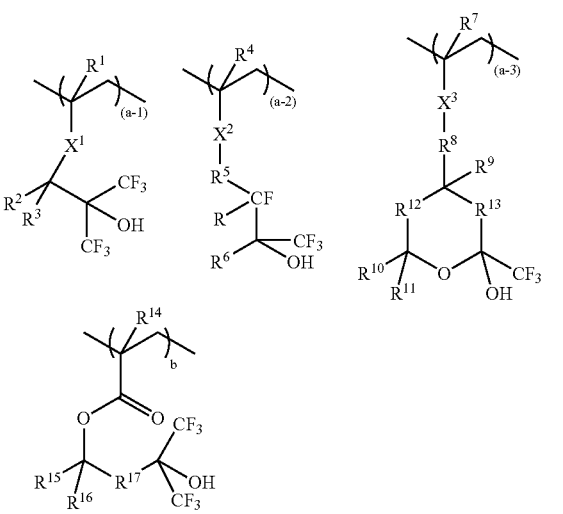

(1)

Herein $R^1$, $R^4$, $R^7$, and $R^{14}$ are each independently hydrogen or methyl; $R^2$, $R^3$, $R^{15}$, and $R^{16}$ are each independently hydrogen or a straight, branched or cyclic $C_1$-$C_{20}$ alkyl or fluoroalkyl group, or $R^2$ and $R^3$, and $R^{15}$ and $R^{16}$ may bond together to form a ring with the carbon atom to which they are attached, and in this case, $R^2$ and $R^3$, and $R^{15}$ and $R^{16}$, taken together, stand for a straight, branched or cyclic $C_2$-$C_{20}$ alkylene or fluoroalkylene group; R is fluorine or hydrogen, or may bond with $R^5$ to form a ring of 3 to 10 carbon atoms in total with the carbon atom to which they are attached; $R^5$ is a straight, branched or cyclic $C_1$-$C_6$ alkylene group in which at least one hydrogen atom may be substituted by a fluorine atom; $R^6$ is a straight or branched $C_1$-$C_{10}$ alkyl group in which at least one hydrogen atom is substituted by a fluorine atom, $R^5$ and $R^6$ may bond together to form a ring with the carbon atoms to which they are attached, and in this case, $R^5$ and $R^6$, taken together, stand for a trivalent organic group of 2 to 12 carbon atoms in total in which at least one hydrogen atom is substituted by a fluorine atom; $R^8$ is a single bond or a $C_1$-$C_4$ alkylene group; $R^{10}$ and $R^{11}$ are each independently hydrogen, fluorine, methyl or trifluoromethyl; $R^{12}$ and $R^{13}$ are each independently a single bond, —O— or —$CR^{18}R^{19}$—; $R^9$, $R^{18}$, and $R^{19}$ are hydrogen, fluorine, methyl or trifluoromethyl; $R^{17}$ is a straight or branched $C_1$-$C_4$ alkylene group or may bond with $R^{15}$ or $R^{16}$ to form a $C_3$-$C_{10}$ aliphatic ring with the carbon atom to which they are attached; $X^1$, $X^2$ and $X^3$ are each independently —C(=O)—O—, —O—, or —C(=O)—$R^{20}$—C(=O)—O— wherein $R^{20}$ is a straight, branched or cyclic $C_1$-$C_{10}$ alkylene group; the subscripts are numbers in the range: $0 \leq (a-1) < 1$, $0 \leq (a-2) < 1$, $0 \leq (a-3) < 1$, $0 < (a-1)+(a-2)+(a-3) < 1$, $0 < b < 1$, and $0 < (a-1)+(a-2)+(a-3)+b \leq 1$.

The resist composition forms a resist film which has good barrier property against water so that leaching of the resist film with water is controlled during the immersion lithography. Then a change of pattern profile due to leach-out is minimized. Thus the invention eliminates a need for a protective coating which is otherwise used in the immersion lithography for preventing leaching, and reduces the cost required for formation of a protective coating. Additionally, the resist film has so high a receding contact angle with water that few droplets are left on the resist film after the scanning step of the immersion lithography. This minimizes defective pattern formation caused by droplets remaining on the film surface. Therefore, the resist composition of the invention has process adaptability, and can form a microscopic pattern with few defects at a high precision by the immersion lithography while reducing the cost.

In a preferred embodiment, the resist composition is a chemically amplified resist composition which may be either positive or negative. Preferably the chemically amplified positive resist composition may comprise a base resin comprising at least recurring units having acid labile groups and recurring units having hydroxy groups and/or adhesive groups of lactone ring.

Where the base resin includes recurring units having hydroxy groups and/or adhesive groups of lactone ring, the chemically amplified positive resist composition ensures tight adhesion to a substrate. Where the base resin includes recurring units having acid labile groups, the acid labile groups are deprotected with the acid generated by the acid generator during exposure so that the exposed area of resist is converted to be soluble in a developer, ensuring that a pattern is formed at a very high precision.

Also preferably the resist composition further comprises at least one member selected from among an organic solvent, a basic compound, a dissolution regulator, and a surfactant.

The inclusion of an organic solvent can facilitate to coat the resist composition to substrates or the like. The inclusion of a basic compound can hold down the diffusion rate of acid within the resist film, leading to a further improved resolution. The inclusion of a dissolution regulator can increase the difference in dissolution rate between exposed and unexposed areas, leading to a further improved resolution. The addition of a surfactant can further facilitate or control the coating operation of the resist composition.

In another aspect, the invention provides a pattern forming process comprising the steps of applying the aforementioned resist composition onto a substrate to form a coating, heat treating the coating and exposing it to high-energy radiation, and developing the exposed coating with a developer. The step of heat treatment may be included after the exposing step and before the developing step. The process may further include subsequent steps such as etching, resist removal and cleaning.

Preferably the high-energy radiation has a wavelength of 180 to 250 nm. The exposure using high-energy radiation with a wavelength of 180 to 250 nm enables to form a finer pattern.

In preferred embodiments, the exposing step is by immersion lithography involving exposing the coating to high-energy radiation through a liquid. The immersion lithography may involve using high-energy radiation having a wavelength of 180 to 250 nm, introducing a liquid between the resist-coated substrate and a projection lens, and exposing the substrate to the high-energy radiation through the liquid. By the immersion lithography, the resolution is improved and a finer pattern is formed. The liquid is typically water. The high-energy radiation may be an electron beam.

An embodiment of exposure using electron beam is a pattern forming process comprising the steps of applying the aforementioned resist composition onto a mask blank substrate to form a coating, heat treating the coating and exposing it to high-energy radiation, and developing the coating with a developer.

BENEFITS OF THE INVENTION

The resist film formed from the inventive resist composition has good barrier property against water so that leaching of the resist film with water is controlled. Then a change of pattern profile due to leach-out is minimized. Thus the invention eliminates a need for a protective coating which is otherwise used in the immersion lithography for preventing leaching, and reduces the cost required for formation of a protective coating.

The resist film formed from the inventive resist composition has the advantage that if the surface of the resist film is covered with a film which is stable to acids and amines and alkali soluble, for suppressing evaporation of acids and amines during dry lithography, then the difference in profile and size between bright and dark patterns (dark-bright difference) is reduced in the dry lithography as in the case of immersion lithography. In addition, the stability of size during exposure in vacuum, typically during electron beam exposure is improved.

Additionally, the resist film has so high a receding contact angle with water that few droplets are left on the resist film after the scanning step of the immersion lithography. This minimizes defective pattern formation caused by droplets remaining on the film surface. Therefore, the resist composition of the invention can form a microscopic pattern with minimal defects at a high precision by the immersion lithography while reducing the cost.

DESCRIPTION OF THE PREFERRED EMBODIMENTS

The terms "a" and "an" herein do not denote a limitation of quantity, but rather denote the presence of at least one of the referenced item.

As used herein, the notation ($C_n$-$C_m$) means a group containing from n to m carbon atoms per group.

With respect to the immersion lithography, it would be desirable to have a resist composition having both barrier property and a high receding contact angle. In connection with the immersion lithography wherein water is in direct contact with the resist film in the absence of a protective coating, the inventors have found that when a specific polymeric additive is incorporated in a resist film, the additive is effective (i) for preventing the resulting resist film from being leached with water and (ii) for increasing the receding contact angle of the resist film with water. Elaborating the composition and compounding of a polymeric additive, the inventors have completed the invention.

Polymer

The first embodiment of the invention is a resist composition comprising a polymer comprising recurring units having the general formula (I).

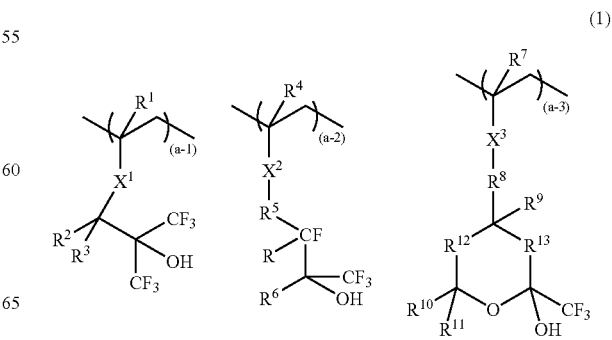

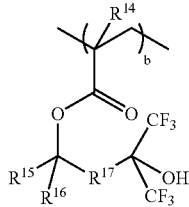

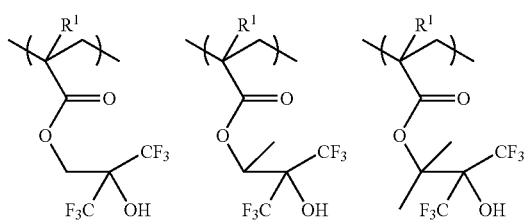
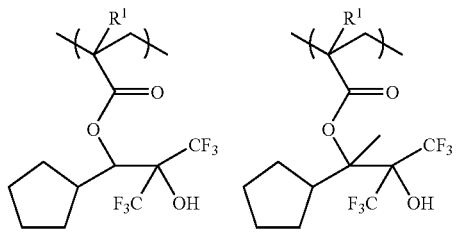
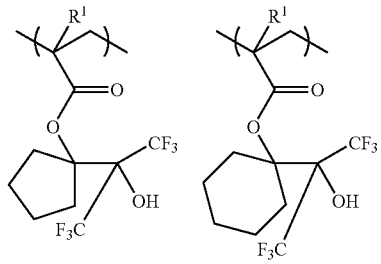
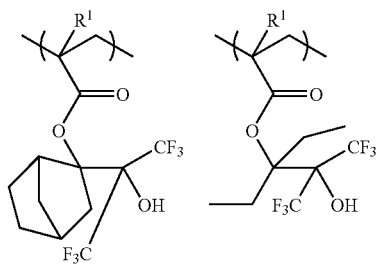
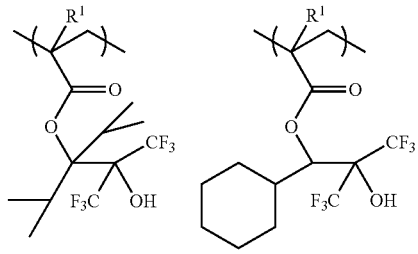
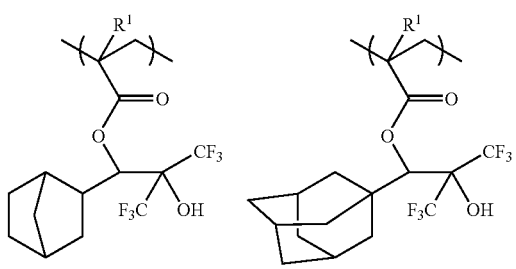

Herein $R^1$, $R^4$, $R^7$, and $R^{14}$ are each independently hydrogen or methyl, $R^2$, $R^3$, $R^{15}$, and $R^{16}$ are each independently hydrogen or a straight, branched or cyclic $C_1$-$C_{20}$ alkyl or fluoroalkyl group, or $R^2$ and $R^3$, and $R^{15}$ and $R^{16}$ may bond together to form a ring with the carbon atom to which they are attached, and in this case, $R^2$ and $R^3$, and $R^{15}$ and $R^{16}$, taken together, stand for a straight, branched or cyclic $C_2$-$C_{20}$ alkylene or fluoroalkylene group, R is fluorine or hydrogen, or may bond with $R^5$ to form a ring of 3 to 10 carbon atoms in total with the carbon atom to which they are attached.

$R^5$ is a straight, branched or cyclic $C_1$-$C_6$ alkylene group in which at least one hydrogen atom may be substituted by a fluorine atom, $R^6$ is a straight or branched $C_1$-$C_{10}$ alkyl group in which at least one hydrogen atom is substituted by a fluorine atom, $R^5$ and $R^6$ may bond together to form a ring with the carbon atoms to which they are attached, and in this case, $R^5$ and $R^6$, taken together, stand for a trivalent organic group, specifically hydrocarbon group of 2 to 12 carbon atoms in total in which at least one hydrogen atom is substituted by a fluorine atom.

$R^8$ is a single bond or a $C_1$-$C_4$ alkylene group, $R^{10}$ and $R^{11}$ are each independently hydrogen, fluorine, methyl or trifluoromethyl, $R^{12}$ and $R^{13}$ are each independently a single bond, —O— or —$CR^{18}R^{19}$—, $R^9$, $R^{18}$, and $R^{19}$ are hydrogen, fluorine, methyl or trifluoromethyl.

$R^{17}$ is a straight or branched $C_1$-$C_4$ alkylene group or may bond with $R^{15}$ or $R^{16}$ to form a $C_3$-$C_{10}$ aliphatic ring with the carbon atom to which they are attached.

$X^1$, $X^2$ and $X^3$ are each independently —C(=O)—O—, —O—, or —C(=O)—$R^{20}$—C(=O)—O— wherein $R^{20}$ is a straight, branched or cyclic $C_1$-$C_{10}$ alkylene group.

The subscripts are numbers in the range: $0 \leq (a\text{-}1) < 1$, $0 \leq (a\text{-}2) < 1$, $0 \leq (a\text{-}3) < 1$, $0 < (a\text{-}1)+(a\text{-}2)+(a\text{-}3) < 1$, $0 < b < 1$, and $0 < (a\text{-}1)+(a\text{-}2)+(a\text{-}3)+b \leq 1$.

The resist film formed from the resist composition having added thereto the polymer comprising recurring units of formula (I) has good barrier property against water so that leaching of the resist film with water during immersion lithography is controlled. Then a change of pattern profile due to leach-out is minimized. This eliminates a need for a protective coating which is otherwise used in the immersion lithography for preventing leaching, and reduces the cost required for formation of a protective coating.

Additionally, the resist film has so high a receding contact angle with water during scanning exposure that few droplets are left on the resist film after the scanning step of the immersion lithography. This minimizes defective pattern formation caused by droplets remaining on the film surface. Therefore, the resist composition of the invention can form a microscopic pattern with minimal defects at a high precision by the immersion lithography while reducing the cost.

Examples of recurring units (a-1) in formula (I) are given below, but not limited thereto.

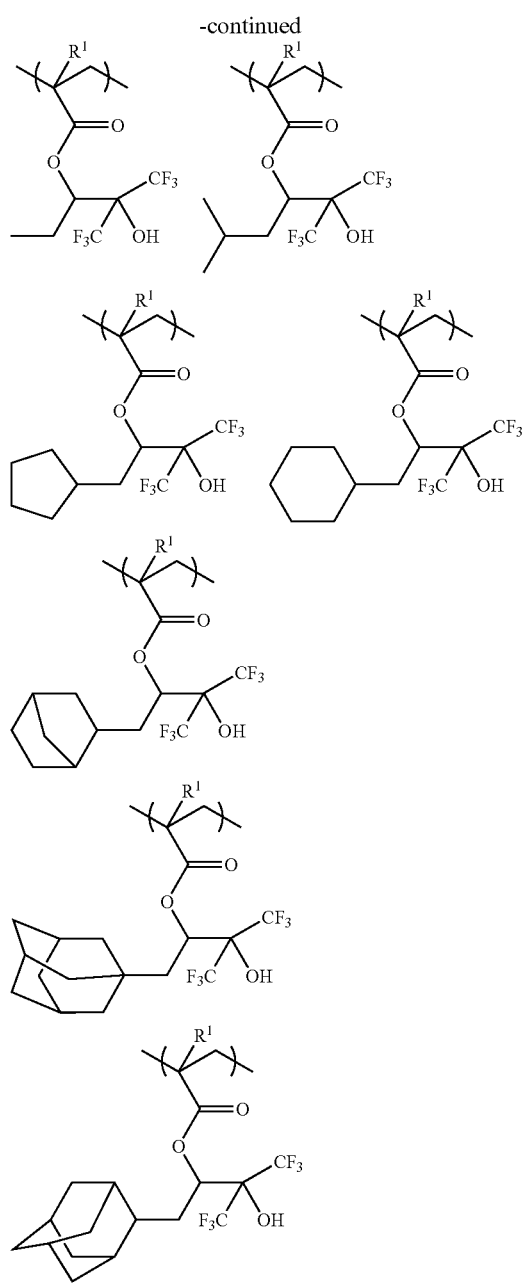
Herein R¹ is as defined above.
Examples of recurring units (a-2) in formula (I) are given below, but not limited thereto.
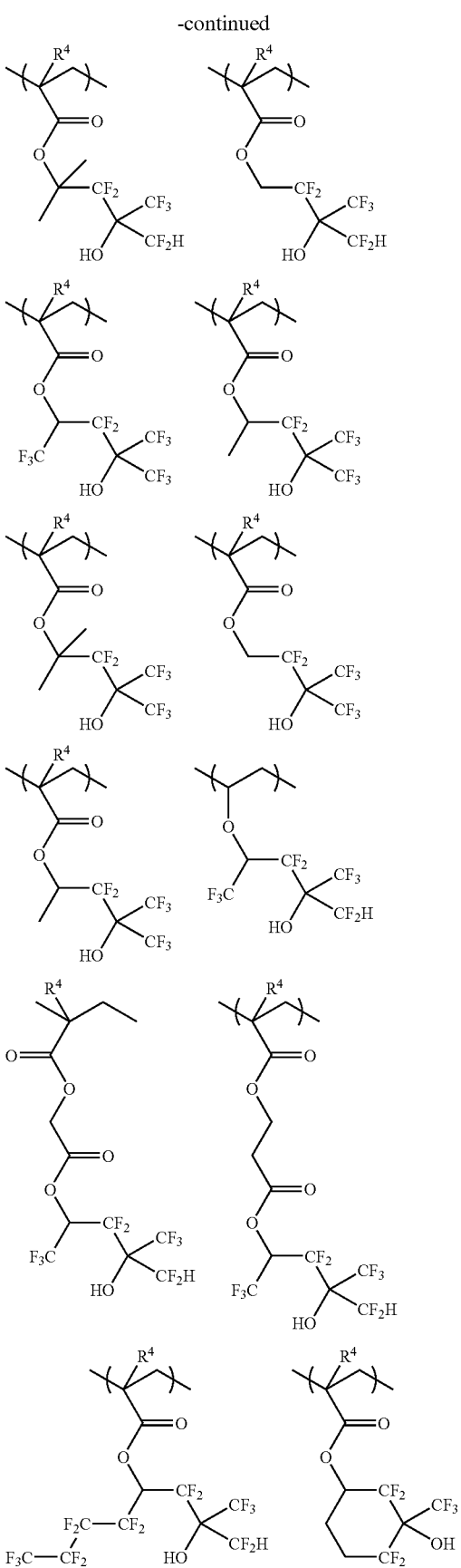

-continued
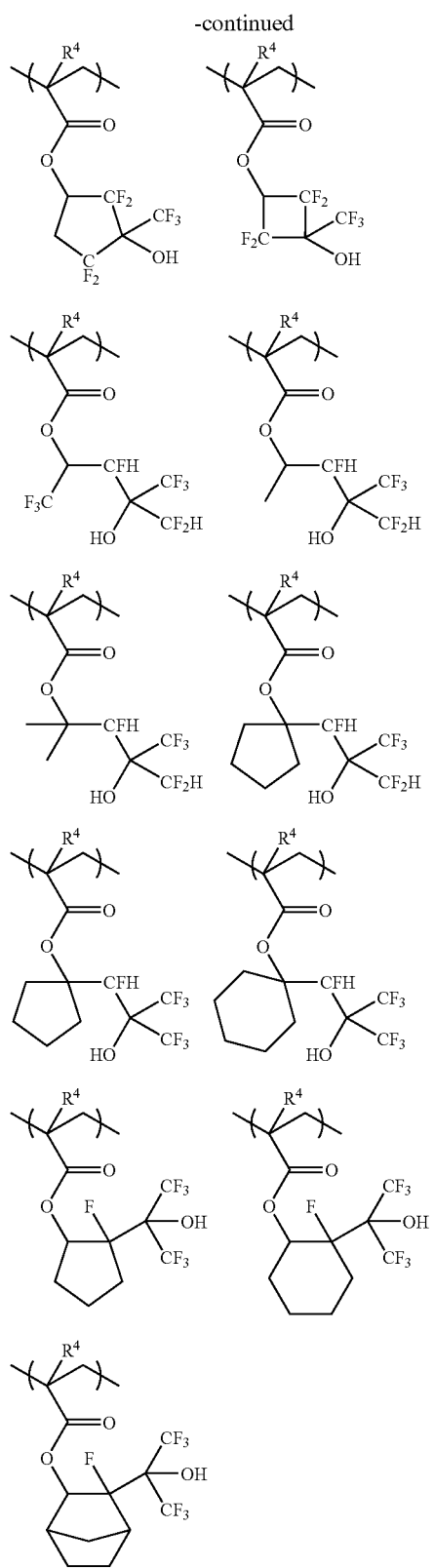
Herein R⁴ is as defined above.
Examples of recurring units (a-3) in formula (I) are given below, but not limited thereto.
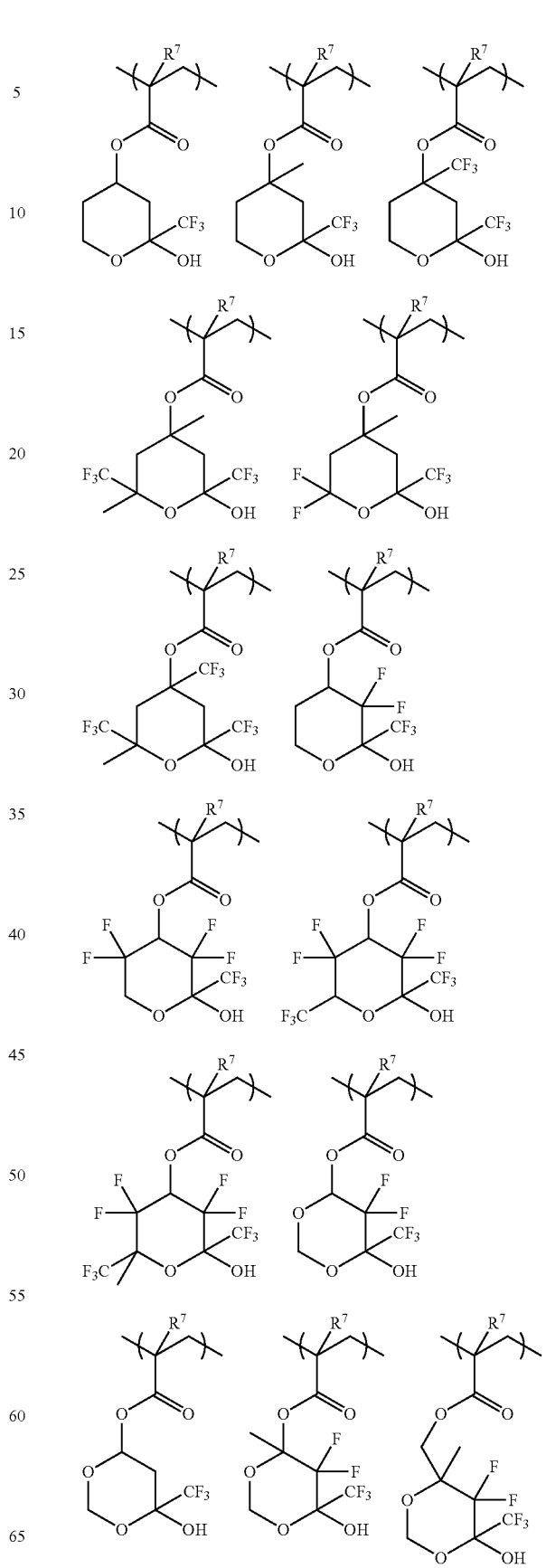

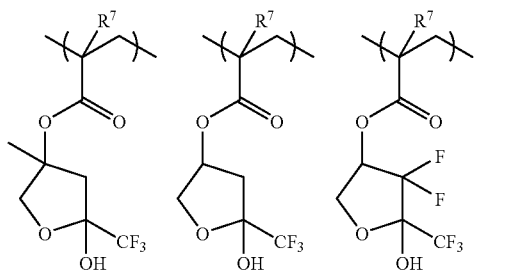
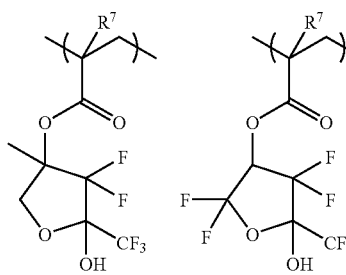
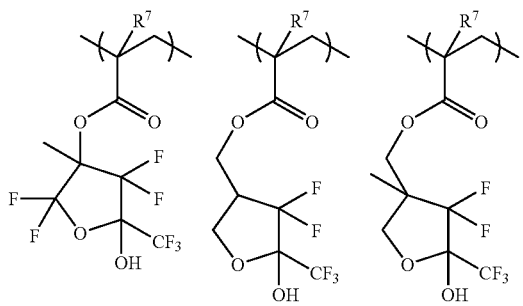
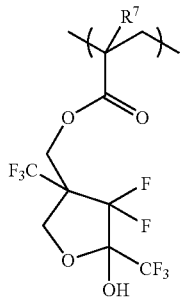
Herein R⁷ is as defined above.
Examples of recurring units (b) in formula (I) are given below, but not limited thereto.
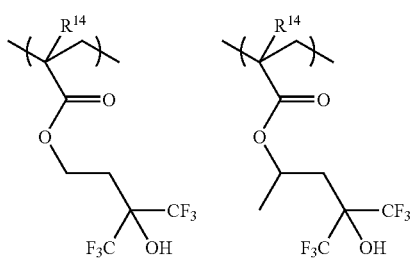
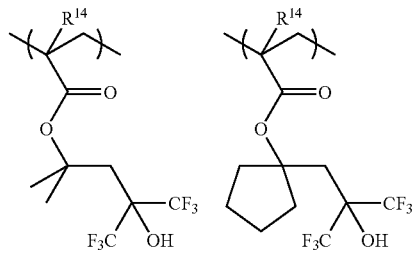
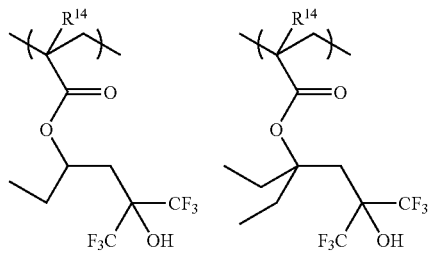
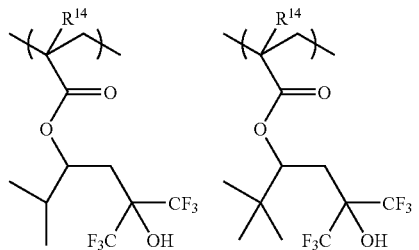
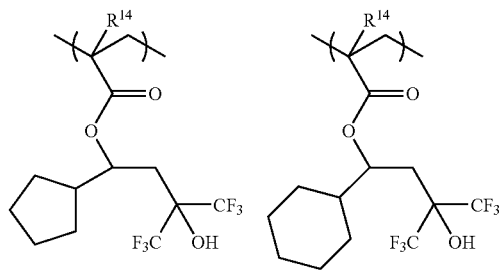
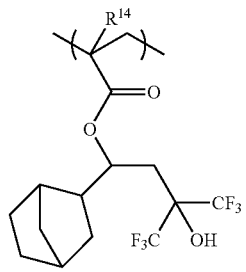
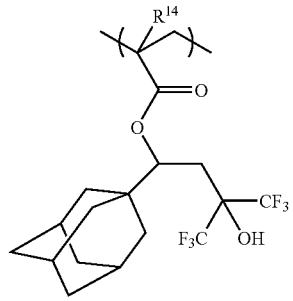

-continued

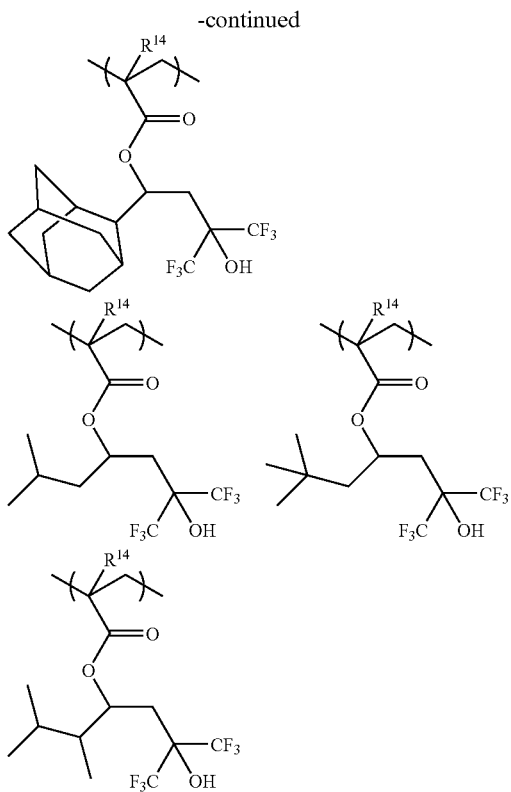

Herein $R^{14}$ is as defined above.

Desirably the polymer comprising recurring units of formula (1) has a weight average molecular weight (Mw) of about 1,000 to about 100,000, and especially about 3,000 to about 30,000, as determined by gel permeation chromatography (GPC) using polystyrene standards. The Mw of the polymer is not limited thereto. A polymer with Mw of at least 1,000 exerts sufficient barrier property against water during immersion lithography and is effective for preventing the resist film from being leached with water. A polymer with Mw of up to 100,000 has a sufficiently high rate of dissolution in an alkaline developer, minimizing the risk that when a resist film having the polymer incorporated therein is patterned, resin residues are left attached to the substrate.

When used in the resist composition, the polymers comprising recurring units of formula (I) may be compounded alone or as a mixture of two or more polymers in any desired proportion.

The subscripts (a-1), (a-2), (a-3), and (b) representative of copolymerization ratios (on a molar basis) of the corresponding units are in the range:

$0 \leq$(a-1)$<1$, $0 \leq$(a-2)$<1$, $0 \leq$(a-3)$<1$, $0<$(a-1)+(a-2)+(a-3)$<1$, $0<b<1$, and $0<$(a-1)+(a-2)+(a-3)+b$\leq 1$, preferably $0 \leq$(a-1)$\leq 0.95$, $0 \leq$(a-2)$\leq 0.95$, $0 \leq$(a-3)$\leq 0.95$, $0.1 \leq$(a-1)+(a-2)+(a-3)$\leq 0.95$, $0.05 \leq b \leq 0.95$, and $0.1 \leq$(a-1)+(a-2)+(a-3)+b$\leq 1$, and more preferably $0 \leq$(a-1)$\leq 0.9$, $0 \leq$(a-2)$\leq 0.9$, $0 \leq$(a-3)$\leq 0.9$, $0.1 \leq$(a-1)+(a-2)+(a-3)$\leq 0.9$, $0.1 \leq b \leq 0.9$, and $0.2 \leq$(a-1)+(a-2)+(a-3)+b$\leq 1$.

It is noted that the meaning of (a-1)+(a-2)+(a-3)+b=1 is that in a polymer comprising recurring units (a-1), (a-2), (a-3), and (b), the sum of recurring units (a-1), (a-2), (a-3) and (b) is 100 mol % based on the total amount of entire recurring units. The meaning of (a-1)+(a-2)+(a-3)+b<1 is that the sum of recurring units (a-1), (a-2), (a-3), and (b) is less than 100 mol % based on the total amount of entire recurring units, indicating the inclusion of other recurring units. Examples of the other recurring units include those derived from vinyl ethers, norbornadienes, maleimides, and vinylsulfones.

In the resist composition of the invention, the polymer(s) may be compounded in a total amount of 0.1 to 50 parts by weight, and preferably 0.5 to 10 parts by weight per 100 parts by weight of the base resin. At least 0.1 phr of the polymer is effective in improving the receding contact angle with water of the photoresist film at its surface. Up to 50 phr of the polymer is effective in forming a photoresist film having a low rate of dissolution in an alkaline developer and capable of maintaining the height of a fine pattern formed therein.

The resist composition of the invention is advantageously used as a chemically amplified positive resist composition. In addition to the additive polymer described above, the chemically amplified positive resist composition generally comprises a base resin comprising at least recurring units having acid labile groups and recurring units having hydroxy groups and/or adhesive groups of lactone ring.

Since the base resin includes recurring units having hydroxy groups and/or adhesive groups of lactone ring, the chemically amplified positive resist composition ensures tight adhesion to a substrate. Since the base resin includes recurring units having acid labile groups, the acid labile groups are deprotected with the acid generated by the acid generator during exposure so that the exposed area of resist is converted to be soluble in a developer, ensuring that a pattern is formed at a very high precision.

Base Resin

Suitable base resins include, but are not limited to, those polymers comprising units of the following formula (R1) and/or (R2) and having a weight average molecular weight (Mw) of about 1,000 to about 100,000, especially about 3,000 to about 30,000, as measured by GPC versus polystyrene standards.

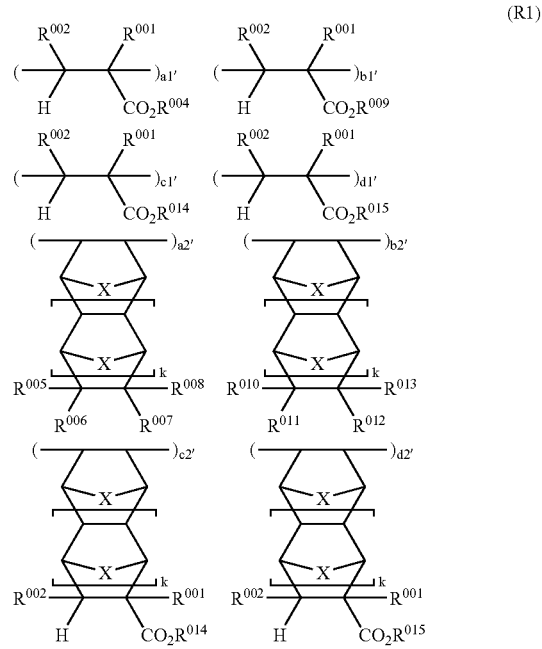

(R1)

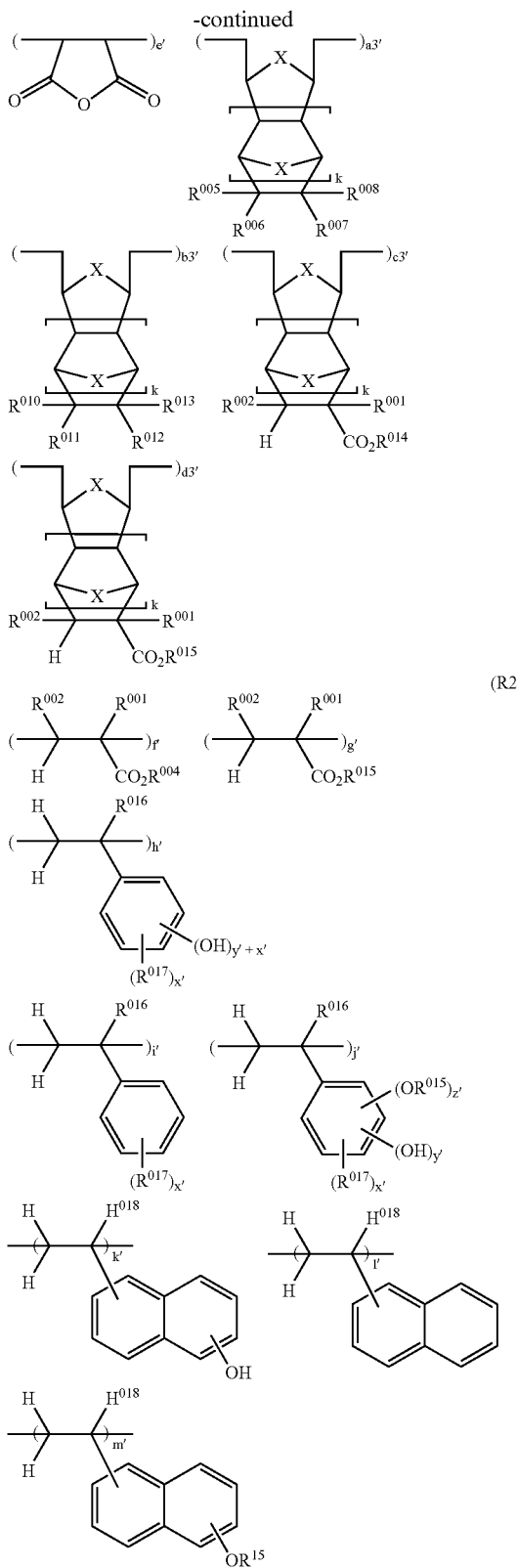

butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, and butyladamantyl.

$R^{004}$ is hydrogen or a monovalent $C_1$-$C_{15}$ hydrocarbon group having at least one of fluorinated substituent groups, carboxyl groups and hydroxyl groups, for example, hydrogen, carboxyethyl, carboxybutyl, carboxycyclopentyl, carboxycyclohexyl, carboxynorbornyl, carboxyadamantyl, hydroxyethyl, hydroxybutyl, hydroxycyclopentyl, hydroxycyclohexyl, hydroxynorbornyl, hydroxyadamantyl, hydroxyhexafluoroisopropylcyclohexyl, and di(hydroxyhexafluoroisopropyl)cyclohexyl.

At least one of $R^{005}$ to $R^{008}$ represents a monovalent $C_1$-$C_{15}$ hydrocarbon group having at least one of fluorinated substituent groups, carboxyl groups and hydroxyl groups while the remaining R's independently represent hydrogen or straight, branched or cyclic $C_1$-$C_{15}$ alkyl groups. Examples of the monovalent $C_1$-$C_{15}$ hydrocarbon group having at least one of fluorinated substituent groups, carboxyl groups and hydroxyl groups include carboxy, carboxymethyl, carboxyethyl, carboxybutyl, hydroxymethyl, hydroxyethyl, hydroxybutyl, 2-carboxyethoxycarbonyl, 4-carboxybutoxycarbonyl, 2-hydroxyethoxycarbonyl, 4-hydroxybutoxycarbonyl, carboxycyclopentyloxycarbonyl, carboxycyclohexyloxycarbonyl, carboxynorbornyloxycarbonyl, carboxyadamantyloxycarbonyl, hydroxycyclopentyloxycarbonyl, hydroxycyclohexyloxycarbonyl, hydroxynorbornyloxycarbonyl, hydroxyadamantyloxycarbonyl, hydroxyhexafluoroisopropylcyclohexyloxycarbonyl, and di(hydroxyhexafluoroisopropyl)cyclohexyloxycarbonyl.

Examples of the straight, branched or cyclic $C_1$-$C_{15}$ alkyl group are the same as exemplified for $R^{003}$.

Alternatively, two of $R^{005}$ to $R^{008}$ (e.g., a pair of $R^{005}$ and $R^{006}$, $R^{006}$ and $R^{007}$) may bond together to form a ring with the carbon atom(s) to which they are attached. In that event, at least one of $R^{005}$ to $R^{008}$ is a divalent $C_1$-$C_{15}$ hydrocarbon group having at least one of fluorinated substituent groups, carboxyl groups and hydroxyl groups, while the remaining are independently a single bond or a straight, branched or cyclic $C_1$-$C_{15}$ alkylene group. Examples of the divalent $C_1$-$C_{15}$ hydrocarbon group having at least one of fluorinated substituent groups, carboxyl groups and hydroxyl groups include the groups exemplified as the monovalent hydrocarbon group having at least one of fluorinated substituent groups, carboxyl groups and hydroxyl groups, with one hydrogen atom eliminated therefrom. Examples of the straight, branched or cyclic $C_1$-$C_{15}$ alkyl groups include the groups exemplified for $R^{003}$, with one hydrogen atom eliminated therefrom.

$R^{009}$ is a monovalent $C_3$-$C_{15}$ hydrocarbon group containing a —$CO_2$— partial structure, for example, 2-oxooxolan-3-yl, 4,4-dimethyl-2-oxooxolan-3-yl, 4-methyl-2-oxooxan-4-yl, 2-oxo-1,3-dioxolan-4-ylmethyl, and 5-methyl-2-oxooxolan-5-yl.

At least one of $R^{010}$ to $R^{013}$ is a monovalent $C_2$-$C_{15}$ hydrocarbon group containing a —$CO_2$— partial structure, while the remaining R's are independently hydrogen or straight, branched or cyclic $C_1$-$C_{15}$ alkyl groups. Examples of the monovalent $C_2$-$C_{15}$ hydrocarbon group containing a —$CO_2$— partial structure include 2-oxooxolan-3-yloxycarbonyl, 4,4-dimethyl-2-oxooxolan-3-yloxycarbonyl, 4-methyl-2-oxooxan-4-yloxycarbonyl, 2-oxo-1,3-dioxolan-4-ylmethyloxycarbonyl, and 5-methyl-2-oxooxolan-5-yloxycarbonyl. Examples of the straight, branched or cyclic $C_1$-$C_{15}$ alkyl groups are the same as exemplified for $R^{003}$.

Herein, $R^{001}$ is hydrogen, methyl or —$CH_2CO_2R^{003}$.

$R^{002}$ is hydrogen, methyl or —$CO_2R^{003}$.

$R^{003}$ is a straight, branched or cyclic $C_1$-$C_{15}$ alkyl group, for example, methyl, ethyl, propyl, isopropyl, n-butyl, sec- Alternatively, two of $R^{O10}$ to $R^{O13}$ (e.g., a pair of $R^{O10}$ and $R^{O10}$, $R^{O11}$ and $R^{O12}$) may bond together to form a ring with the carbon atom(s) to which they are attached. In that event, at least one of $R^{O10}$ to $R^{O13}$ is a divalent $C_2$-$C_{15}$ hydrocarbon group containing a —$CO_2$— partial structure, while the remaining are independently a single bond or a straight, branched or cyclic $C_1$-$C_{15}$ alkylene group. Examples of the divalent $C_2$-$C_{15}$ hydrocarbon group containing a —$CO_2$— partial structure include 1-oxo-2-oxapropane-1,3-diyl, 1,3-dioxo-2-oxapropane-1,3-diyl, 1-oxo-2-oxabutane-1,4-diyl, and 1,3-dioxo-2-oxabutane-1,4-diyl, as well as the groups exemplified as the monovalent hydrocarbon group containing a —$CO_2$— partial structure, with one hydrogen atom eliminated therefrom. Examples of the straight, branched or cyclic $C_1$-$C_{15}$ alkylene groups include the groups exemplified for $R^{O03}$, with one hydrogen atom eliminated therefrom.

$R^{O14}$ is a polycyclic $C_7$-$C_{15}$ hydrocarbon group or an alkyl group containing a polycyclic hydrocarbon group, for example, norbornyl, bicyclo[3.3.1]nonyl, tricyclo[5.2.1.0$^{2,6}$]decyl, adamantyl, ethyladamantyl, butyladamantyl, norbornylmethyl, and adamantylmethyl.

$R^{O15}$ is an acid labile group, which will be described later.

X is —$CH_2$ or an oxygen atom.

The subscript k is 0 or 1.

The acid labile groups represented by $R^{O15}$ may be selected from a variety of such groups. Examples of the acid labile group are groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

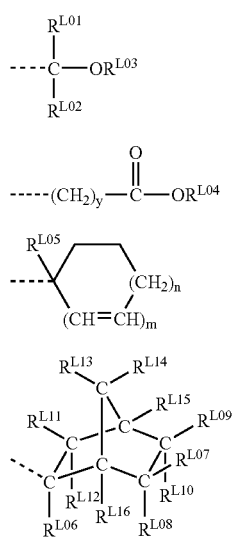

The broken line indicates a valence bond.

In formula (L1), $R^{L01}$ and $R^{L02}$ are hydrogen or straight, branched or cyclic alkyl groups of 1 to 18 carbon atoms, preferably 1 to 10 carbon atoms. Examples include hydrogen, methyl, ethyl, propyl, isopropyl, n-butyl, sec-butyl, tert-butyl, cyclopentyl, cyclohexyl, 2-ethylhexyl, n-octyl, and adamantyl. $R^{L03}$ is a monovalent hydrocarbon group of 1 to 18 carbon atoms, preferably 1 to 10 carbon atoms, which may contain a hetero atom such as oxygen, examples of which include unsubstituted straight, branched or cyclic alkyl groups and straight, branched or cyclic alkyl groups in which some hydrogen atoms are replaced by hydroxyl, alkoxy, oxo, amino, alkylamino or the like. Examples of the straight, branched or cyclic alkyl groups are as exemplified above for $R^{L01}$ and $R^{L02}$, and examples of the substituted alkyl groups are shown below.

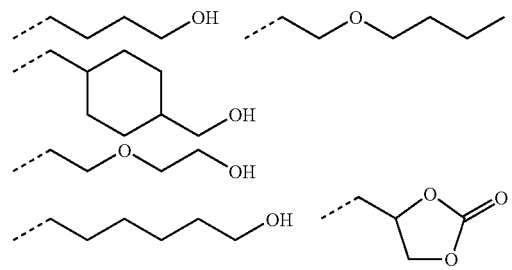

A pair of $R^{L01}$ and $R^{L02}$, $R^{L01}$ and $R^{L03}$, or $R^{L02}$ and $R^{L03}$ may bond together to form a ring with the carbon and oxygen atoms to which they are attached. Each of $R^{L01}$, $R^{L02}$ and $R^{L03}$ is a straight or branched alkylene group of 1 to 18 carbon atoms, preferably 1 to 10 carbon atoms when they form a ring.

In formula (L2), $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). Exemplary tertiary alkyl groups are tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, and 2-ethyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. In formula (L2), y is an integer of 0 to 6.

In formula (L3), $R^{L05}$ is a substituted or unsubstituted, $C_1$-$C_{10}$ straight, branched or cyclic alkyl group or a substituted or unsubstituted $C_6$-$C_{20}$ aryl group. Examples of the substituted or unsubstituted alkyl groups include straight, branched or cyclic ones such as methyl, ethyl, propyl, isopropyl, n-butyl, sec-butyl, tert-butyl, tert-amyl, n-pentyl, n-hexyl, cyclopentyl, cyclohexyl and bicyclo[2.2.1]heptyl; substituted forms of the foregoing in which some hydrogen atoms are replaced by hydroxyl, alkoxy, carboxy, alkoxycarbonyl, oxo, amino, alkylamino, cyano, mercapto, alkylthio, sulfo or other groups; and substituted forms of the foregoing in which some of the methylene groups are replaced by oxygen or sulfur atoms. Exemplary substituted or unsubstituted aryl groups are phenyl, methylphenyl, naphthyl, anthryl, phenanthryl, and pyrenyl. In formula (L3), m is 0 or 1, n is 0, 1, 2 or 3, and 2m+n is equal to 2 or 3.

In formula (L4), $R^{L06}$ is a substituted or unsubstituted, $C_1$-$C_{10}$ straight, branched or cyclic alkyl group or a substituted or unsubstituted $C_6$-$C_{20}$ aryl group. Examples of these groups are the same as exemplified for $R^{L05}$. $R^{L07}$ to $R^{L16}$ independently represent hydrogen or monovalent $C_1$-$C_{15}$ hydrocarbon groups. Exemplary hydrocarbon groups are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of the foregoing in which some hydrogen atoms are replaced by hydroxyl, alkoxy, carboxy, alkoxycarbonyl, oxo, amino, alkylamino, cyano, mercapto, alkylthio, sulfo or other groups. Alternatively, two of $R^{L07}$ to $R^{L16}$ may bond together to form a ring with the carbon atom to which they are attached (for example, a pair of $R^{L07}$ and $R^{L08}$, $R^{L07}$ and $R^{L09}$, $R^{L08}$ and $R^{L10}$, $R^{L09}$ and $R^{L10}$, $R^{L11}$ and $R^{L12}$, $R^{L13}$ and $R^{L14}$, or a similar pair form a ring). Each of $R^{L07}$ to $R^{L16}$ represents a divalent $C_1$-$C_{15}$ hydrocarbon group when they form a ring, examples of which are the ones exemplified above for the monovalent hydrocarbon groups, with one hydrogen atom being eliminated. Two of $R^{L07}$ to $R^{L16}$ which are attached to vicinal carbon atoms (for example, a pair of $R^{L07}$ and $R^{L09}$, $R^{L09}$ and $R^{L15}$, $R^{L13}$ and $R^{L15}$, or a similar pair) may bond together directly to form a double bond.

Of the acid labile groups of formula (L1), the straight and branched ones are exemplified by the following groups.

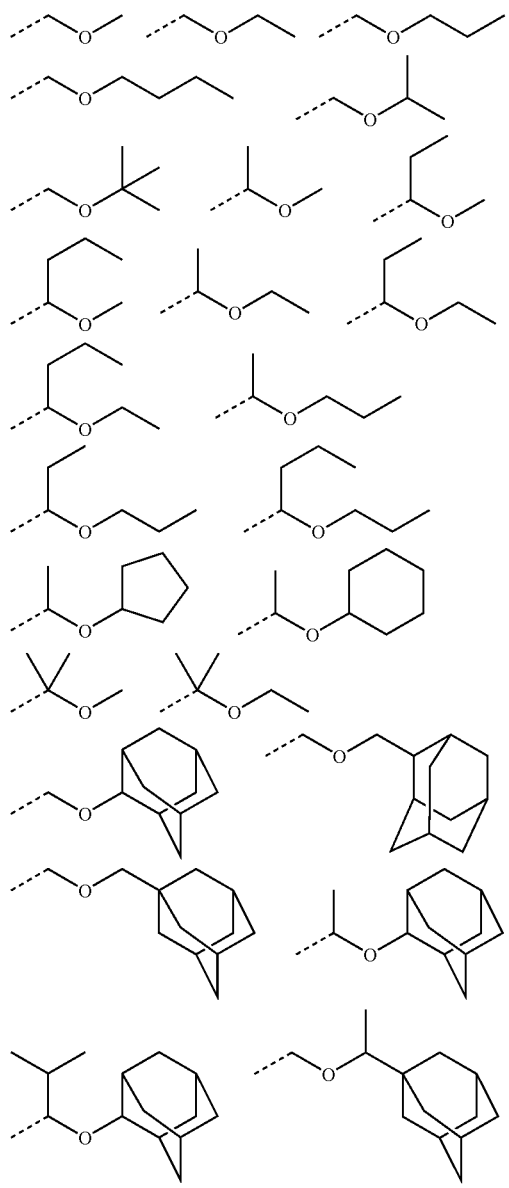

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Examples of the acid labile groups of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-cyclohexylcyclopentyl, 1-(4-methoxy-n-butyl)cyclopentyl, 1-(bicyclo[2.2.1]heptan-2-yl)cyclopentyl, 1-(7-oxabicyclo[2.2.1]heptan-2-yl)cyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl groups.

The acid labile groups of formula (L4) are preferably groups of the following formulae (L4-1) to (L4-4).

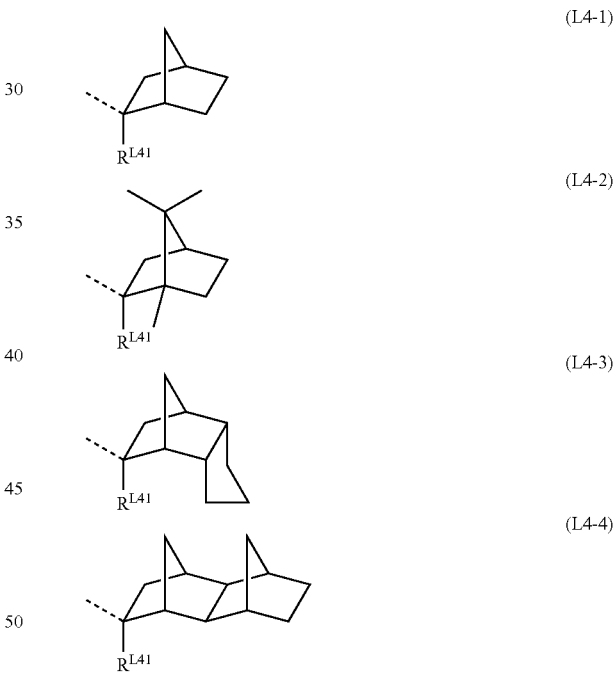

In formulae (L4-1) to (L4-4), the broken line indicates a bonding site and direction. $R^{L41}$ is each independently selected from monovalent hydrocarbon groups, typically straight, branched or cyclic $C_1$-$C_{10}$ alkyl groups, for example, methyl, ethyl, propyl, isopropyl, n-butyl, sec-butyl, tert-butyl, tert-amyl, n-pentyl, n-hexyl, cyclopentyl, and cyclohexyl.

For formulas (L4-1) to (L4-4), there can exist enantiomers and diastereomers. Each of formulae (L4-1) to (L4-4) collectively represents all such stereoisomers. Such stereoisomers may be used alone or in admixture.

For example, the general formula (L4-3) represents one or a mixture of two selected from groups having the following general formulas (L4-3-1) and (L4-3-2).

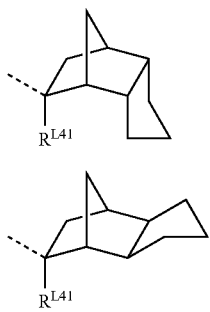
(L4-3-1)

(L4-3-2)

Herein $R^{L41}$ is as defined above.

Similarly, the general formula (L4-4) represents one or a mixture of two or more selected from groups having the following general formulas (L4-4-1) to (L4-4-4).

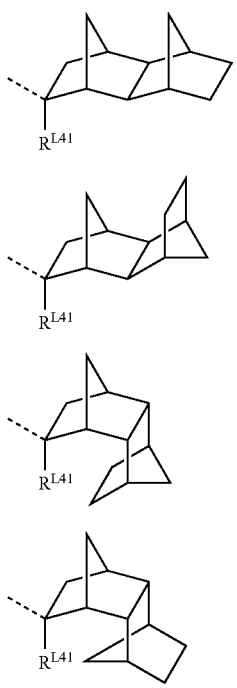
(L4-4-1)

(L4-4-2)

(L4-4-3)

(L4-4-4)

Herein $R^{L41}$ is as defined above.

Each of formulas (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1]heptane ring, which ensures high reactivity for acid catalyzed elimination reaction (see JP-A 2000-336121). In preparing these monomers having a tertiary exo-alkyl group of bicyclo[2.2.1]heptane skeleton as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

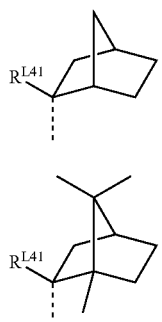
(L4-1-endo)

(L4-2-endo)

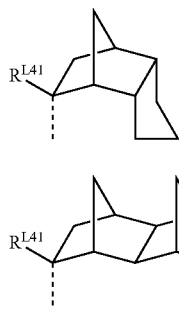
(L4-3-endo)

(L4-4-endo)

Herein $R^{L41}$ is as defined above.

Illustrative examples of the acid labile group of formula (L4) are given below.

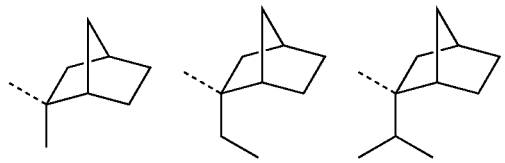

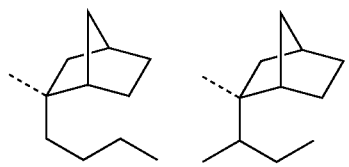

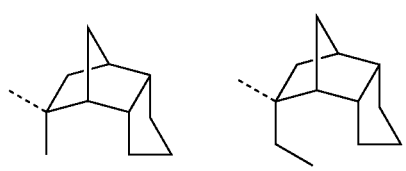

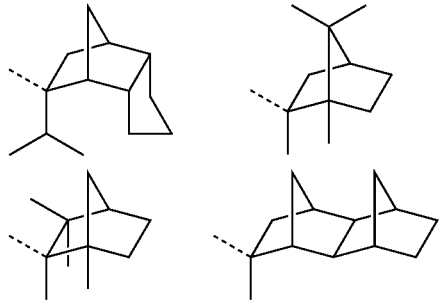

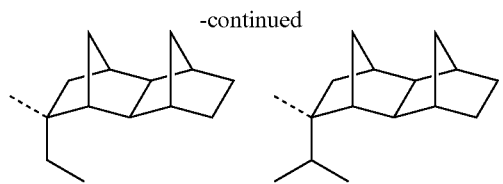

Examples of the tertiary $C_4$-$C_{20}$ alkyl, tri($C_1$-$C_6$-alkyl)silyl and $C_4$-$C_{20}$ oxoalkyl groups included in the acid labile groups represented by $R^{015}$ are as exemplified above for $R^{L04}$.

In formula (R2), $R^{016}$ is hydrogen or methyl. $R^{017}$ is a straight, branched or cyclic $C_1$-$C_8$ alkyl group.

In formula (R1), the subscripts a1', a2', a3', b1', b2', b3', c1, c2', c3', d1', d2', d3', and e' are numbers from 0 to less than 1, satisfying a1'+a2'+a3'+b1'+b2'+b3'+c1'+c2'+c3'+d1'+d2'+d3'+e'=1. In formula (R2), f', g', h', i', j', k', l', and m' are numbers from 0 to less than 1, satisfying f'+g'+h'+i'+j'+k'+l'+m'=1; x', y' and z' are each an integer of 0 to 3, satisfying $1 \leq x'+y'+z' \leq 5$ and $1 \leq y'+z' \leq 3$. In addition, one or more monomers selected from indenes, norbornadienes, acenaphthylenes and vinyl ethers may be copolymerized.

When the resist composition of the invention is a negative one, the base resin is selected from polymers of formulae (R1) and (R2) wherein d1', d2', d3', g', and m' are zero.

Examples of the recurring units incorporated at compositional ratio a1' in formula (R1) are shown below, though not limited thereto.

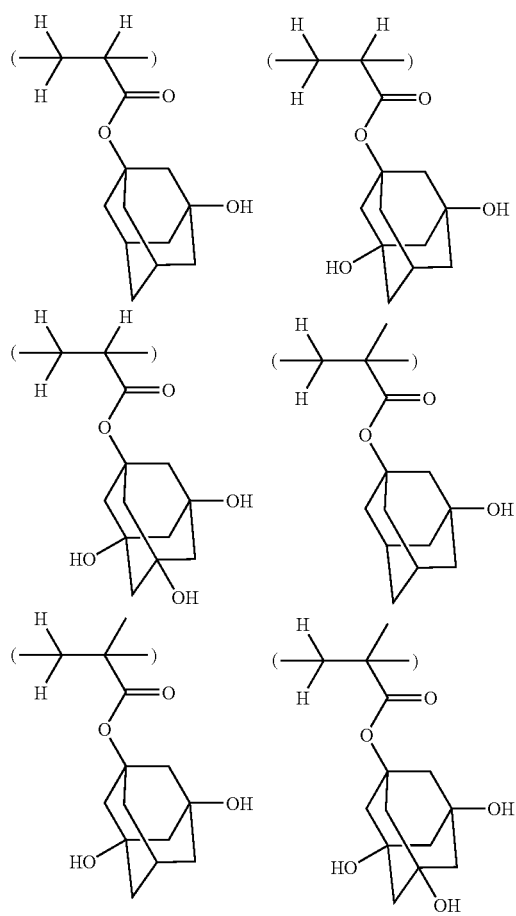

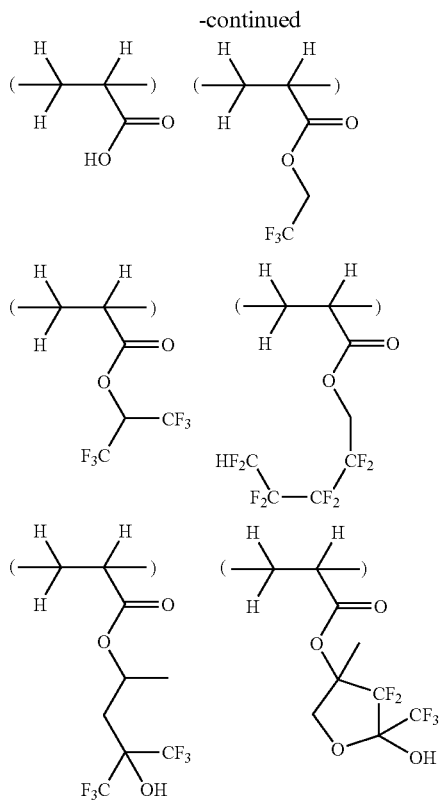

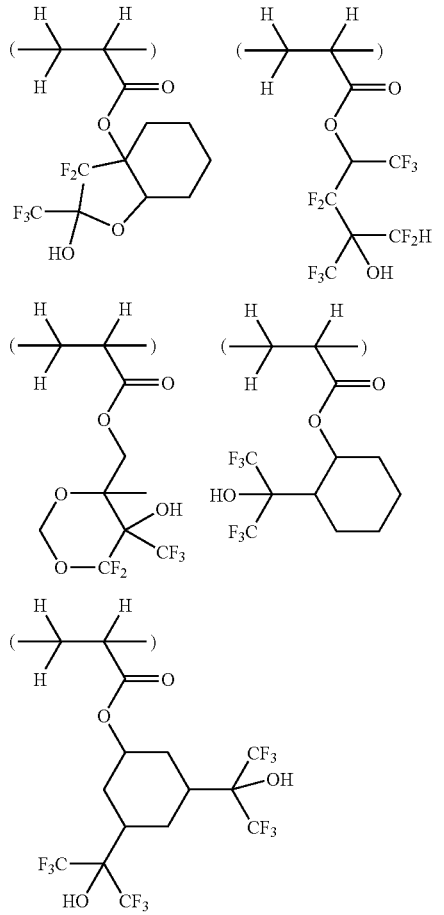

-continued
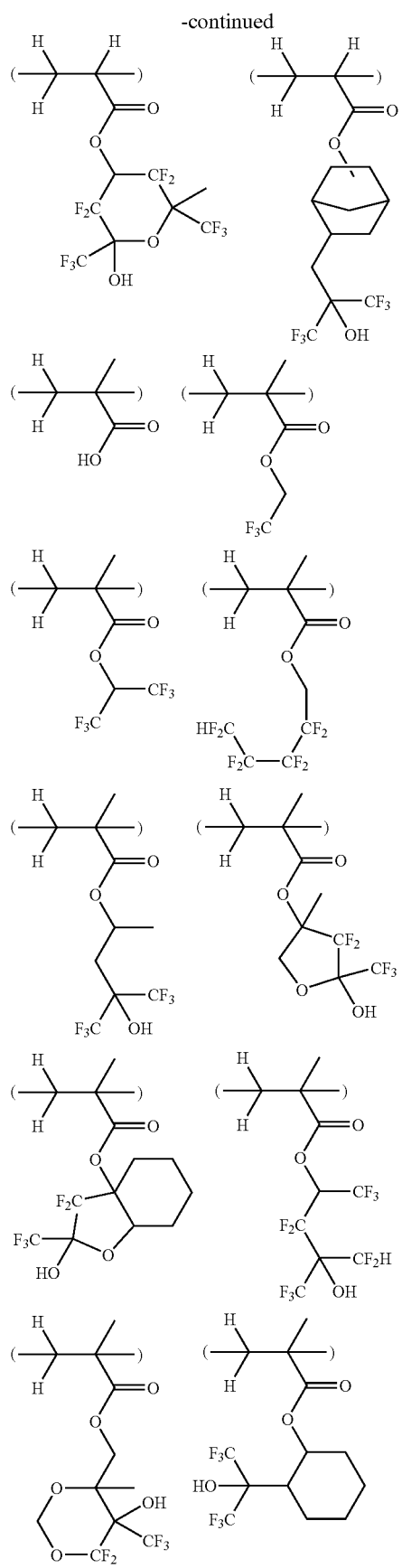
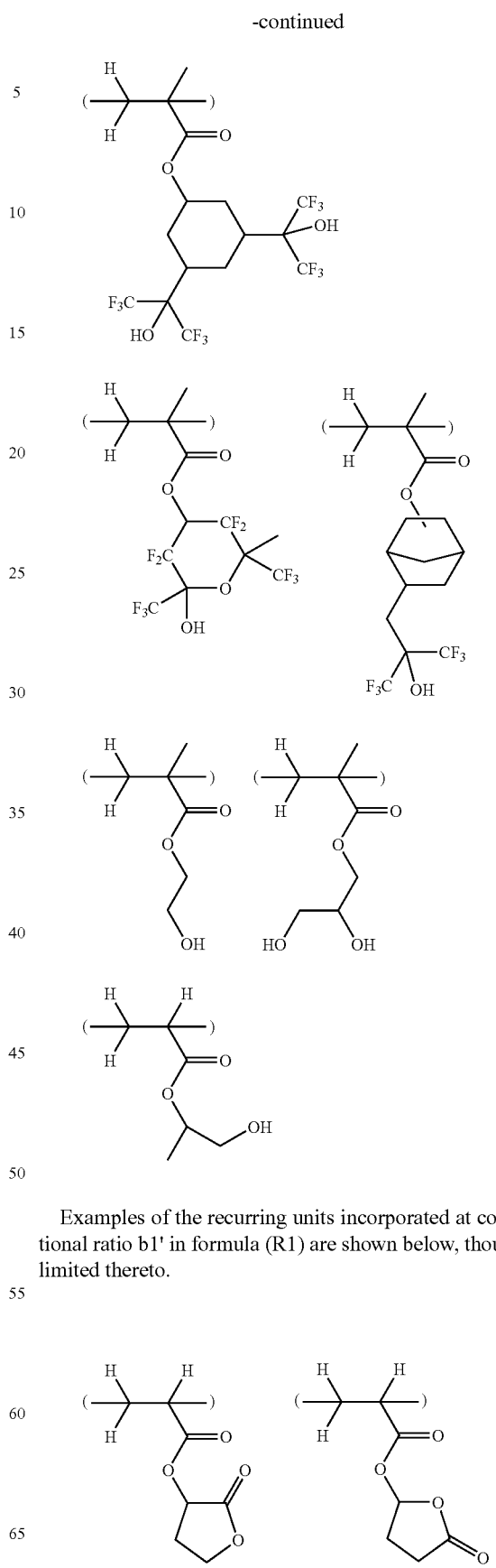
Examples of the recurring units incorporated at compositional ratio b1' in formula (R1) are shown below, though not limited thereto.

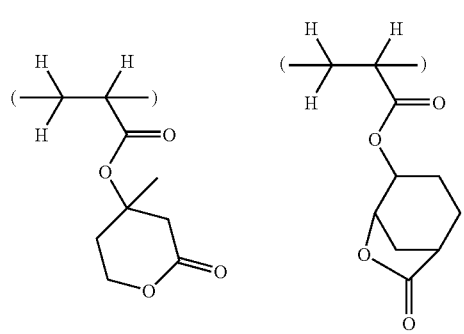
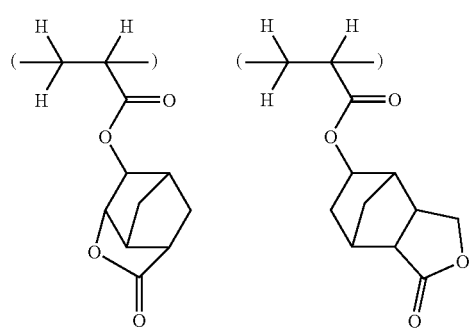
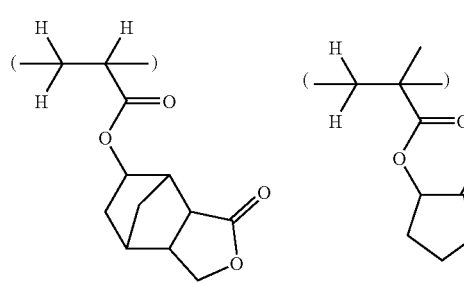
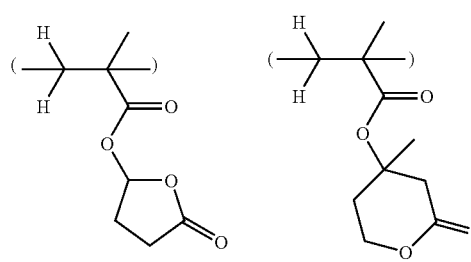
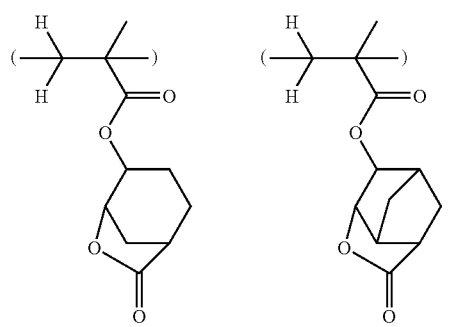
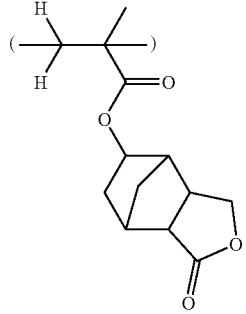
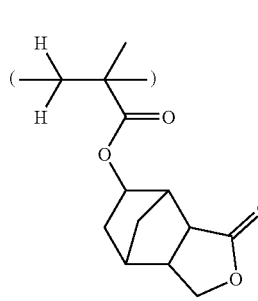
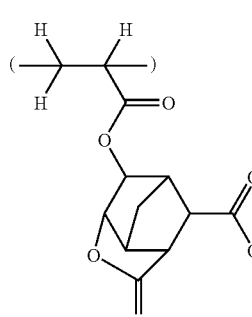
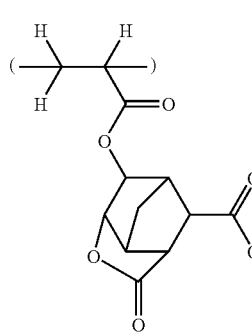
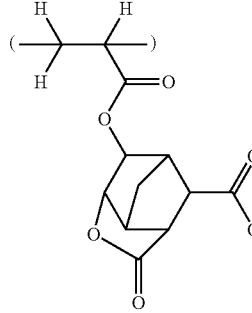

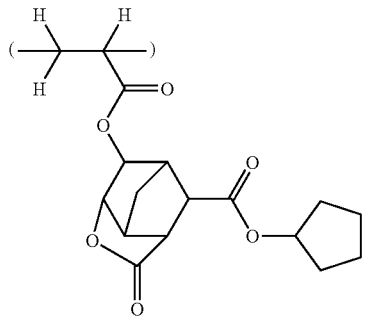
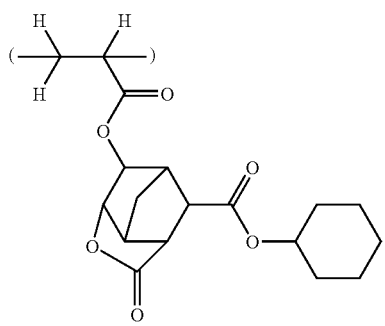
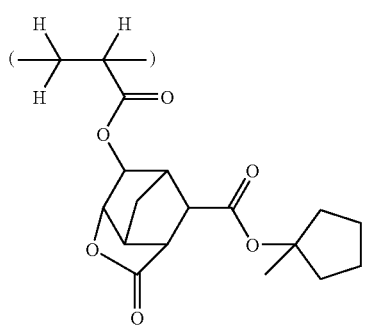
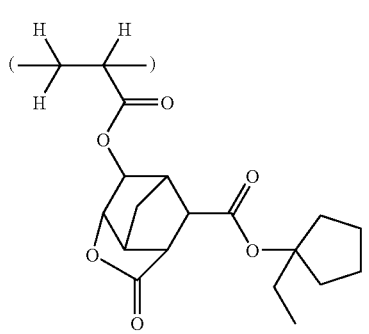
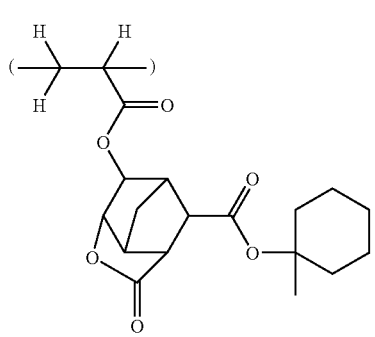
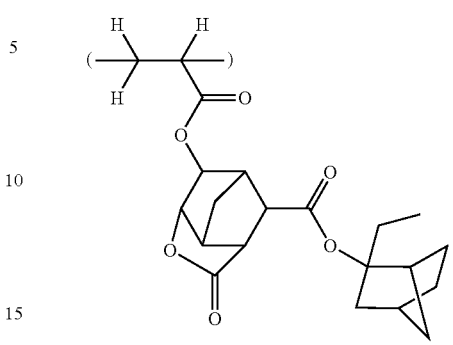
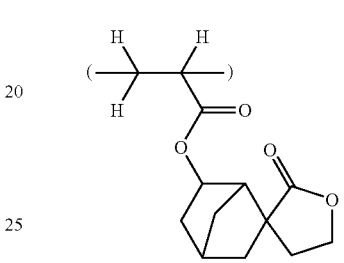
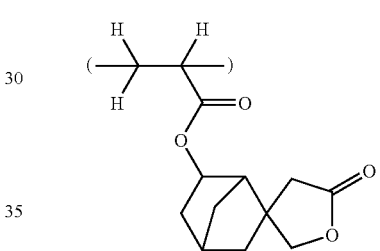
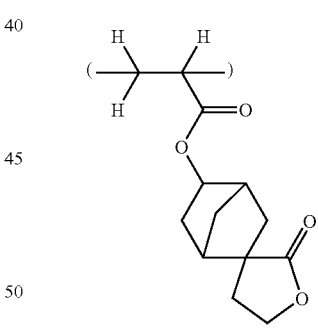
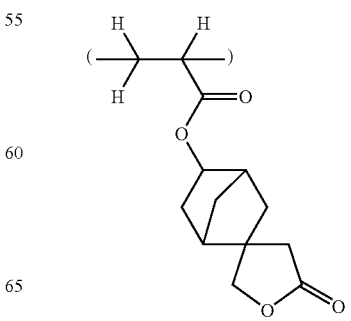

-continued
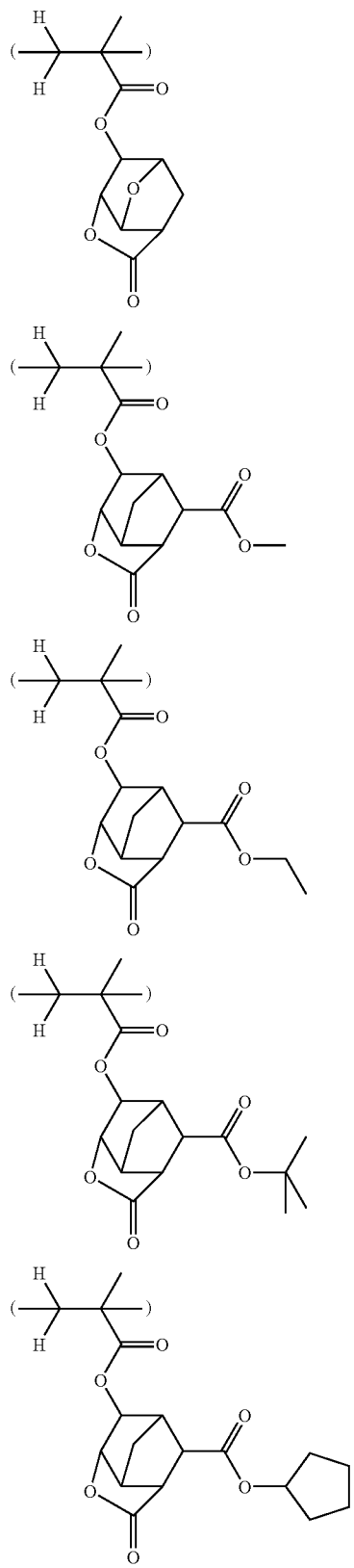
-continued
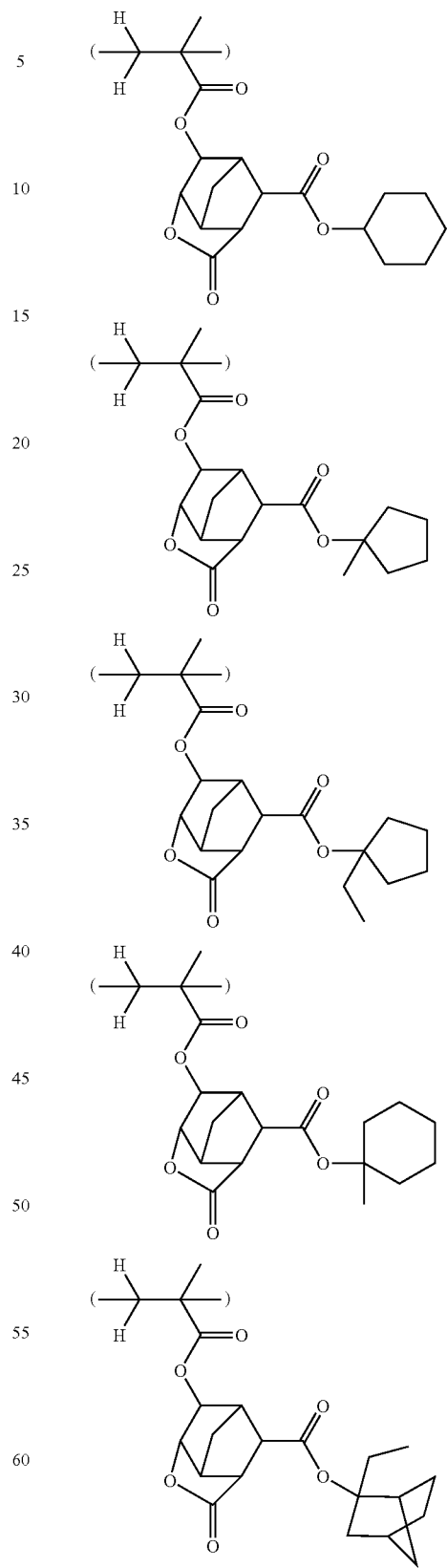

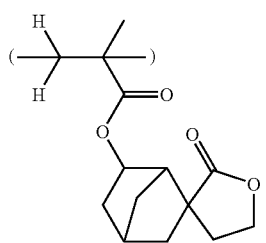
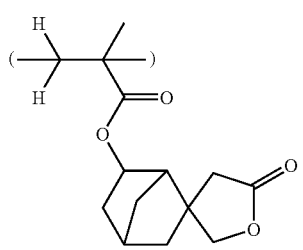
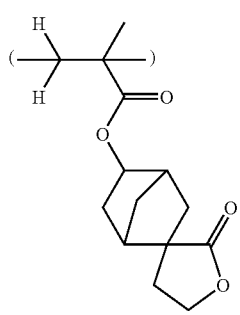
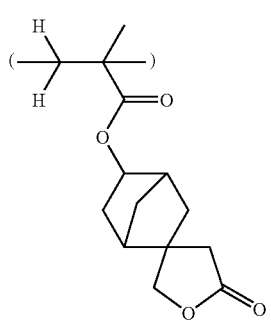
Examples of the recurring units incorporated at compositional ratio d1' in formula (R1) are shown below, though not limited thereto.
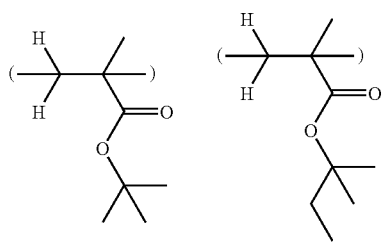
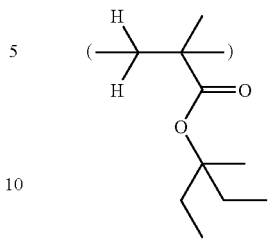
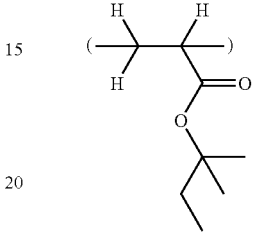
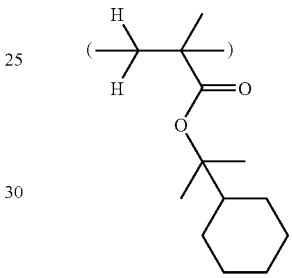
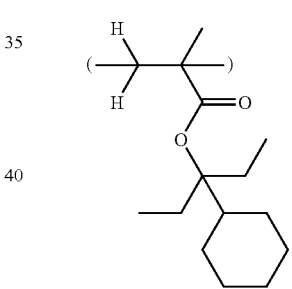
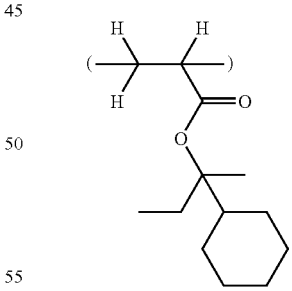
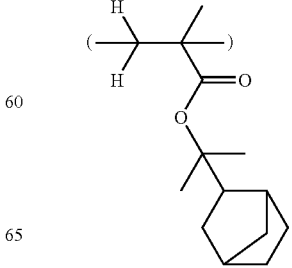

-continued
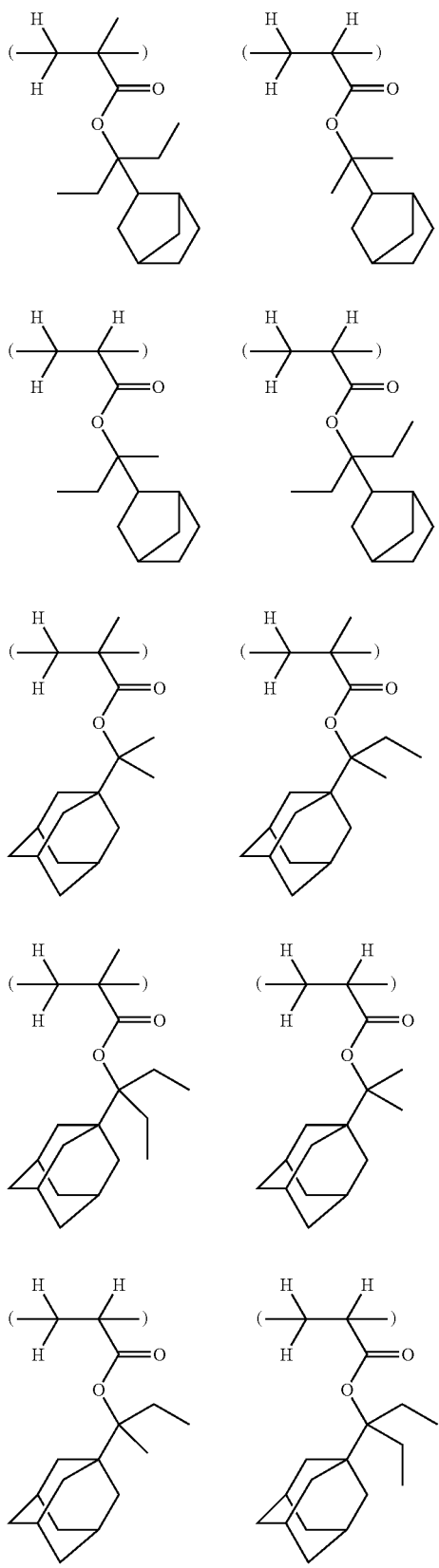
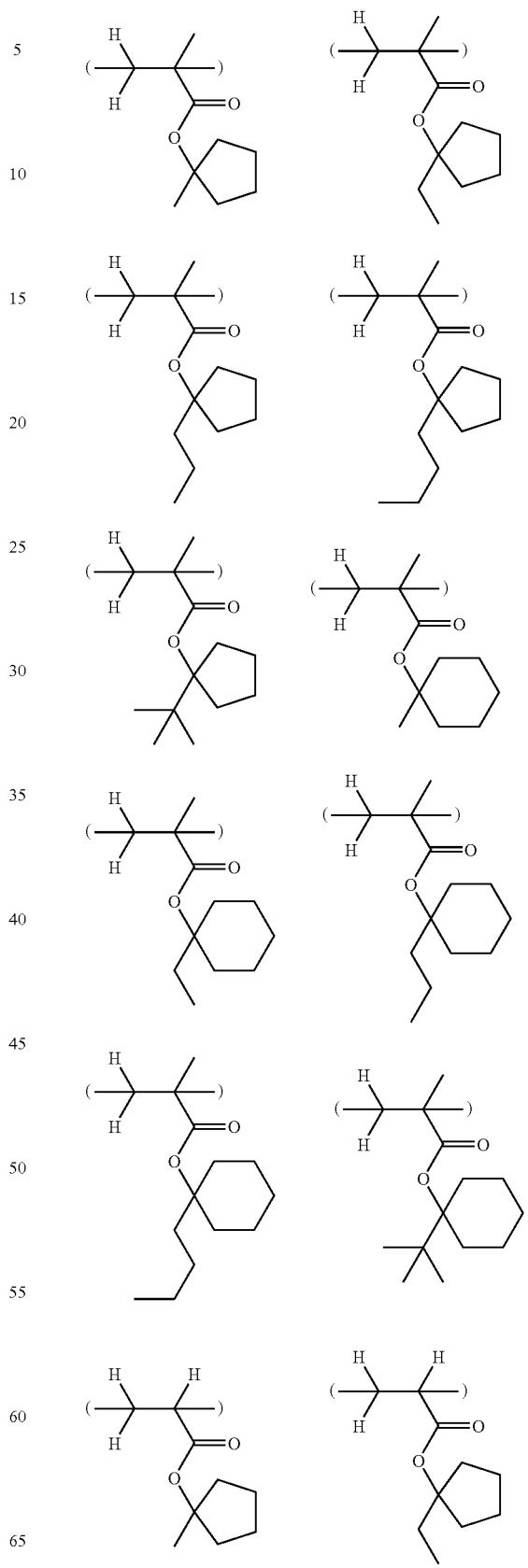

-continued
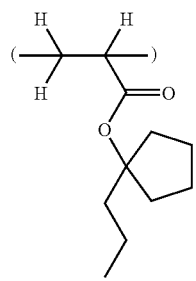 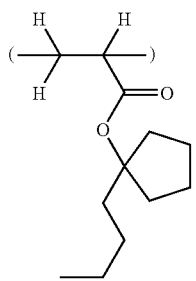
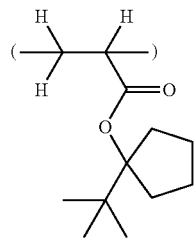 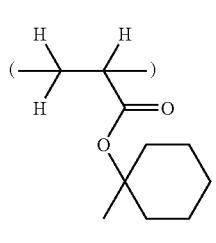
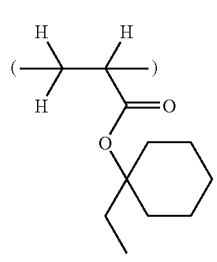 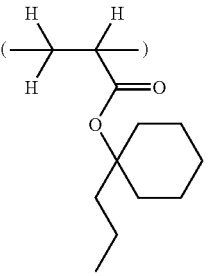
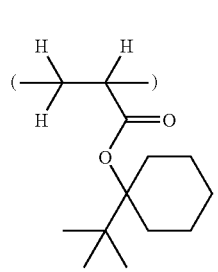 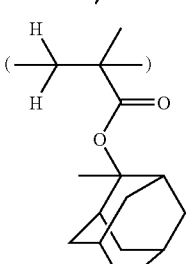
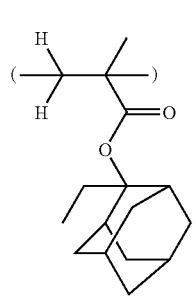 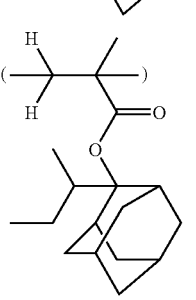
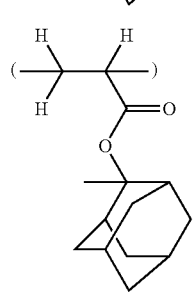 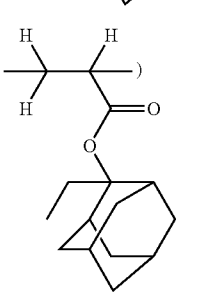
-continued
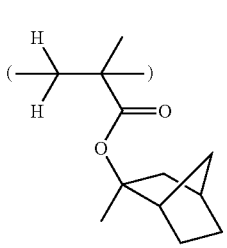 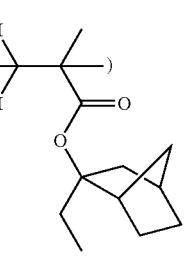
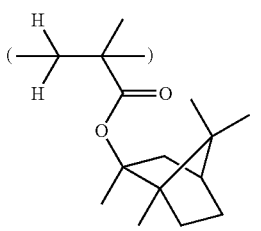
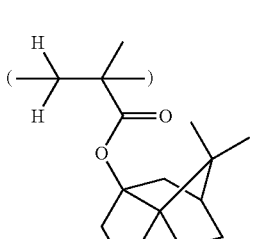 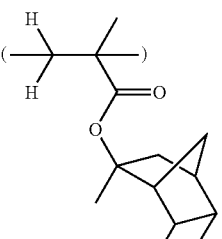
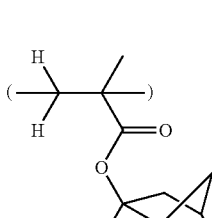
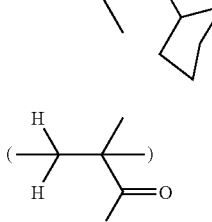
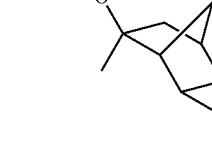
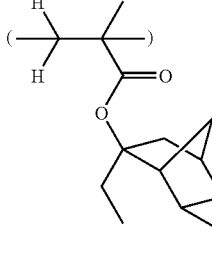

-continued
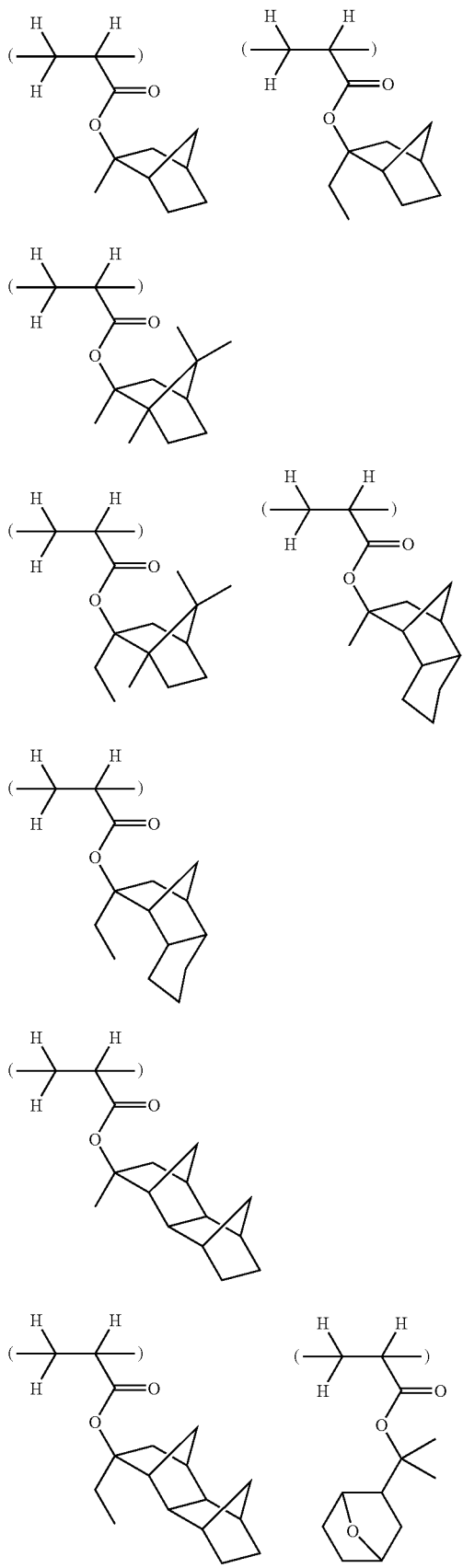
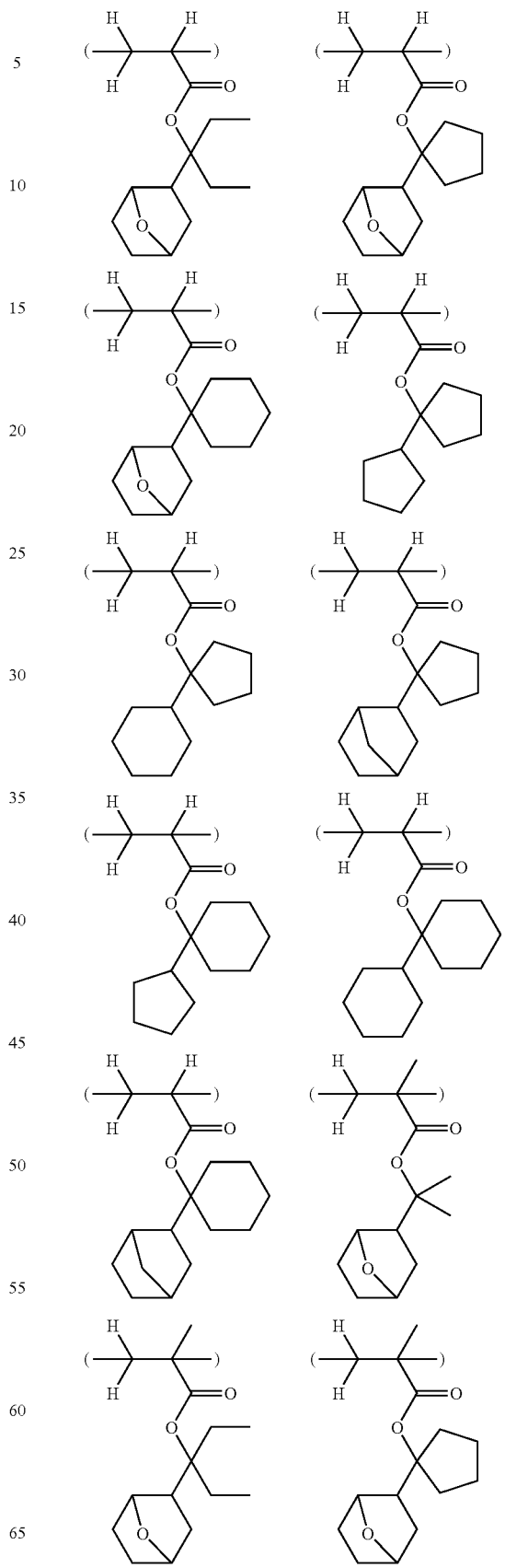

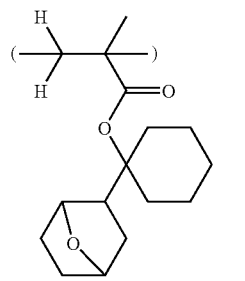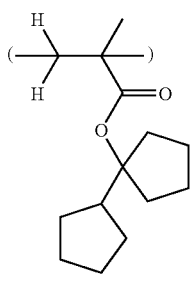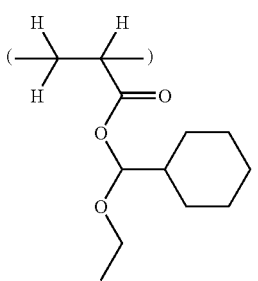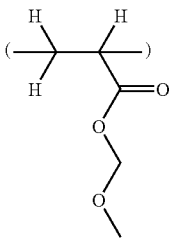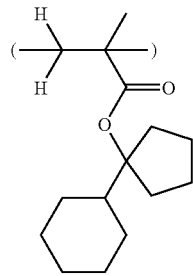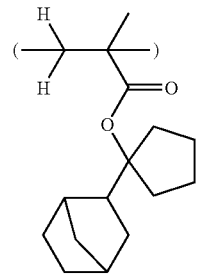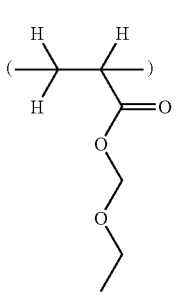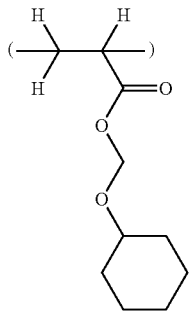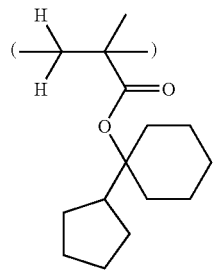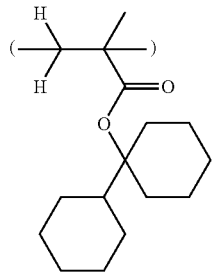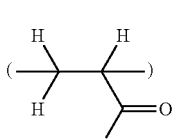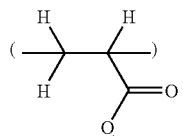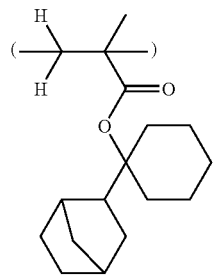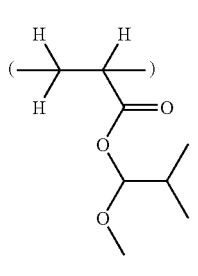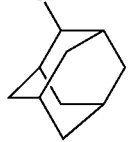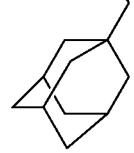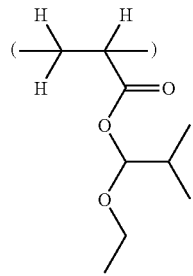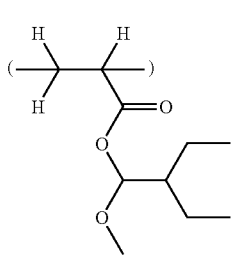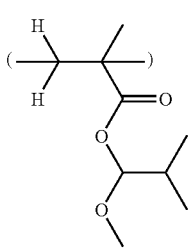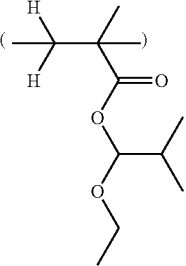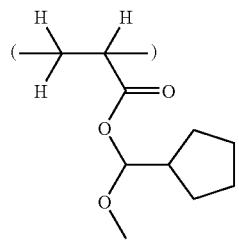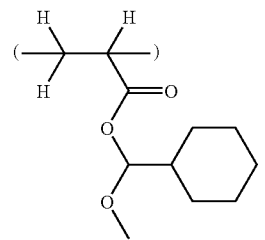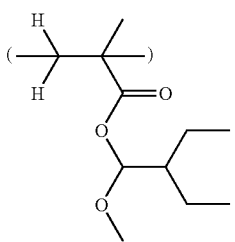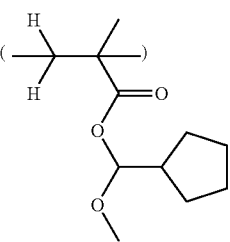

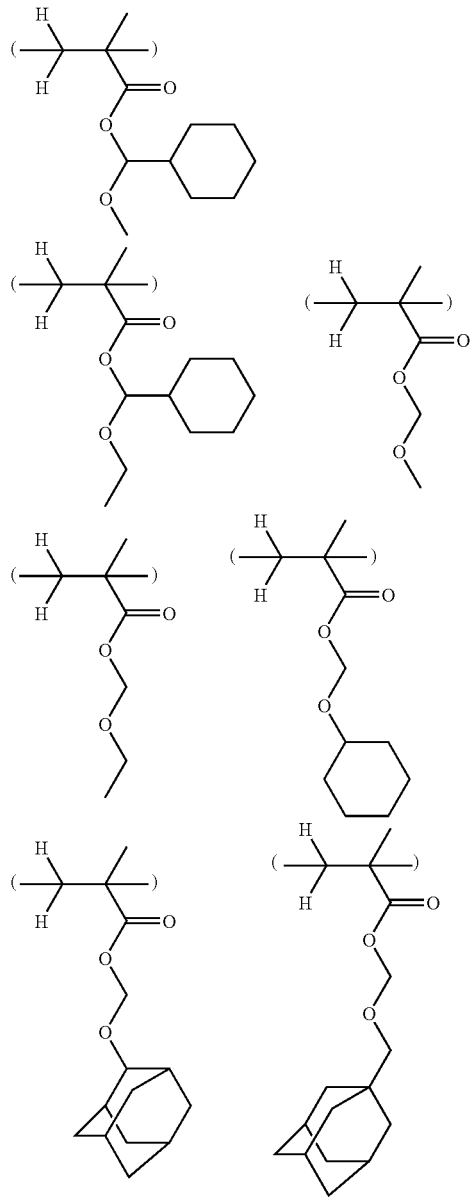
Examples of polymers comprising recurring units in compositional ratios a3', b3', c3' and d3' in formula (R1) are shown below, though not limited thereto.
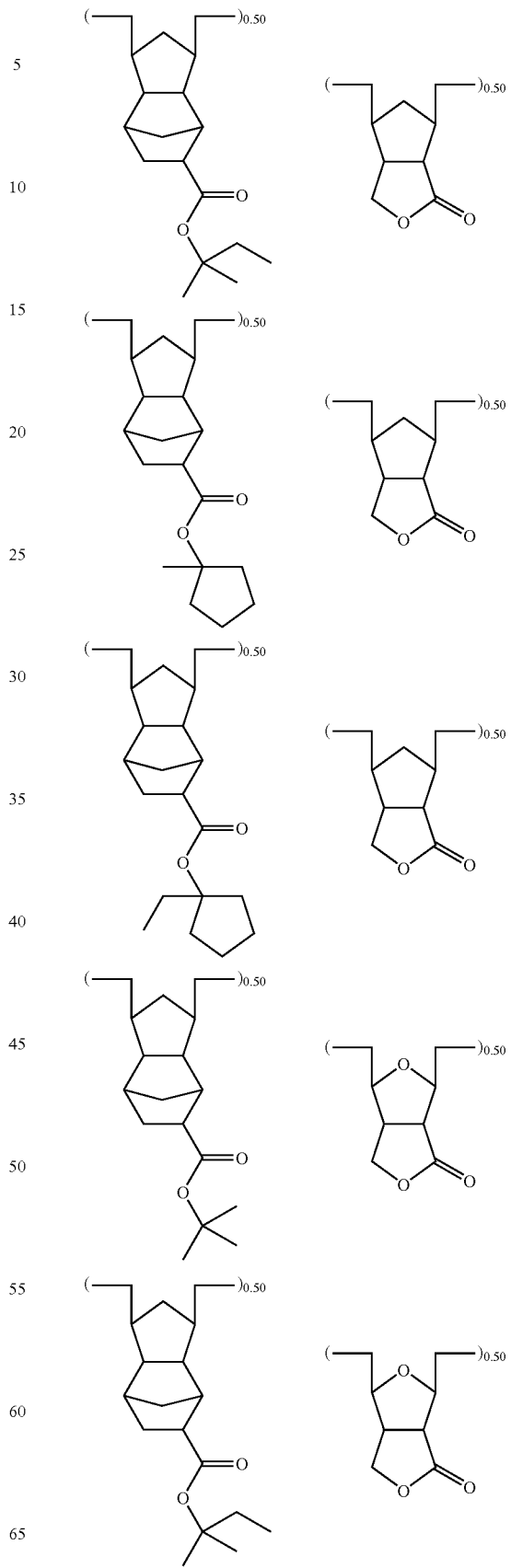

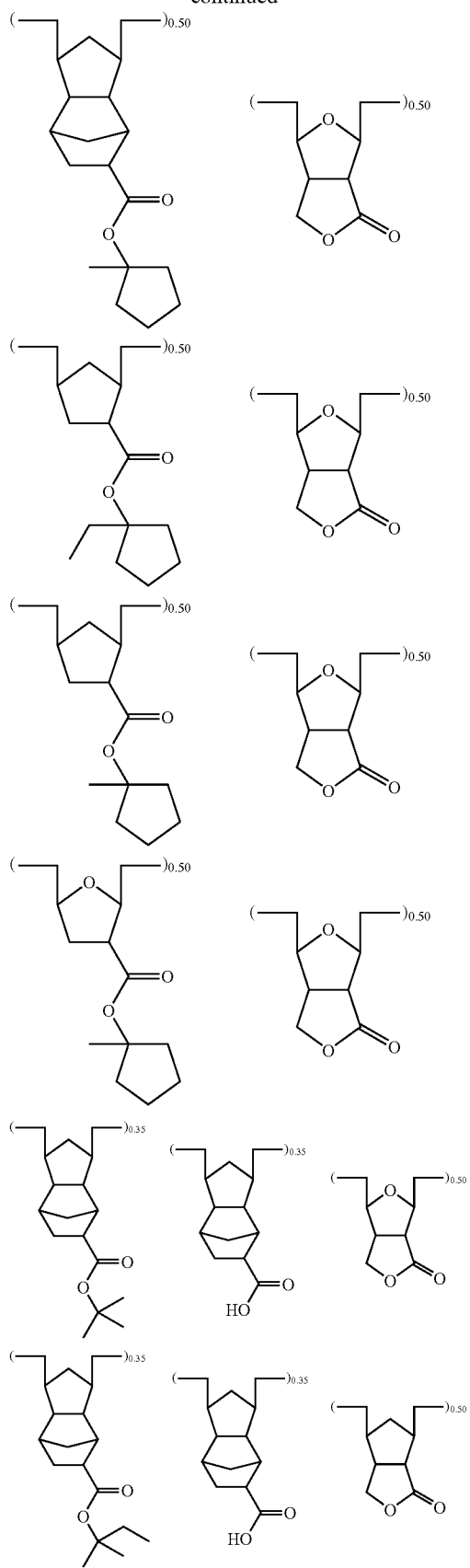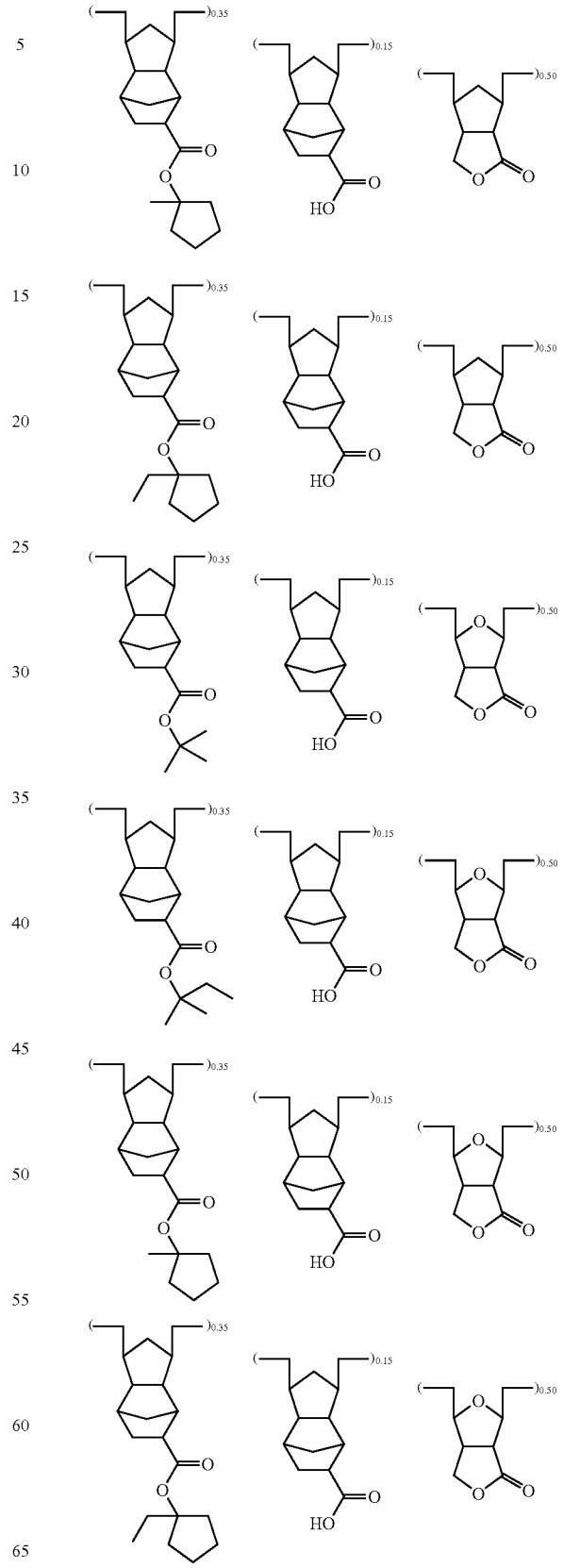

-continued

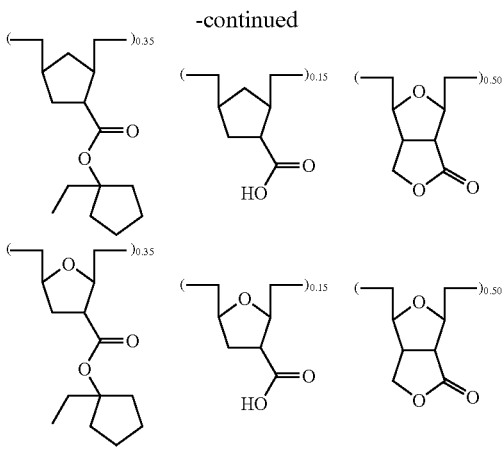

The polymer used as the base resin is not limited to one type and a mixture of two or more polymers may be added. The use of plural polymers allows for easy adjustment of resist properties.

Acid Generator

In the resist composition of the invention, an acid generator, specifically a compound capable of generating an acid in response to actinic light or radiation may be included in order that the resist composition function as a chemically amplified positive resist composition. The acid generator may be any compound capable of generating an acid upon exposure of high-energy radiation, which is generally referred to as "photoacid generator" or PAG. Suitable photoacid generators include sulfonium salts, iodonium salts, sulfonyldiazomethane, N-sulfonyloxyimide, and oxime-O-sulfonate acid generators. Exemplary acid generators are given below while they may be used alone or in admixture of two or more.

Sulfonium salts are salts of sulfonium cations with sulfonates, bis(substituted alkylsulfonyl)imides and tris(substituted alkylsulfonyl)methides. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl) diphenylsulfonium, bis(3,4-di-tert-butoxyphenyl) phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, 2-oxo-2-phenylethylthiacyclopentanium, 4-n-butoxynaphthyl-1-thiacyclopentanium, and 2-n-butoxynaphthyl-1-thiacyclopentanium. Exemplary sulfonates include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4'-toluenesulfonyloxy)benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthylethanesulfonate, 1,1,2,2-tetrafluoro-2-(norbornan-2-yl) ethanesulfonate, and 1,1,2,2-tetrafluoro-2-(tetracyclo [4.4.0.1$^{2,5}$.1$^{7,10}$]dodec-3-en-8-yl)ethanesulfonate.

Exemplary bis(substituted alkylsulfonyl)imides include bis-trifluoromethylsulfonylimide, bispentafluoroethylsulfonylimide, bisheptafluoropropylsulfonylimide, and 1,3-propylenebissulfonylimide. A typical tris(substituted alkylsulfonyl)methide is tristrifluoromethylsulfonylmethide. Sulfonium salts based on combination of the foregoing examples are included.

Iodonium salts are salts of iodonium cations with sulfonates, bis(substituted alkylsulfonyl)imides and tris(substituted alkylsulfonyl)methides. Exemplary iodonium cations are aryliodonium cations including diphenyliodinium, bis(4-tert-butylphenyl)iodonium, 4-tert-butoxyphenylphenyliodonium, and 4-methoxyphenylphenyliodonium. Exemplary sulfonates include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthylethanesulfonate, 1,1,2,2-tetrafluoro-2-(norbornan-2-yl)ethanesulfonate, and 1,1,2,2-tetrafluoro-2-(tetracyclo [4.4.0.1$^{2,5}$.1$^{7,10}$]dodec-3-en-8-yl)ethanesulfonate.

Exemplary bis(substituted alkylsulfonyl)imides include bis-trifluoromethylsulfonylimide, bispentafluoroethylsulfonylimide, bisheptafluoropropylsulfonylimide, and 1,3-propylenebissulfonylimide. A typical tris(substituted alkylsulfonyl)methide is tristrifluoromethylsulfonylmethide. Iodonium salts based on combination of the foregoing examples are included.

Exemplary sulfonyldiazomethane compounds include bis-sulfonyldiazomethane compounds and sulfonyl-carbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, bis(4-acetyloxyphenylsulfonyl)diazomethane, bis(4-methanesulfonyloxyphenylsulfonyl)diazomethane, bis(4-(4-toluenesulfonyloxy)phenylsulfonyl)diazomethane, bis(4-(n-hexyloxyphenylsulfonyl)diazomethane, bis(2-methyl-4-(n-hexyloxy)phenylsulfonyl)diazomethane, bis(2,5-dimethyl-4-(n-hexyloxy)phenylsulfonyl)diazomethane, bis(3,5-dimethyl-4-(n-hexyloxy)phenylsulfonyl)diazomethane, bis(2-methyl-5-isopropyl-4-(n-hexyloxy)phenylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxyimide photoacid generators include combinations of imide skeletons with sulfonates. Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide. Exemplary sulfonates include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthylethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl)ethanesulfonate.

Benzoinsulfonate photoacid generators include benzoin tosylate, benzoin mesylate, and benzoin butanesulfonate.

Pyrogallol trisulfonate photoacid generators include pyrogallol, phloroglucinol, catechol, resorcinol, and hydroquinone, in which all the hydroxyl groups are substituted by trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxypropanesulfonate, 1,1,3,3,3-pentafluoro-2-pivaloyloxypropanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthylethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl)ethanesulfonate.

Nitrobenzyl sulfonate photoacid generators include 2,4-dinitrobenzyl sulfonate, 2-nitrobenzyl sulfonate, and 2,6-dinitrobenzyl sulfonate, with exemplary sulfonates including trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthylethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl)ethanesulfonate. Also useful are analogous nitrobenzyl sulfonate compounds in which the nitro group on the benzyl side is substituted by a trifluoromethyl group.

Sulfone photoacid generators include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Photoacid generators in the form of glyoxime derivatives are described in Japanese Patent No. 2,906,999 and JP-A 9-301948 and include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(methanesulfonyl)-α-dimethylglyoxime, bis-O-(trifluoromethanesulfonyl)-α-dimethylglyoxime, bis-O-(2,2,2-trifluoroethanesulfonyl)-α- dimethylglyoxime, bis-O-(10-camphorsulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-trifluoromethylbenzenesulfonyl)-α-dimethylglyoxime, bis-O-(xylenesulfonyl)-α-dimethylglyoxime, bis-O-(trifluoromethanesulfonyl)-nioxime, bis-O-(2,2,2-trifluoroethanesulfonyl)-nioxime, bis-O-(10-camphorsulfonyl)-nioxime, bis-O-(benzenesulfonyl)-nioxime, bis-O-(p-fluorobenzenesulfonyl)-nioxime, bis-O-(p-trifluoromethylbenzenesulfonyl)-nioxime, and bis-O-(xylenesulfonyl)-nioxime.

Also included are the oxime sulfonates described in U.S. Pat. No. 6,004,724, for example, (5-(4-toluenesulfonyl)oxyimino-5H-thiophen-2-ylidene)phenylacetonitrile, (5-(10-camphorsulfonyl)oxyimino-5H-thiophen-2-ylidene)phenylacetonitrile, (5-n-octanesulfonyloxyimino-5H-thiophen-2-ylidene)phenylacetonitrile, (5-(4-toluenesulfonyl)oxyimino-5H-thiophen-2-ylidene)(2-methylphenyl)acetonitrile, (5-(10-camphorsulfonyl)oxyimino-5H-thiophen-2-ylidene)(2-methylphenyl)acetonitrile, (5-n-octanesulfonyloxyimino-5H-thiophen-2-ylidene)(2-methylphenyl)acetonitrile, etc. Also included are the oxime sulfonates described in U.S. Pat. No. 6,916,591, for example, (5-(4-(4-toluenesulfonyloxy)benzenesulfonyl)oxyimino-5H-thiophen-2-ylidene)phenylacetonitrile and (5-(2,5-bis(4-toluenesulfonyloxy)benzenesulfonyl)oxyimino-5H-thiophen-2-ylidene) phenylacetonitrile.

Also included are the oxime sulfonates described in U.S. Pat. No. 6,261,738 and JP-A 2000-314956, for example, 2,2,2-trifluoro-1-phenyl-ethanone oxime-O-methylsulfonate; 2,2,2-trifluoro-1-phenyl-ethanone oxime-O-(10-camphorylsulfonate); 2,2,2-trifluoro-1-phenyl-ethanone oxime-O-(4-methoxyphenylsulfonate); 2,2,2-trifluoro-1-phenyl-ethanone oxime-O-(1-naphthylsulfonate); 2,2,2-trifluoro-1-phenyl-ethanone oxime-O-(2-naphthylsulfonate); 2,2,2-trifluoro-1-phenyl-ethanone oxime-O-(2,4,6-trimethylphenylsulfonate); 2,2,2-trifluoro-1-(4-methylphenyl)-ethanone oxime-O-(10-camphorylsulfonate); 2,2,2-trifluoro-1-(4-methylphenyl)-ethanone oxime-O-(methylsulfonate); 2,2,2-trifluoro-1-(2-methylphenyl)-ethanone oxime-O-(10-camphorylsulfonate); 2,2,2-trifluoro-1-(2,4-dimethylphenyl)-ethanone oxime-O-(10-camphorylsulfonate); 2,2,2-trifluoro-1-(2,4-dimethylphenyl)-ethanone oxime-O-(1-naphthylsulfonate); 2,2,2-trifluoro-1-(2,4-dimethylphenyl)-ethanone oxime-O-(2-naphthylsulfonate); 2,2,2-trifluoro-1-(2,4,6-trimethylphenyl)-ethanone oxime-O-(10-camphorylsulfonate); 2,2,2-trifluoro-1-(2,4,6-trimethylphenyl)-ethanone oxime-O-(1-naphthylsulfonate); 2,2,2-trifluoro-1-(2,4,6-trimethylphenyl)-ethanone oxime-O-(2-naphthylsulfonate); 2,2,2-trifluoro-1-(4-methoxyphenyl)-ethanone oxime-O-methylsulfonate; 2,2,2-trifluoro-1-(4-methylthiophenyl)-ethanone oxime-O-methylsulfonate; 2,2,2-trifluoro-1-(3,4-dimethoxyphenyl)-ethanone oxime-O-methylsulfonate; 2,2,3,3,4,4,4-heptafluoro-1-phenyl-butanone oxime-O-(10-camphorylsulfonate); 2,2,2-trifluoro-1-(phenyl)-ethanone oxime-O-methylsulfonate; 2,2,2-trifluoro-1-(phenyl)-ethanone oxime-O-10-camphorylsulfonate; 2,2,2-trifluoro-1-(phenyl)-ethanone oxime-O-(4-methoxyphenyl)sulfonate; 2,2,2-trifluoro-1-(phenyl)-ethanone oxime-O-(1-naphthyl)sulfonate; 2,2,2-trifluoro-1-(phenyl)-ethanone oxime-O-(2-naphthyl)sulfonate; 2,2,2-trifluoro-1-(phenyl)-ethanone oxime-O-(2,4,6-trimethylphenyl)sulfonate; 2,2,2-trifluoro-1-(4-methylphenyl)-ethanone oxime-O-(10-camphoryl)sulfonate; 2,2,2-trifluoro-1-(4-methylphenyl)-ethanone oxime-O-methylsulfonate; 2,2,2-trifluoro-1-(2-methylphenyl)-ethanone oxime-O-(10-camphoryl)sulfonate; 2,2,2-trifluoro-1-(2,4-dimethylphenyl)-ethanone oxime-O-(1-naphthyl)sulfonate; 2,2,2-trifluoro-1-(2,4-dimethylphenyl)-ethanone oxime-O-(2-naphthyl)sulfonate; 2,2,2-trifluoro-1-(2,4,6-trimethylphenyl)-ethanone oxime-O-(10-camphoryl)sulfonate; 2,2,2-trifluoro-1-(2,4,6-trimethylphenyl)-ethanone oxime-O-(1-naphthyl)sulfonate; 2,2,2-trifluoro-1-(2,4,6-trimethylphenyl)-ethanone oxime-O-(2-naphthyl)sulfonate; 2,2,2-trifluoro-1-(4-methoxyphenyl)-ethanone oxime-O-methylsulfonate; 2,2,2-trifluoro-1-(4-thiomethylphenyl)-ethanone oxime-O-methylsulfonate; 2,2,2-trifluoro-1-(3,4-dimethoxyphenyl)-ethanone oxime-O-methylsulfonate; 2,2,2-trifluoro-1-(4-methoxyphenyl)-ethanone oxime-O-(4-methylphenyl)sulfonate; 2,2,2-trifluoro-1-(4-methoxyphenyl)-ethanone oxime-O-(4-methoxyphenyl)sulfonate; 2,2,2-trifluoro-1-(4-methoxyphenyl)-ethanone oxime-O-(4-dodecylphenyl)-sulfonate; 2,2,2-trifluoro-1-(4-methoxyphenyl)-ethanone oxime-O-octylsulfonate; 2,2,2-trifluoro-1-(4-thiomethylphenyl)-ethanone oxime-O-(4-methoxyphenyl)sulfonate; 2,2,2-trifluoro-1-(4-thiomethylphenyl)-ethanone oxime-O-(4-dodecylphenyl) sulfonate; 2,2,2-trifluoro-1-(4-thiomethylphenyl)-ethanone oxime-O-octylsulfonate; 2,2,2-trifluoro-1-(4-thiomethylphenyl)-ethanone oxime-O-(2-naphthyl)sulfonate; 2,2,2-trifluoro-1-(2-methylphenyl)-ethanone oxime-O-methylsulfonate; 2,2,2-trifluoro-1-(4-methylphenyl)ethanone oxime-O-phenylsulfonate; 2,2,2-trifluoro-1-(4-chlorophenyl)-ethanone oxime-O-phenylsulfonate; 2,2,3,3,4,4,4-heptafluoro-1-(phenyl)-butanone oxime-O-(10-camphoryl)sulfonate; 2,2,2-trifluoro-1-naphthyl-ethanone oxime-O-methylsulfonate; 2,2,2-trifluoro-2-naphthyl-ethanone oxime-O-methylsulfonate; 2,2,2-trifluoro-1-[4-benzylphenyl]-ethanone oxime-O-methylsulfonate; 2,2,2-trifluoro-1-[4-(phenyl-1,4-dioxa-but-1-yl)phenyl]-ethanone oxime-O-methylsulfonate; 2,2,2-trifluoro-1-naphthyl-ethanone oxime-O-propylsulfonate; 2,2,2-trifluoro-2-naphthyl-ethanone oxime-O-propylsulfonate; 2,2,2-trifluoro-1-[4-benzylphenyl]-ethanone oxime-O-propylsulfonate; 2,2,2-trifluoro-1-[4-methylsulfonylphenyl]-ethanone oxime-O-propylsulfonate; 1,3-bis[1-(4-phenoxyphenyl)-2,2,2-trifluoroethanone oxime-O-sulfonyl]phenyl; 2,2,2-trifluoro-1-[4-methylsulfonyloxyphenyl]-ethanone oxime-O-propylsulfonate; 2,2,2-trifluoro-1-[4-methylcarbonyloxyphenyl]-ethanone oxime-O-propylsulfonate; 2,2,2-trifluoro-1-[6H,7H-5,8-dioxonaphth-2-yl]-ethanone oxime-O-propylsulfonate; 2,2,2-trifluoro-1-[4-methoxycarbonylmethoxyphenyl]-ethanone oxime-O-propylsulfonate; 2,2,2-trifluoro-1-[4-(methoxycarbonyl)-(4-amino-1-oxa-pent-1-yl)-phenyl]-ethanone oxime-O-propylsulfonate; 2,2,2-trifluoro-1-[3,5-dimethyl-4-ethoxyphenyl]-ethanone oxime-O-propylsulfonate; 2,2,2-trifluoro-1-[4-benzyloxyphenyl]-ethanone oxime-O-propylsulfonate; 2,2,2-trifluoro-1-[2-thiophenyl]-ethanone oxime-O-propylsulfonate; 2,2,2-trifluoro-1-[1-dioxathiophen-2-yl)]-ethanone oxime-O-propylsulfonate; 2,2,2-trifluoro-1-(4-(3-(4-(2,2,2-trifluoro-1-(trifluoromethanesulfonyloxyimino)-ethyl)-phenoxy)-propoxy)-phenyl) ethanone oxime(trifluoromethanesulfonate); 2,2,2-trifluoro-1-(4-(3-(4-(2,2,2-trifluoro-1-(1-propanesulfonyloxyimino)-ethyl)-phenoxy)-propoxy)-phenyl)ethanone oxime(1-propanesulfonate); and 2,2,2-trifluoro-1-(4-(3-(4-(2,2,2-trifluoro-1-(1-butanesulfonyloxyimino)-ethyl)-phenoxy)-propoxy)-phenyl)-ethanone oxime(1-butanesulfonate). Also included are the oxime sulfonates described in U.S. Pat. No. 6,916,591, for example, 2,2,2-trifluoro-1-(4-(3-(4-(2,2,2-trifluoro-1-(4-(4-methylphenylsulfonyloxy)phenylsulfonyloxyimino)-ethyl)-phenoxy)-propoxy)-phenyl)ethanone oxime(4-(4-methylphenylsulfonyloxy)phenylsulfonate) and 2,2,2-trifluoro-1-(4-(3-(4-(2,2,2-trifluoro-1-(2,5-bis(4-methylphenylsulfonyloxy)-benzenesulfonyloxy)phenylsulfonyloxyimino)-ethyl)-phenoxy)-propoxy)-phenyl)ethanone oxime(2,5-bis(4-methylphenylsulfonyloxy)benzenesulfonyloxy)phenylsulfonate).

Also included are the oxime sulfonates described in JP-A 9-95479 and JP-A 9-230588 and the references cited therein, for example, α-(p-toluenesulfonyloxyimino)-phenylacetonitrile, α-(p-chlorobenzenesulfonyloxyimino)-phenylacetonitrile, α-(4-nitrobenzenesulfonyloxyimino)-phenylacetonitrile, α-(4-nitro-2-trifluoromethylbenzenesulfonyloxyimino)-phenylacetonitrile, α-(benzenesulfonyloxyimino)-4-chlorophenylacetonitrile, α-(benzenesulfonyloxyimino)-2,4-dichlorophenylacetonitrile, α-(benzenesulfonyloxyimino)-2,6-dichlorophenylacetonitrile, α-(benzenesulfonyloxyimino)-4-methoxyphenylacetonitrile, α-(2-chlorobenzenesulfonyloxyimino)-4-methoxyphenylacetonitrile, α-(benzenesulfonyloxyimino)-2-thienylacetonitrile, α-(4-dodecylbenzenesulfonyloxyimino)-phenylacetonitrile, α-[(4-toluenesulfonyloxyimino)-4-methoxyphenyl]acetonitrile, α-[(dodecylbenzenesulfonyloxyimino)-4-methoxyphenyl]acetonitrile, α-(tosyloxyimino)-3-thienylacetonitrile, α-(methylsulfonyloxyimino)-1-cyclopentenylacetonitrile, α-(ethylsulfonyloxyimino)-1-cyclopentenylacetonitrile, α-(isopropylsulfonyloxyimino)-1-cyclopentenylacetonitrile, α-(n-butylsulfonyloxyimino)-1-cyclopentenylacetonitrile, α-(ethylsulfonyloxyimino)-1-cyclohexenylacetonitrile, α-(isopropylsulfonyloxyimino)-1-cyclohexenylacetonitrile, and α-(n-butylsulfonyloxyimino)-1-cyclohexenylacetonitrile.

Also included are oxime sulfonates having the formula:

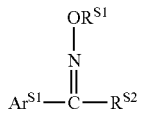

wherein $R^{s1}$ is a substituted or unsubstituted haloalkylsulfonyl or halobenzenesulfonyl group of 1 to 10 carbon atoms, $R^{s2}$ is a haloalkyl group of 1 to 11 carbon atoms, and $Ar^{s1}$ is substituted or unsubstituted aromatic or hetero-aromatic group, as described in WO 2004/074242. Examples include 2-[2,2,3,3,4,4,5,5-octafluoro-1-(nonafluorobutylsulfonyloxyimino)-pentyl]-fluorene, 2-[2,2,3,3,4,4-pentafluoro-1-(nonafluorobutylsulfonyloxyimino)-butyl]-fluorene, 2-[2,2,3,3,4,4,5,5,6,6-decafluoro-1-(nonafluorobutylsulfonyloxyimino)-hexyl]-fluorene, 2-[2,2,3,3,4,4,5,5-octafluoro-1-(nonafluorobutylsulfonyloxyimino)-pentyl]-4-biphenyl, 2-[2,2,3,3,4,4-pentafluoro-1-(nonafluorobutylsulfonyloxyimino)-butyl]-4-biphenyl, and 2-[2,2,3,3,4,4,5,5,6,6-decafluoro-1-(nonafluorobutylsulfonyloxyimino)-hexyl]-4-biphenyl.

Suitable bisoxime sulfonates include those described in JP-A 9-208554, for example, bis(α-(4-toluenesulfonyloxy)imino)-p-phenylenediacetonitrile, bis(α-(benzenesulfonyloxy)imino)-p-phenylenediacetonitrile, bis(α-(methanesulfonyloxy)imino)-p-phenylenediacetonitrile, bis(α-(butanesulfonyloxy)imino)-p-phenylenediacetonitrile, bis(α-(10-camphorsulfonyloxy)imino)-p-phenylenediacetonitrile, bis(α-(4-toluenesulfonyloxy)imino)-p-phenylenediacetonitrile, bis(α-(trifluoromethanesulfonyloxy)imino)-p-phenylenediacetonitrile, bis(α-(4-methoxybenzenesulfonyloxy)imino)-p-phenylenediacetonitrile, bis(α-(4-toluenesulfonyloxy)imino)-m-phenylenediacetonitrile, bis(α-(benzenesulfonyloxy)imino)-m-phenylenediacetonitrile, bis(α-(methanesulfonyloxy)imino)-m-phenylenediacetonitrile, bis(α-(butanesulfonyloxy)imino)-m-phenylenediacetonitrile, bis(α-(10-camphorsulfonyloxy)imino)-m-phenylenediacetonitrile, bis(α-(4-toluenesulfonyloxy)imino)-m-phenylenediacetonitrile, bis(α-(trifluoromethanesulfonyloxy)imino)-m-phenylenediacetonitrile, bis(α-(4-methoxybenzenesulfonyloxy)imino)-m-phenylenediacetonitrile, etc.

Of these, preferred photoacid generators are sulfonium salts, bissulfonyldiazomethanes, N-sulfonyloxyimides, oxime-O-sulfonates and glyoxime derivatives. More preferred photoacid generators are sulfonium salts, bissulfonyldiazomethanes, N-sulfonyloxyimides, and oxime-O-sulfonates. Typical examples include triphenylsulfonium p-toluenesulfonate, triphenylsulfonium camphorsulfonate, triphenylsulfonium pentafluorobenzenesulfonate, triphenylsulfonium nonafluorobutanesulfonate, triphenylsulfonium 4-(4'-toluenesulfonyloxy)benzenesulfonate, triphenylsulfonium 2,4,6-triisopropylbenzenesulfonate, 4-tert-butoxyphenyldiphenylsulfonium p-toluenesulfonate, 4-tert-butoxyphenyldiphenylsulfonium camphorsulfonate, 4-tert-butoxyphenyldiphenylsulfonium 4-(4'-toluenesulfonyloxy)benzenesulfonate, tris(4-methylphenyl)sulfonium camphorsulfonate, tris(4-tert-butylphenyl)sulfonium camphorsulfonate, 4-tert-butylphenyldiphenylsulfonium camphorsulfonate, 4-tert-butylphenyldiphenylsulfonium nonafluoro-1-butanesulfonate, 4-tert-butylphenyldiphenylsulfonium pentafluoroethylperfluorocyclohexanesulfonate, 4-tert-butylphenyldiphenylsulfonium perfluoro-1-octanesulfonate, triphenylsulfonium 1,1-difluoro-2-naphthyl-ethanesulfonate, triphenylsulfonium 1,1,2,2-tetrafluoro-2-(norbornan-2-yl)-ethanesulfonate, bis(tert-butylsulfonyl)diazomethane, bis(cyclohexylsulfonyl)diazomethane, bis(2,4-dimethylphenylsulfonyl)diazomethane, bis(4-(n-hexyloxy)phenylsulfonyl)diazomethane, bis(2-methyl-4-(n-hexyloxy)phenylsulfonyl)diazomethane, bis(2,5-dimethyl-4-(n-hexyloxy)phenylsulfonyl)diazomethane, bis(3,5-dimethyl-4-(n-hexyloxy)phenylsulfonyl)diazomethane, bis(2-methyl-5-isopropyl-4-(n-hexyloxy)phenylsulfonyl)diazomethane, bis(4-tert-butylphenylsulfonyl)diazomethane, N-camphorsulfonyloxy-5-norbornene-2,3-dicarboxylic acid imide, N-p-toluenesulfonyloxy-5-norbornene-2,3-dicarboxylic acid imide, 2-[2,2,3,3,4,4,5,5-octafluoro-1-(nonafluorobutylsulfonyloxyimino)-pentyl]-fluorene, 2-[2,2,3,3,4,4-pentafluoro-1-(nonafluorobutylsulfonyloxyimino)-butyl]-fluorene, and 2-[2,2,3,3,4,4,5,5,6,6-decafluoro-1-(nonafluorobutylsulfonyloxyimino)-hexyl]-fluorene.

In the chemically amplified resist composition, an appropriate amount of the photoacid generator is, but not limited to, 0.1 to 20 parts, and especially 0.1 to 10 parts by weight per 100 parts by weight of the base resin. If the amount of the PAG is up to 20 phr, the resulting photoresist film has a sufficiently high transmittance to minimize a risk of degrading resolution. The PAG may be used alone or in admixture of two or more. The transmittance of the resist film can be controlled by using a PAG having a low transmittance at the exposure wavelength and adjusting the amount of the PAG added.

In the resist composition, there may be added a compound which is decomposed with an acid to generate another acid, that is, acid-amplifier compound. For these compounds, reference should be made to J. Photopolym. Sci. and Tech., 8, 43-44, 45-46 (1995), and ibid., 9, 29-30 (1996).

Examples of the acid-amplifier compound include tert-butyl-2-methyl-2-tosyloxymethyl acetoacetate and 2-phenyl-2-(2-tosyloxyethyl)-1,3-dioxolane, but are not limited thereto. Of well-known photoacid generators, many of those compounds having poor stability, especially poor thermal stability exhibit an acid amplifier-like behavior.

In the resist composition, an appropriate amount of the acid-amplifier compound is up to 2 parts, and preferably up to 1 part by weight per 100 parts by weight of the base resin. Up to 2 phr of the acid-amplifier compound allows for diffusion control, minimizing a risk of degrading resolution and pattern profile.

In addition to the base resin and PAG as well as the additive polymer, the resist composition of the invention may further comprise at least one of an organic solvent, a basic compound, a dissolution regulator, and a surfactant.

Solvent

The organic solvent used herein may be any organic solvent in which the base resin, acid generator, and other components are soluble. Illustrative, non-limiting, examples of the organic solvent include ketones such as cyclohexanone and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, it is recommended to use diethylene glycol dimethyl ether, 1-ethoxy-2-propanol, propylene glycol monomethyl ether acetate, and mixtures thereof because the acid generator is most soluble therein.

An appropriate amount of the organic solvent used is about 200 to 3,000 parts, especially about 400 to 2,500 parts by weight per 100 parts by weight of the base resin.

Basic Compound

In the resist composition, an organic nitrogen-containing compound or compounds may be compounded as the basic compound. The organic nitrogen-containing compound used herein is preferably a compound capable of suppressing the rate of diffusion when the acid generated by the acid generator diffuses within the resist film. The inclusion of organic nitrogen-containing compound holds down the rate of acid diffusion within the resist film, resulting in better resolution. In addition, it suppresses changes in sensitivity following exposure and reduces substrate and environment dependence, as well as improving the exposure latitude and the pattern profile.

Suitable organic nitrogen-containing compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, imide derivatives, and carbamate derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 4-pyrrolidinopyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, benzamide, and 1-cyclohexylpyrrolidone. Suitable imide derivatives include phthalimide, succinimide, and maleimide. Suitable carbamate derivatives include N-t-butoxycarbonyl-N,N-dicyclohexylamine, N-t-butoxycarbonylbenzimidazole and oxazolidinone.

In addition, organic nitrogen-containing compounds of the following general formula (B)-1 may also be included alone or in admixture.

$$N(X)_n(Y)_{3-n} \quad (B)\text{-}1$$

In the formula, n is equal to 1, 2 or 3; side chain Y is independently hydrogen or a straight, branched or cyclic alkyl group of 1 to 20 carbon atoms which may contain an ether or hydroxyl group; and side chain X is independently selected from groups of the following general formulas (X1) to (X3), and two or three X's may bond together to form a ring.

(X1)

(X2)

(X3)

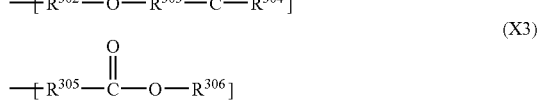

In the formulas, $R^{300}$, $R^{302}$ and $R^{305}$ are independently straight or branched alkylene groups of 1 to 4 carbon atoms; $R^{301}$ and $R^{304}$ are independently hydrogen, straight, branched or cyclic alkyl groups of 1 to 20 carbon atoms, which may contain at least one hydroxyl, ether, ester group or lactone ring; $R^{303}$ is a single bond or a straight or branched alkylene group of 1 to 4 carbon atoms; and $R^{306}$ is a straight, branched or cyclic alkyl group of 1 to 20 carbon atoms, which may contain at least one hydroxyl, ether, ester group or lactone ring.

Illustrative examples of the compounds of formula (B)-1 include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-(2-(2-hydroxyethoxy)ethoxy)ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)-ethylamine, N,N-bis(2-acetoxyethyl)-2-(tetrahydrofurfuryloxycarbonyl)-ethylamine, N,N-bis(2-hydroxyethyl)-2-[(2-oxotetrahydrofuran-3-yl)oxycarbonyl]ethylamine, N,N-bis(2-acetoxyethyl)-2-[(2-oxotetrahydrofuran-3-yl)oxycarbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)-ethylamine, N,N-bis(2-formyloxyethyl)-2-(2-formyloxyethoxycarbonyl)-ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

Also useful are one or more organic nitrogen-containing compounds having cyclic structure represented by the following general formula (B)-2.

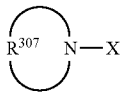
(B)-2

Herein X is as defined above, and $R^{307}$ is a straight or branched alkylene group of 2 to 20 carbon atoms which may contain one or more carbonyl, ether, ester or sulfide groups.

Illustrative examples of the organic nitrogen-containing compounds having formula (B)-2 include 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, 2-methoxyethyl morpholinoacetate, 2-morpholinoethyl 2-methoxyacetate, 2-morpholinoethyl 2-(2-methoxyethoxy)acetate, 2-morpholinoethyl 2-[2-(2-methoxyethoxy)ethoxy]acetate, 2-morpholinoethyl hexanoate, 2-morpholinoethyl octanoate, 2-morpholinoethyl decanoate, 2-morpholinoethyl laurate, 2-morpholinoethyl myristate, 2-morpholinoethyl palmitate, and 2-morpholinoethyl stearate.

Also, one or more organic nitrogen-containing compounds having cyano group represented by the following general formulae (B)-3 to (B)-6 may be blended.

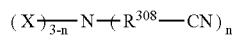
(B)-3

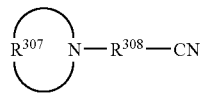
(B)-4

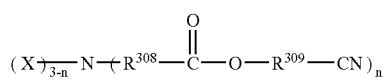
(B)-5

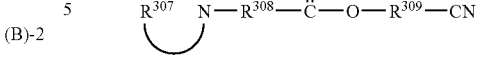
(B)-6

Herein, X, $R^{307}$ and n are as defined above, and $R^{308}$ and $R^{309}$ are each independently a straight or branched alkylene group of 1 to 4 carbon atoms.

Illustrative examples of the organic nitrogen-containing compounds having cyano represented by formulae (B)-3 to (B)-6 include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl)aminoacetonitrile, N-cyanomethyl-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

Also included are organic nitrogen-containing compounds having an imidazole structure and a polar functional group, represented by the general formula (B)-7.

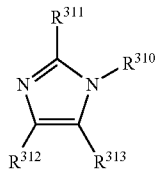

(B)-7

Herein, $R^{310}$ is a straight, branched or cyclic alkyl group of 2 to 20 carbon atoms bearing at least one polar functional group selected from among hydroxyl, carbonyl, ester, ether, sulfide, carbonate, cyano and acetal groups; $R^{311}$, $R^{312}$ and $R^{313}$ are each independently a hydrogen atom, a straight, branched or cyclic alkyl group, aryl group or aralkyl group having 1 to 10 carbon atoms.

Also included are organic nitrogen-containing compounds having a benzimidazole structure and a polar functional group, represented by the general formula (B)-8.

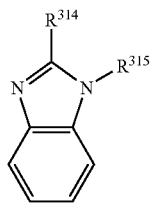

(B)-8

Herein, $R^{314}$ is a hydrogen atom, a straight, branched or cyclic alkyl group, aryl group or aralkyl group having 1 to 10 carbon atoms. $R^{315}$ is a polar functional group-bearing, straight, branched or cyclic alkyl group of 1 to 20 carbon atoms, and the alkyl group contains as the polar functional group at least one group selected from among ester, acetal and cyano groups, and may additionally contain at least one group selected from among hydroxyl, carbonyl, ether, sulfide and carbonate groups.

Further included are heterocyclic nitrogen-containing compounds having a polar functional group, represented by the general formulae (B)-9 and (B)-10.

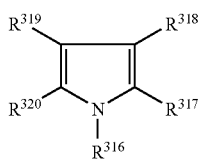

(B)-9

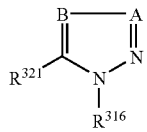

(B)-10

Herein, A is a nitrogen atom or $=C-R^{322}$, B is a nitrogen atom or $=C-R^{323}$, $R^{316}$ is a straight, branched or cyclic alkyl group of 2 to 20 carbon atoms bearing at least one polar functional group selected from among hydroxyl, carbonyl, ester, ether, sulfide, carbonate, cyano and acetal groups; $R^{317}$, $R^{318}$, $R^{319}$ and $R^{320}$ are each independently a hydrogen atom, a straight, branched or cyclic alkyl group or aryl group having 1 to 10 carbon atoms, or a pair of $R^{317}$ and $R^{316}$ and a pair of $R^{319}$ and $R^{320}$, taken together, may form a benzene, naphthalene or pyridine ring; $R^{321}$ is a hydrogen atom, a straight, branched or cyclic alkyl group or aryl group having 1 to 10 carbon atoms; $R^{322}$ and $R^{323}$ each are a hydrogen atom, a straight, branched or cyclic alkyl group or aryl group having 1 to 10 carbon atoms, or a pair of $R^{321}$ and $R^{323}$, taken together, may form a benzene or naphthalene ring.

Also included are organic nitrogen-containing compounds of aromatic carboxylic ester structure having the general formulae (B1)-11 to (B)-14.

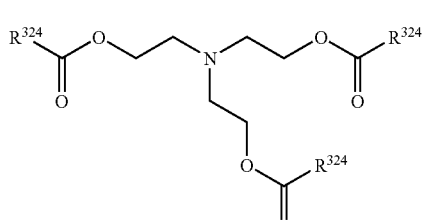

(B)-11

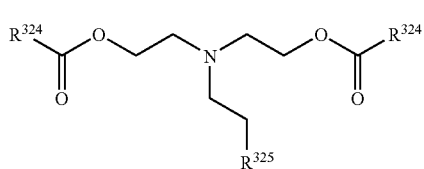

(B)-12

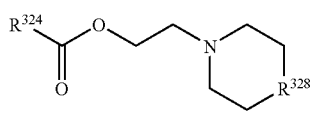

(B)-13

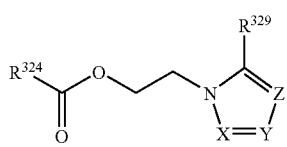

(B)-14

Herein $R^{324}$ is a $C_6$-$C_{20}$ aryl group or $C_4$-$C_{20}$ hetero-aromatic group, in which some or all of hydrogen atoms may be replaced by halogen atoms, straight, branched or cyclic $C_1$-$C_{20}$ alkyl groups, $C_6$-$C_{20}$ aryl groups, $C_7$-$C_{20}$ aralkyl groups, $C_1$-$C_{10}$ alkoxy groups, $C_1$-$C_{10}$ acyloxy groups or $C_1$-$C_{10}$ alkylthio groups. $R^{325}$ is $CO_2R^{326}$, $OR^{327}$ or cyano group. $R^{326}$ is a $C_1$-$C_{10}$ alkyl group, in which some methylene groups may be replaced by oxygen atoms. $R^{327}$ is a $C_1$-$C_{10}$ alkyl or acyl group, in which some methylene groups may be replaced by oxygen atoms. $R^{328}$ is a single bond, methylene, ethylene, sulfur atom or —O(CH$_2$CH$_2$O)$_n$— group wherein n is 0, 1, 2, 3 or 4. R$^{329}$ is hydrogen, methyl, ethyl or phenyl. X is a nitrogen atom or CR$^{330}$. Y is a nitrogen atom or CR$^{331}$. Z is a nitrogen atom or CR$^{332}$. R$^{330}$, R$^{331}$ and R$^{332}$ are each independently hydrogen, methyl or phenyl. Alternatively, a pair of R$^{330}$ and R$^{331}$ or a pair of R$^{331}$ and R$^{332}$ may bond together to form a C$_6$-C$_{20}$ aromatic ring or C$_2$-C$_{20}$ heteroaromatic ring.

Further included are organic nitrogen-containing compounds of 7-oxanorbornane-2-carboxylic ester structure having the general formula (B)-15.

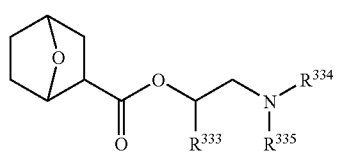

(B)-15

Herein R$^{333}$ is hydrogen or a straight, branched or cyclic C$_1$-C$_{10}$ alkyl group. R$^{334}$ and R$^{335}$ are each independently a C$_1$-C$_{20}$ alkyl group, C$_6$-C$_{20}$ aryl group or C$_7$-C$_{20}$ aralkyl group, which may contain one or more polar functional groups selected from among ether, carbonyl, ester, alcohol, sulfide, nitrile, amine, imine, and amide and in which some hydrogen atoms may be replaced by halogen atoms. R$^{334}$ and R$^{335}$, taken together, may form a heterocyclic or hetero-aromatic ring of 2 to 20 carbon atoms.

The organic nitrogen-containing compounds may be used alone or in admixture of two or more. The organic nitrogen-containing compound is preferably formulated in an amount of 0.001 to 2 parts, and especially 0.01 to 1 part by weight, per 100 parts by weight of the base resin. At least 0.001 phr of the nitrogen-containing compound achieves a desired addition effect whereas up to 2 phr minimizes a risk of lowering sensitivity.

Surfactant

The resist composition of the invention may include a surfactant which is commonly used for improving the coating characteristics. It may be added in conventional amounts so long as this does not compromise the objects of the invention.

Nonionic surfactants are preferred, examples of which include perfluoroalkylpolyoxyethylene ethanols, fluorinated alkyl esters, perfluoroalkylamine oxides, perfluoroalkyl EO-addition products, and fluorinated organosiloxane compounds. Useful surfactants are commercially available under the trade names Fluorad FC-430 and FC-431 from Sumitomo 3M, Ltd., Surflon S-141, S-145, KH-10, KH-20, KH-30 and KH-40 from Asahi Glass Co., Ltd., Unidyne DS-401, DS-403 and DS-451 from Daikin Industry Co., Ltd., Megaface F-8151 from Dai-Nippon Ink & Chemicals, Inc., and X-70-092 and X-70-093 from Shin-Etsu Chemical Co., Ltd. Preferred surfactants are Fluorad FC-430 from Sumitomo 3M, Ltd., KH-20 and KH-30 from Asahi Glass Co., Ltd., and X-70-093 from Shin-Etsu Chemical Co., Ltd.

Also, if desired, other components including dissolution regulators, carboxylic acid compounds and acetylene alcohol derivatives may be added to the resist composition of the invention. Optional components may be added in conventional amounts so long as this does not compromise the objects of the invention.

Dissolution Regulator

The dissolution regulator which can be added to the resist composition is a compound having on the molecule at least two phenolic hydroxyl groups, in which an average of from 0 to 100 mol % of all the hydrogen atoms on the phenolic hydroxyl groups are replaced by acid labile groups or a compound having on the molecule at least one carboxyl group, in which an average of 50 to 100 mol % of all the hydrogen atoms on the carboxyl groups are replaced by acid labile groups, both the compounds having a weight average molecular weight within a range of 100 to 1,000, and preferably 150 to 800.

The degree of substitution of the hydrogen atoms on the phenolic hydroxyl groups with acid labile groups is on average at least 0 mol %, and preferably at least 30 mol %, of all the phenolic hydroxyl groups. The upper limit is 100 mol %, and preferably 80 mol %. The degree of substitution of the hydrogen atoms on the carboxyl groups with acid labile groups is on average at least 50 mol %, and preferably at least 70 mold, of all the carboxyl groups, with the upper limit being 100 mol %.

Preferable examples of such compounds having two or more phenolic hydroxyl groups or compounds having at least one carboxyl group include those of formulas (D1) to (D14) below.

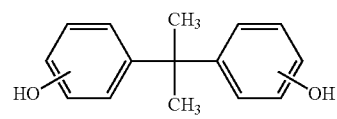

(D1)

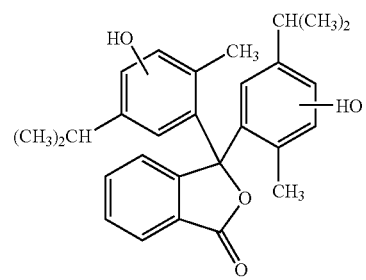

(D2)

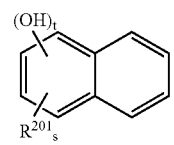

(D3)

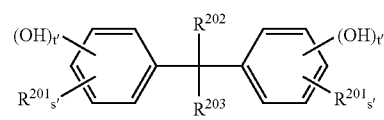

(D4)

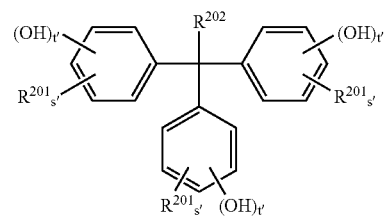

(D5)

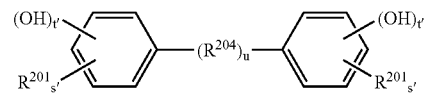

(D6)

-continued

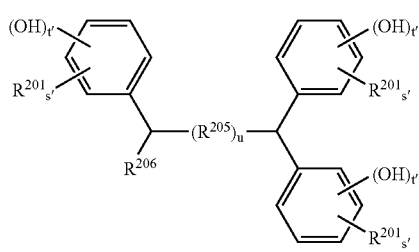 (D7)

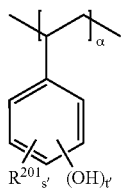 (D8)

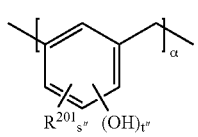 (D9)

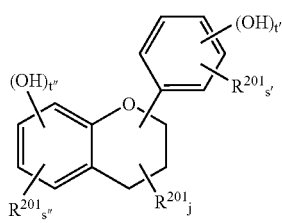 (D10)

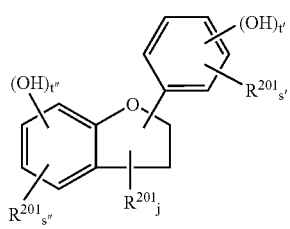 (D11)

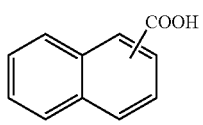 (D12)

 (D13)

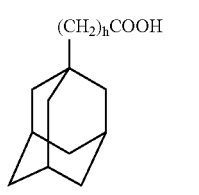

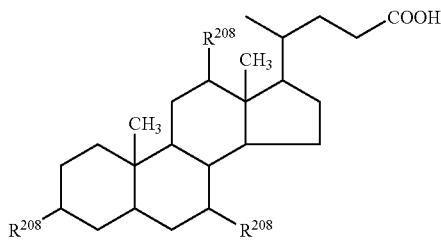 (D14)

In these formulas, $R^{201}$ and $R^{202}$ are each hydrogen or a straight or branched $C_1$-$C_8$ alkyl or alkenyl group, for example, hydrogen, methyl, ethyl, butyl, propyl, ethynyl and cyclohexyl.

$R^{203}$ is hydrogen, a straight or branched $C_1$-$C_8$ alkyl or alkenyl group, or —($R^{207}$)$_h$—COOH wherein $R^{207}$ is a straight or branched $C_1$-$C_{10}$ alkylene and h is 0 or 1, for example, those exemplified for $R^{201}$ and $R^{202}$ and —COOH and —CH$_2$COOH.

$R^{204}$ is —(CH$_2$)$_i$— wherein i=2 to 10, $C_6$-$C_{10}$ arylene, carbonyl, sulfonyl, an oxygen atom, or a sulfur atom, for example, ethylene, phenylene, carbonyl, sulfonyl, oxygen atom or sulfur atom.

$R^{205}$ is a $C_1$-$C_{10}$ alkylene, a $C_6$-$C_{10}$ arylene, carbonyl, sulfonyl, an oxygen atom, or a sulfur atom, for example, methylene and those exemplified for $R^{204}$.

$R^{206}$ is hydrogen, a straight or branched $C_1$-$C_8$ alkyl or alkenyl group, or a phenyl or naphthyl group having hydroxyl substituted thereon, for example, hydrogen, methyl, ethyl, butyl, propyl, ethynyl, cyclohexyl, hydroxyl-substituted phenyl, and hydroxyl-substituted naphthyl.

$R^{208}$ is hydrogen or hydroxyl.

The letter j is an integer from 0 to 5; u and h are each 0 or 1; s, t, s', t', s", and t" are each numbers which satisfy s+t=8, s'+t'=5, and s"+t"=4, and are such that each phenyl skeleton has at least one hydroxyl group; and a is a number such that the compounds of formula (D8) or (D9) have a weight average molecular weight of from 100 to 1,000.

Exemplary acid labile groups on the dissolution regulator include a variety of such groups, typically groups of the general formulae (L1) to (L4), tertiary alkyl groups of 4 to 20 carbon atoms, trialkylsilyl groups in which each of the alkyls has 1 to 6 carbon atoms, and oxoalkyl groups of 4 to 20 carbon atoms. Examples of the respective groups are as previously described.

The dissolution regulator may be formulated in an amount of 0 to 50 parts, preferably 0 to 40 parts, and more preferably 0 to 30 parts by weight, per 100 parts by weight of the base resin, and may be used singly or as a mixture of two or more thereof. Up to 50 phr of the dissolution regulator minimizes a risk of slimming the patterned film and reducing the resolution.

The dissolution regulator can be synthesized by introducing acid labile groups into a compound having phenolic hydroxyl or carboxyl groups in accordance with an organic chemical formulation.

In the resist composition, a carboxylic acid compound may be blended. Exemplary, non-limiting carboxylic acid compounds include one or more compounds selected from Groups I and II below. Including this compound improves the PED stability of the resist and ameliorates edge roughness on nitride film substrates.

Group 1:

Compounds in which some or all of the hydrogen atoms on the phenolic hydroxyl groups of the compounds of general formulas (A1) to (A10) below are replaced by —$R^{400}$—COOH (wherein $R^{401}$ is a straight or branched alkylene of 1 to 10 carbon atoms), and in which the molar ratio C/(C+D) of phenolic hydroxyl groups (C) to ≡C—COOH groups (D) in the molecule is from 0.1 to 1.0.

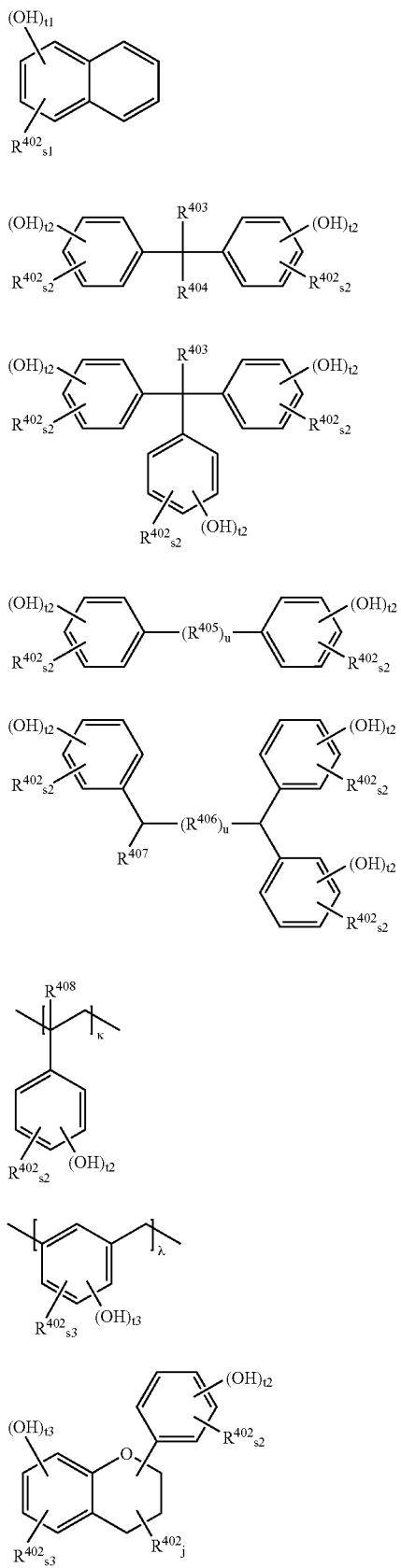

In these formulas, $R^{402}$ and $R^{403}$ are each hydrogen or a straight or branched $C_1$-$C_8$ alkyl or alkenyl; $R^{404}$ is hydrogen, a straight or branched $C_1$-$C_8$ alkyl or alkenyl, or a —$(R^{409})_h$—COOR' group (R' being hydrogen or —$R^{409}$—COOH); $R^{405}$ is —$(CH_2)_i$— (wherein i is 2 to 10), a $C_6$-$C_{10}$ arylene, carbonyl, sulfonyl, an oxygen atom, or a sulfur atom; $R^{406}$ is a $C_1$-$C_{10}$ alkylene, a $C_6$-$C_{10}$ arylene, carbonyl, sulfonyl, an oxygen atom, or a sulfur atom; $R^{407}$ is hydrogen, a straight or branched $C_1$-$C_8$ alkyl or alkenyl, or a hydroxyl-substituted phenyl or naphthyl; $R^{408}$ is hydrogen or methyl; $R^{409}$ is a straight or branched $C_1$-$C_{10}$ alkylene; $R^{410}$ is hydrogen, a straight or branched $C_1$-$C_8$ alkyl or alkenyl, or a —$R^{111}$—COOH group; $R^{411}$ is a straight or branched $C_1$-$C_{10}$ alkylene; the letter j is an integer from 0 to 3; s1, t1, s2, t2, s3, t3, s4, and t4 are each numbers which satisfy s1+t1=8, s2+t2=5, s3+t3=4, and s4+t4=6, and are such that each phenyl structure has at least one hydroxyl group; u is a number from 1 to 4, h is a number from 1 to 4; κ is a number such that the compound of formula (A6) may have a weight average molecular weight of 1,000 to 5,000; and λ is a number such that the compound of formula (A7) may have a weight average molecular weight of 1,000 to 10,000.

Group II:
Compounds of general formulas (A11) to (A15) below.

-continued

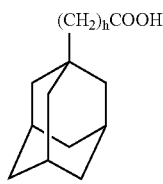 (A14)

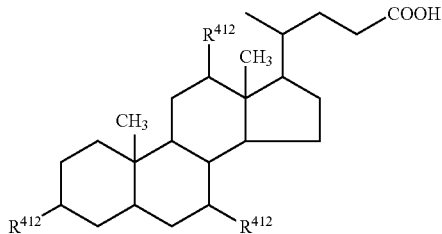 (A15)

In these formulas, $R^{402}$, $R^{403}$, and $R^{411}$ are as defined above; $R^{412}$ is hydrogen or hydroxyl; s5 and t5 are numbers which satisfy $s5 \geqq 0$, $t5 \geqq 0$, and $s5+t5=5$; and h is a number from 1 to 4.

Illustrative, non-limiting examples of the compound having a carboxyl group include compounds of the general formulas AI-1 to AI-14 and AII-1 to AII-10 below.

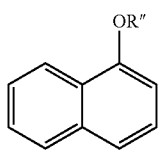 (AI-1)

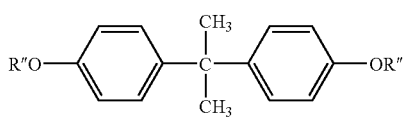 (AI-2)

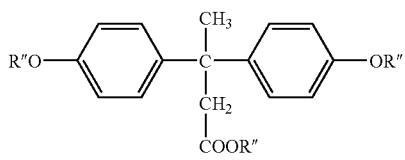 (AI-3)

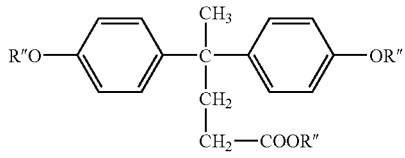 (AI-4)

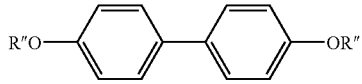 (AI-5)

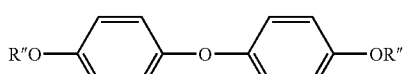 (AI-6)

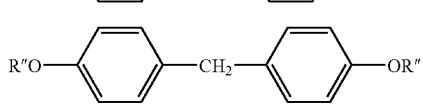 (AI-7)

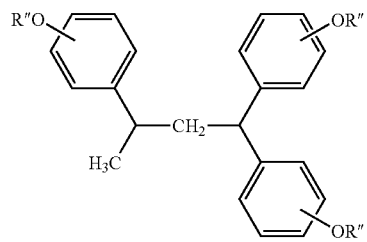 (AI-8)

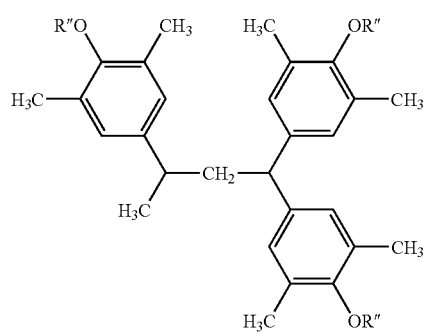 (AI-9)

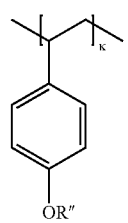 (AI-10)

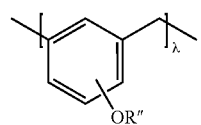 (AI-11)

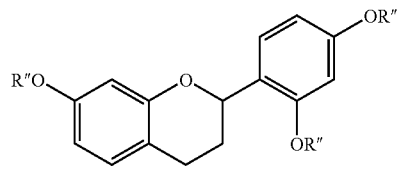 (AI-12)

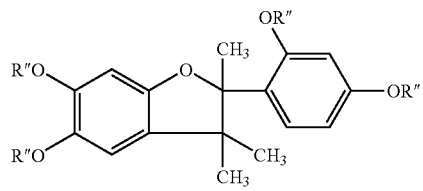 (AI-13)

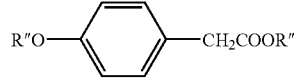 (AI-14)

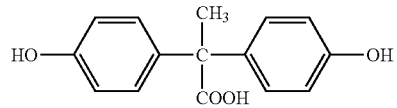 (AII-1)

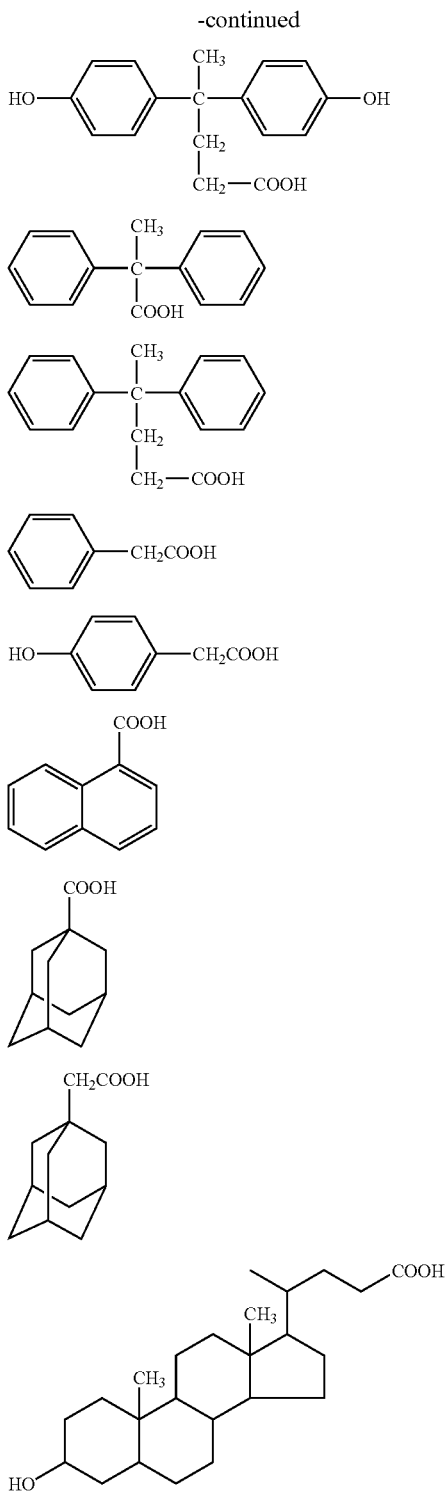

In the above formulas, R" is hydrogen or a —CH₂COOH group such that the —CH₂COOH group accounts for 10 to 100 mol % of R" in each compound, κ and λ are as defined above.

The compound having a ≡C—COOH group in the molecule is added in an amount ranging from 0 to 5 parts, preferably 0.1 to 5 parts, more preferably 0.1 to 3 parts, even more preferably 0.1 to 2 parts by weight, per 100 parts by weight of the base resin. Up to 5 phr of the compound minimizes a risk of the resist composition reducing its resolution.

The resist composition of the invention may additionally include an acetylene alcohol derivative. Preferred acetylene alcohol derivatives are those having the general formula (S1) or (S2) below.

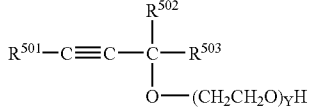

(S1)

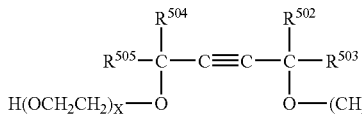

(S2)

In the formulas, $R^{501}$, $R^{502}$, $R^{503}$, $R^{504}$, and $R^{505}$ are each hydrogen or a straight, branched or cyclic $C_1$-$C_8$ alkyl; and X and Y are each 0 or a positive number, satisfying $0 \leq X \leq 30$, $0 \leq Y \leq 30$, and $0 \leq X+Y \leq 40$.

Preferable examples of the acetylene alcohol derivative include Surfynol 61, Surfynol 82, Surfynol 104, Surfynol 104E, Surfynol 104H, Surfynol 104A, Surfynol TG, Surfynol PC, Surfynol 440, Surfynol 465, and Surfynol 485 from Air Products and Chemicals Inc., and Surfynol E1004 from Nisshin Chemical Industry K.K.

The acetylene alcohol derivative is preferably added in an amount of 0.01 to 2% by weight, and more preferably 0.02 to 1% by weight, based on the weight of the resist composition. At least 0.01 wt % is fully effective in improving the coating operation and shelf stability. Up to 2 wt % minimizes a risk of the resist composition reducing its resolution.

If desired, crosslinkers commonly used in negative resist or other applications may be added to the resist composition. Suitable crosslinkers include compounds having at least two hydroxymethyl, alkoxymethyl, epoxy or vinyl ether groups in a molecule. Exemplary crosslinkers are substituted glycoluril derivatives, urea derivatives, and hexa(methoxymethyl) melamine compounds. Examples include N,N,N',N'-tetramethoxymethylurea, hexamethoxymethylmelamine, tetrahydroxymethyl-substituted glycoluril, tetraalkoxymethyl-substituted glycoluril compounds such as tetramethoxymethylglycoluril, and condensates of phenolic compounds such as substituted or unsubstituted bis(hydroxymethylphenol) compounds and bisphenol A with epichlorohydrin. Especially preferred crosslinkers include 1,3,4,6-tetraalkoxymethylglycolurils such as 1,3,4,6-tetramethoxymethylglycoluril, as well as 1,3,4,6-tetrahydroxymethylglycoluril, 2,6-dihydroxymethyl-p-cresol, 2,6-dihydroxymethylphenol, 2,2',6,6'-tetrahydroxymethylbisphenol A, 1,4-bis[2-(2-hydroxypropyl)]benzene, N,N,N',N'-tetramethoxymethylurea, and hexamethoxymethylmelamine.

In the resist composition, the crosslinker is added in any desired amount, preferably in an amount of 1 to 25 parts by weight, more preferably 5 to 20 parts by weight per 100 parts by weight of the base resin. The crosslinkers may be used alone or in admixture of two or more.

Process

The pattern forming process of the invention involves the steps of (1) applying the resist composition onto a substrate to form a coating, (2) heat treating the coating and exposing it to high-energy radiation, and (3) developing the exposed coating with a developer. Preferably the high-energy radiation has a wavelength in the range of 180 to 250 nm.

The step of exposing the resist coating to high-energy radiation may be an immersion lithography step of directing radiation via a liquid and be carried out, for example, by using radiation having a wavelength of 180 to 250 nm, holding a liquid between the projection lens and the resist-coated substrate and directing the radiation to the substrate via the liquid. The liquid used in the immersion lithography is typically water.

Pattern formation using the resist composition of the invention may be carried out by a known lithographic technique. For example, the resist composition is applied onto a substrate such as a silicon wafer by spin coating or the like. The coating is then pre-baked on a hot plate at 60 to 150° C. for 1 to 10 minutes, and preferably at 80 to 140° C. for 1 to 5 minutes to form a resist film having a thickness of 0.1 to 2.0 µm.

Once the resist film is formed, light exposure in water is carried out by KrF or ArF immersion lithography. This is followed by post-exposure bake (PEB) and development in an alkaline developer for 10 to 300 seconds. An aqueous solution of 2.38 wt % tetramethylammonium hydroxide (TMAH), which is commonly used as the alkaline developer, is used herein whereby the resist film is developed. Sometimes water is left on the resist film prior to PEB. If PEB is performed in the presence of residual water, water can penetrate into the resist coating to suck up the acid in the resist, impeding pattern formation. To fully remove the water on the resist film prior to PEB, the water on the resist should be dried or recovered by suitable means, for example, spin drying prior to PEB, purging of the film surface with dry air or nitrogen, or optimizing the water recovery nozzle configuration or process on a stage after the exposure. Additionally, the resist film of the invention has high water repellency and thus advantageously facilitates water recovery.

The type of photoresist material is not particularly limited while polymers of formulae (R1) and (R2) as defined above are advantageously used as the base resin. The photoresist may be either positive or negative working and also either a monolayer resist of conventional hydrocarbon or a bilayer resist containing silicon atoms and the like. For KrF lithography resist materials, the preferred base resins are polyhydroxystyrene or polyhydroxystyrene-(meth)acrylate copolymers in which some or all hydrogen atoms of hydroxyl or carboxyl groups are replaced by acid labile groups.

For ArF lithography resist materials, the base resin must have an aromatic-free structure. Illustrative polymers include polyacrylic acid and derivatives thereof, norbornene derivative-maleic anhydride alternating copolymers and ternary or quaternary copolymers thereof with polyacrylic acid or derivatives thereof, tetracyclododecene derivative-maleic anhydride alternating copolymers and ternary or quaternary copolymers thereof with polyacrylic acid or derivatives thereof, norbornene derivative-maleimide alternating copolymers and ternary or quaternary copolymers thereof with polyacrylic acid or derivatives thereof, tetracyclododecene derivative-maleimide alternating copolymers and ternary or quaternary copolymers thereof with polyacrylic acid or derivatives thereof, and polynorbornene and metathesis ring-opening polymers, and a combination comprising at least one of the foregoing polymers.

The photoresist film formed from the resist composition of the invention exhibits a good barrier property against water and prevents the photoresist material from being dissolved or leached in water. It thus eliminates a need for a protective coating in the immersion lithography, contributing to a reduction of the cost required in the formation of protective coating or the like. Also the photoresist film has so large a receding contact angle with water that few droplets are left on the resist film surface after immersion lithography scanning, minimizing defective pattern formation which is caused by residual droplets on the film surface.

When used for mask blanks, the resist compositions of the invention often include novolac and hydroxystyrene base resins. Those resins in which hydroxyl groups are substituted by acid labile groups are used for positive resists while these resins in combination with crosslinkers are used for negative resists. Base polymers which can be used herein include copolymers of hydroxystyrene with one or more of (meth) acrylic derivatives, styrenes, vinyl naphthalenes, vinyl anthracenes, vinyl pyrenes, hydroxyvinyl naphthalenes, hydroxyvinyl anthracenes, indenes, hydroxyindenes, acenaphthylenes, and norbornadienes. Suitable crosslinkers include melamine compounds, guanamine compounds, glycoluril compounds and urea compounds having substituted thereon at least one group selected from methylol, alkoxymethyl and acyloxymethyl groups, and epoxy compounds, thioepoxy compounds, isocyanate compounds, azide compounds and compounds having a double bond such as an alkenyl ether group. These compounds may be used as an additive or introduced as pendant groups on polymer side chains. Compounds having a hydroxy group are also useful as the crosslinker.

Where the inventive polymer is used as an additive to a resist composition for use with mask blanks, the inventive polymer is added to the above-mentioned base resin to form a resist solution, which is coated on a mask blank substrate of $SiO_2$, Cr, CrO, CrN, MoSi or the like. By further forming a SOG film and an organic undercoat film between the photoresist and the blank substrate, there is provided a three-layer structure which is also acceptable herein. Once the resist film is formed, the structure is irradiated with electron beam in vacuum using an electron beam exposure system. The irradiation is followed by post-exposure baking (PEB) and development in an alkaline developer for 10 to 300 seconds.

EXAMPLE

Examples of the invention are given below by way of illustration and not by way of limitation. The abbreviations used herein are GPC for gel permeation chromatography, NMR for nuclear magnetic resonance, Mw for weight average molecular weight, Mn for number average molecular weight, and Mw/Mn for molecular weight dispersity. Mw and Mn are determined by GPC versus polystyrene standards. All parts are by weight (pbw).

Preparation of Polymers

Additive polymers to be added to resist compositions were prepared by combining monomers, effecting copolymerization reaction in isopropyl alcohol as a solvent, pouring the polymerization solution into hexane for crystallization, washing the polymer with hexane, isolating and drying. The resulting polymers were analyzed for composition by $^1$H-NMR and for Mw and Mw/Mn by GPC.

Polymer 1
Mw=7,300
Mw/Mn=1.67
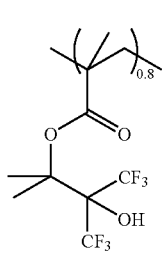 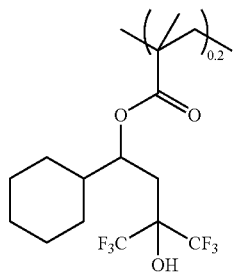
Polymer 2
Mw=7,400
Mw/Mn=1.61
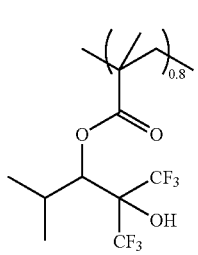 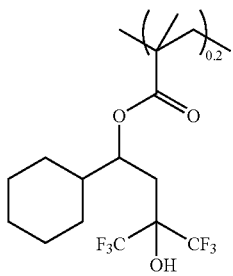
Polymer 3
Mw=6,100
Mw/Mn=1.68
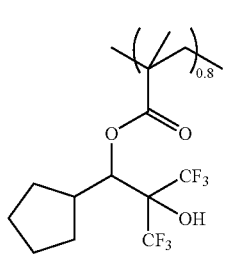 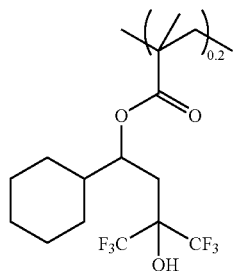
Polymer 4
Mw=8,000
Mw/Mn=1.80
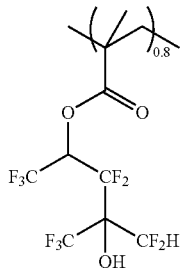 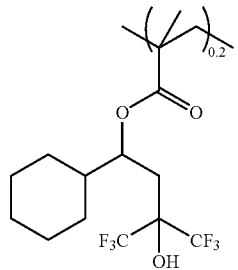
Polymer 5
Mw=8,100
Mw/Mn=1.74
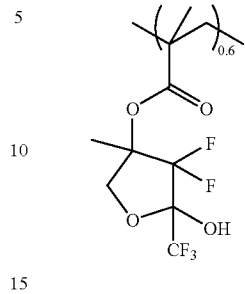 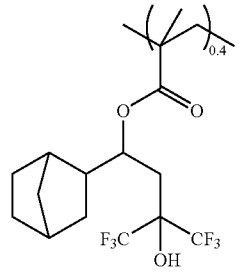
Polymer 6
Mw=8,300
Mw/Mn=1.79
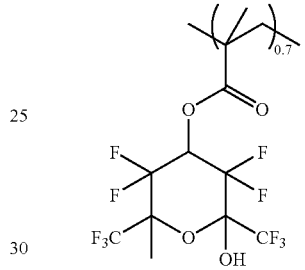 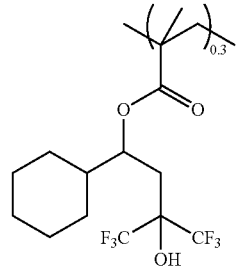
Polymer 7
Mw=7,800
Mw/Mn=1.78
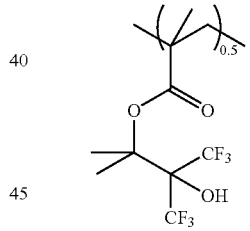 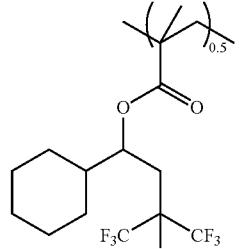
Polymer 8
Mw=7,600
Mw/Mn=1.69
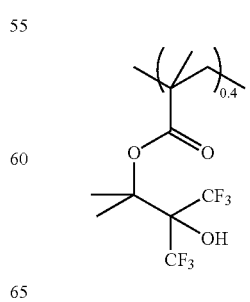 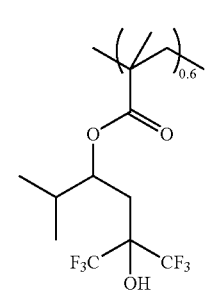

Polymer 9
 Mw=7,900
 Mw/Mn=1.82

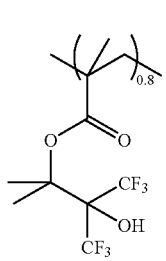 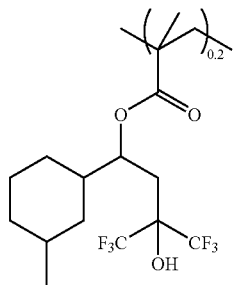

Polymer 10
 Mw=7,100
 Mw/Mn=1.81

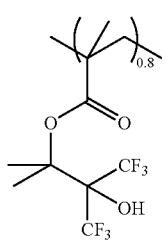 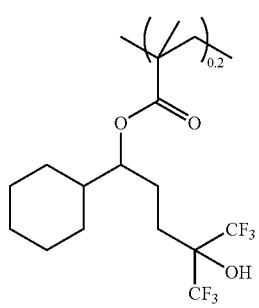

Polymer 11
 Mw=7,300
 Mw/Mn=1.86

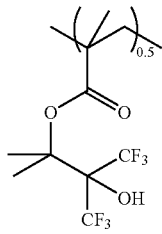 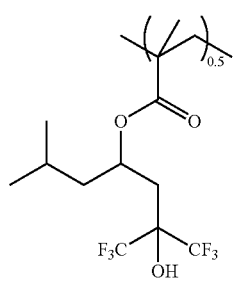

Polymer 12
 Mw=7,900
 Mw/Mn=1.83

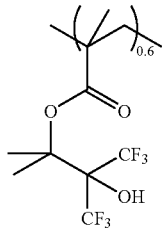 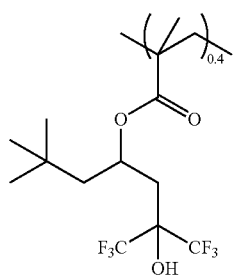

Polymer 13
 Mw=7,800
 Mw/Mn=1.81

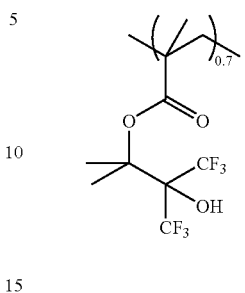 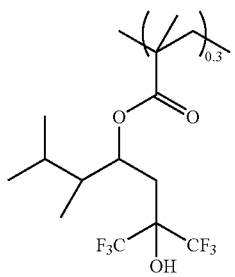

Reference Polymer 1
 Mw=7,600
 Mw/Mn=1.71

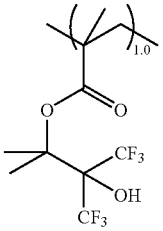

Reference Polymer 2
 Mw=8,100
 Mw/Mn=1.72

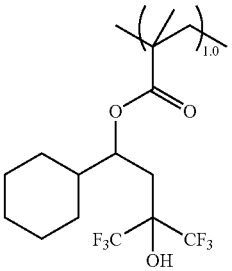

Reference Polymer 3
 Mw=8,600
 Mw/Mn=1.77

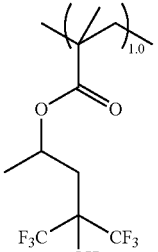

Preparation of Resist Compositions

Resist compositions, designated Resists 1 and 2, were prepared by combining and dissolving a base resin, a photoacid generator, and a basic compound in an organic solvent in accordance with the recipe shown below, and filtering through a Teflon® filter having a pore size of 0.2

Resist 1

Mixing Composition:

| | |
|---|---|
| Base Resin 1 | 100 pbw |
| PAG | 5 pbw |
| Basic compound | 1 pbw |
| Organic solvent | 1800 pbw |

Base Resin 1 has the following structural formula.

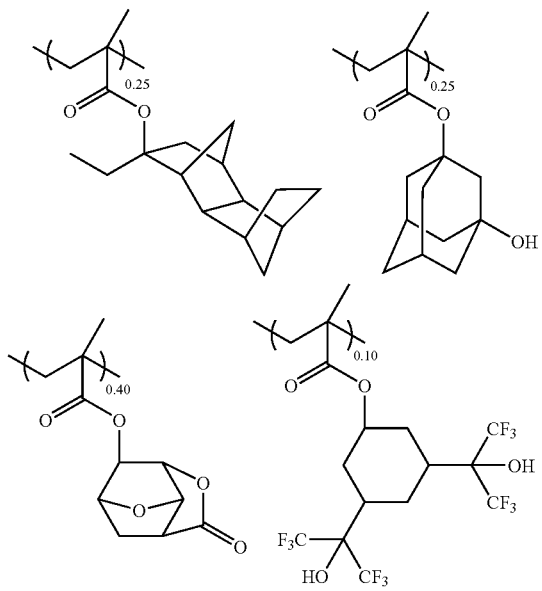

Mw 7,600
Mw/Mn=1.76
PAG: triphenylsulfonium nonafluorobutanesulfonate
Basic compound (or quencher): 2-(2-methoxyethoxymethoxy)ethylmorpholine
Organic solvent: 1-methoxyisopropyl acetate

Resist 2

Mixing Composition:

| | |
|---|---|
| Base Resin 2 | 100 pbw |
| PAG | 7 pbw |
| Basic compound | 0.8 pbw |
| Organic solvent 1 | 1330 pbw |
| Organic solvent 2 | 570 pbw |

Base Resin 2 has the following structural formula.

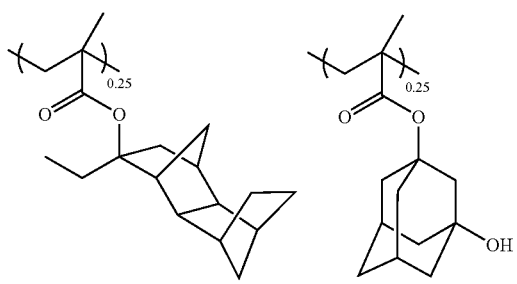

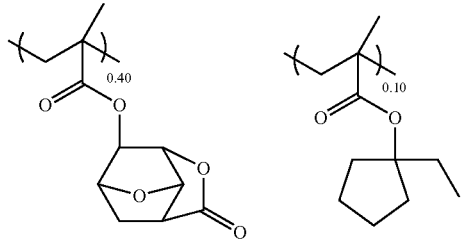

Mw=5,700
Mw/Mn=1.69
PAG: 4-t-butoxyphenyldiphenylsulfonium 1,1,3,3,3-pentafluoro-2-benzoyloxypropanesulfonate
Basic compound (or quencher): 2-cyclohexylcarboxyethylmorpholine
Organic solvent 1: 1-methoxyisopropyl acetate
Organic solvent 2: cyclohexanone Resist coating solutions (Examples 1-19 and Comparative Examples 1-5) were prepared by compounding the resist composition as a matrix with one of the above-prepared polymers (Polymers 1 to 13) in a suitable proportion. Table 1 shows a combination of the additive polymer and the matrix resist composition and a proportion. It is noted that the proportion of the additive polymer is expressed in parts by weight per 100 parts by weight of the base resin in the matrix resist composition.

TABLE 1

| Resist solution | Matrix resist composition | Additive polymer (amount) |
|---|---|---|
| Example 1 | Resist 1 | Polymer 1 (5 pbw) |
| Example 2 | Resist 1 | Polymer 2 (5 pbw) |
| Example 3 | Resist 1 | Polymer 3 (5 pbw) |
| Example 4 | Resist 1 | Polymer 4 (5 pbw) |
| Example 5 | Resist 1 | Polymer 5 (5 pbw) |
| Example 6 | Resist 1 | Polymer 6 (5 pbw) |
| Example 7 | Resist 2 | Polymer 1 (5 pbw) |
| Example 8 | Resist 2 | Polymer 2 (5 pbw) |
| Example 9 | Resist 2 | Polymer 3 (5 pbw) |
| Example 10 | Resist 2 | Polymer 4 (5 pbw) |
| Example 11 | Resist 2 | Polymer 5 (5 pbw) |
| Example 12 | Resist 2 | Polymer 6 (5 pbw) |
| Example 13 | Resist 2 | Polymer 7 (5 pbw) |
| Example 14 | Resist 2 | Polymer 8 (5 pbw) |
| Example 15 | Resist 2 | Polymer 9 (5 pbw) |
| Example 16 | Resist 2 | Polymer 10 (5 pbw) |
| Example 17 | Resist 2 | Polymer 11 (5 pbw) |
| Example 18 | Resist 2 | Polymer 12 (5 pbw) |
| Example 19 | Resist 2 | Polymer 13 (5 pbw) |
| Comparative Example 1 | Resist 1 | — |
| Comparative Example 2 | Resist 2 | — |
| Comparative Example 3 | Resist 2 | Reference polymer 1 (5 pbw) |
| Comparative Example 4 | Resist 2 | Reference polymer 2 (5 pbw) |
| Comparative Example 5 | Resist 2 | Reference polymer 3 (5 pbw) |

Measurement of Receding Contact Angle and Sliding Angle

The resist solutions (Examples 1-19 and Comparative Examples 1-5) were spin coated on silicon substrates, then baked at 120° C. for 60 seconds to give photoresist films having a thickness of 200 nm.

An inclination contact angle meter Drop Master 500 by Kyowa Interface Science Co., Ltd. was used. The wafer with the resist film was kept horizontal, and 50 μL of ultrapure water was dropped on the resist film to form a droplet. While the wafer was gradually inclined, the angle (sliding angle) at which the droplet started sliding down was determined as well as receding contact angle. The results are shown in Table 2.

TABLE 2

| Resist solution | Matrix resist composition | Additive polymer (amount) | Sliding angle (°) | Receding contact angle (°) |
| --- | --- | --- | --- | --- |
| Example 1 | Resist 1 | Polymer 1 (5 pbw) | 17 | 68 |
| Example 2 | Resist 1 | Polymer 2 (5 pbw) | 17 | 69 |
| Example 3 | Resist 1 | Polymer 3 (5 pbw) | 16 | 72 |
| Example 4 | Resist 1 | Polymer 4 (5 pbw) | 17 | 71 |
| Example 5 | Resist 1 | Polymer 5 (5 pbw) | 18 | 67 |
| Example 6 | Resist 1 | Polymer 6 (5 pbw) | 18 | 67 |
| Example 7 | Resist 2 | Polymer 1 (5 pbw) | 15 | 66 |
| Example 8 | Resist 2 | Polymer 2 (5 pbw) | 16 | 66 |
| Example 9 | Resist 2 | Polymer 3 (5 pbw) | 14 | 69 |
| Example 10 | Resist 2 | Polymer 4 (5 pbw) | 15 | 70 |
| Example 11 | Resist 2 | Polymer 5 (5 pbw) | 16 | 65 |
| Example 12 | Resist 2 | Polymer 6 (5 pbw) | 16 | 64 |
| Example 13 | Resist 2 | Polymer 7 (5 pbw) | 13 | 76 |
| Example 14 | Resist 2 | Polymer 8 (5 pbw) | 16 | 73 |
| Example 15 | Resist 2 | Polymer 9 (5 pbw) | 16 | 75 |
| Example 16 | Resist 2 | Polymer 10 (5 pbw) | 15 | 73 |
| Example 17 | Resist 2 | Polymer 11 (5 pbw) | 15 | 78 |
| Example 18 | Resist 2 | Polymer 12 (5 pbw) | 16 | 79 |
| Example 19 | Resist 2 | Polymer 13 (5 pbw) | 16 | 80 |
| Comparative Example 1 | Resist 1 | — | 23 | 55 |
| Comparative Example 2 | Resist 2 | — | 18 | 51 |
| Comparative Example 3 | Resist 2 | Reference Polymer 1 (5 pbw) | 21 | 60 |
| Comparative Example 4 | Resist 2 | Reference Polymer 2 (5 pbw) | 8 | 88 |
| Comparative Example 5 | Resist 2 | Reference Polymer 3 (5 pbw) | 14 | 72 |

A smaller sliding angle indicates an easier flow of water on the resist film. A larger receding contact angle indicates that fewer liquid droplets are left during high-speed scan exposure. As is evident from Table 2, resist solutions having the inventive polymers compounded therein (Examples 1 to 19) form photoresist-films which have a larger receding contact angle and a smaller sliding angle than those photoresist films without the inventive polymer (Comparative Examples 1, 2). It is demonstrated that inclusion of the inventive polymer achieves a drastic improvement in the receding contact angle of photoresist film without adversely affecting the sliding angle.

Measurement of Leach-Outs

The resist solutions (Examples 1-19 and Comparative Examples 1-5) were spin coated on silicon substrates, then baked at 120° C. for 60 seconds to give photoresist films having a thickness of 200 nm. Using an ArF scanner S305B (Nikon Corp.), the entire surface of the photoresist film was irradiated through an open frame at an energy dose of 50 mJ/cm$^2$. Then a true circle ring of Teflon® having an inner diameter of 10 cm was placed on the resist film, 10 mL of deionized water was carefully injected inside the ring, and the resist film was kept in contact with water at room temperature for 60 seconds. Thereafter, the water was recovered, and a concentration of PAG anion in the water was measured by an LC-MS analyzer (Agilent). The anion concentration measured indicates an amount of anions leached out for 60 seconds. The results are shown in Table 3.

TABLE 3

| Resist solution | Matrix resist composition | Additive polymer (amount) | Anion leach-out (ppb) |
| --- | --- | --- | --- |
| Example 1 | Resist 1 | Polymer 1 (5 pbw) | 8 |
| Example 2 | Resist 1 | Polymer 2 (5 pbw) | 7 |
| Example 3 | Resist 1 | Polymer 3 (5 pbw) | 5 |
| Example 4 | Resist 1 | Polymer 4 (5 pbw) | 7 |
| Example 5 | Resist 1 | Polymer 5 (5 pbw) | 10 |
| Example 6 | Resist 1 | Polymer 6 (5 pbw) | 9 |
| Example 7 | Resist 2 | Polymer 1 (5 pbw) | 12 |
| Example 8 | Resist 2 | Polymer 2 (5 pbw) | 10 |
| Example 9 | Resist 2 | Polymer 3 (5 pbw) | 9 |
| Example 10 | Resist 2 | Polymer 4 (5 pbw) | 10 |
| Example 11 | Resist 2 | Polymer 5 (5 pbw) | 14 |
| Example 12 | Resist 2 | Polymer 6 (5 pbw) | 11 |
| Example 13 | Resist 2 | Polymer 7 (5 pbw) | 3 |
| Example 14 | Resist 2 | Polymer 8 (5 pbw) | 8 |
| Example 15 | Resist 2 | Polymer 9 (5 pbw) | 5 |
| Example 16 | Resist 2 | Polymer 10 (5 pbw) | 7 |
| Example 17 | Resist 2 | Polymer 11 (5 pbw) | 4 |
| Example 18 | Resist 2 | Polymer 12 (5 pbw) | 3 |
| Example 19 | Resist 2 | Polymer 13 (5 pbw) | 3 |

TABLE 3-continued

| Resist solution | Matrix resist composition | Additive polymer (amount) | Anion leach-out (ppb) |
|---|---|---|---|
| Comparative Example 1 | Resist 1 | — | 25 |
| Comparative Example 2 | Resist 2 | — | 36 |
| Comparative Example 3 | Resist 2 | Reference Polymer 1 (5 pbw) | 18 |
| Comparative Example 4 | Resist 2 | Reference Polymer 2 (5 pbw) | 2 |
| Comparative Example 5 | Resist 2 | Reference Polymer 3 (5 pbw) | 6 |

In a further run, the resist solutions of Examples 1 and 13 and Comparative Examples 4 and 5 were refined by three passes of filtering through a high-density polyethylene filter with a pore size of 0.02 µm. The resist solution was applied onto an antireflective coating ARC-29A (Nissan Chemical Co., Ltd.) of 87 nm thick formed on a 8-inch silicon substrate and baked at 110° C. for 60 seconds, forming a resist film of 150 nm thick. The wafer over its entire surface was exposed by means of an ArF scanner model S307E (Nikon Corp., NA 0.85, σ 0.93, ⅘ annular illumination, 6% halftone phase shift mask), post-exposure baked (PEB) at 110° C. for 60 seconds, and developed with a 2.38 wt % TMAH aqueous solution for 30 seconds, forming a 100-nm line-and-space pattern over the wafer surface. Using a flaw detector Win-Win 50-1200 (Tokyo Seimitsu Co., Ltd.), defects were observed at the pixel size of 0.125 µm. The results are shown in Table 4.

TABLE 4

| Resist solution | Number of defects |
|---|---|
| Example 1 | 2 |
| Example 13 | 5 |
| Comparative Example 4 | 143 |
| Comparative Example 5 | 103 |

EB Exposure

In an EB exposure test, a positive resist material was prepared by dissolving an EB lithographic resist polymer synthesized by radical polymerization, and other components, all shown below, in propylene glycol monomethyl ether acetate (PGMEA) and ethyl lactate (EL) according to the recipe shown in Table 5, and filtering through a filter with a pore size of 0.2 µm.

Using Clean Track Mark 5 (Tokyo Electron Ltd.), the positive resist material was spin coated on a silicon substrate with a diameter of 6 inches and prebaked on a hot plate at 110° C. for 60 seconds to form a resist film of 200 nm thick. Using HL-800D (Hitachi, Ltd.) at a HV voltage of 50 keV, imagewise exposure was performed on the resist film in a vacuum chamber. The resist film was then allowed to stand in the vacuum chamber for 20 hours, after which additional imagewise exposure was performed at a different area.

Using Clean Track Mark 5 (Tokyo Electron Ltd.), immediately after the imagewise exposure, the resist film was post-exposure baked (PEB) on a hot plate at 90° C. for 60 seconds and puddle developed in a 2.38 wt % TMAH aqueous solution for 30 seconds to form a positive pattern. The resist pattern was evaluated as follows.

Using a measurement SEM S-7280 (Hitachi, Ltd.), the line width of a 0.12 µm line-and-space pattern at the exposure dose which provided a 1:1 resolution at the top and bottom of a 0.12 µm line-and-space pattern in the area exposed immediately before development was measured. A width change during vacuum holding was determined by subtracting therefrom the line width of a 0.12 µm line-and-space pattern at the same exposure dose in the area exposed 20 hours earlier. Positive values of width change indicate that the resist sensitivity varies toward a higher level during vacuum holding whereas negative values indicate that the resist sensitivity varies toward a lower level.

TABLE 5

| Polymer (pbw) | PAG (pbw) | Basic compound (pbw) | Dissolution regulator (pbw) | Organic solvent (pbw) | Additive polymer (pbw) | Width change (nm) |
|---|---|---|---|---|---|---|
| EB resist polymer (100) | PAG2 (10) | Quencher1 (0.4) | — | PGMEA (700) EL (300) | Polymer 1 (5) | −1 |
| EB resist polymer (100) | PAG2 (10) | Quencher1 (0.4) | — | PGMEA (700) EL (300) | Polymer 2 (5) | 0 |
| EB resist polymer (100) | PAG2 (10) | Quencher1 (0.4) | — | PGMEA (700) EL (300) | Polymer 3 (5) | −1 |
| EB resist polymer (100) | PAG2 (10) | Quencher1 (0.4) | — | PGMEA (700) EL (300) | Polymer 4 (5) | −1 |
| EB resist polymer (100) | PAG2 (10) | Quencher1 (0.4) | — | PGMEA (700) EL (300) | Polymer 5 (5) | 0 |
| EB resist polymer (100) | PAG2 (10) | Quencher1 (0.4) | — | PGMEA (700) EL (300) | Polymer 6 (5) | −1 |
| EB resist polymer (100) | PAG2 (10) | Quencher1 (0.4) | — | PGMEA (700) EL (300) | — | −9 |
| EB resist polymer (100) | PAG2 (10) | Quencher1 (0.4) | — | PGMEA (700) EL (300) | Polymer 7 (5) | −1 |

As is evident from Table 3, the photoresist films formed from the resist solutions having the additive polymers of the invention compounded therein (Examples 1 to 19) are effective for preventing the PAG component from being leached out in water.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

Although the resist composition applied to the immersion lithography has been described, it is also applicable to conventional lithography.

When a polymer of the invention is added to an EB lithography resist, it improves the stability of a resist film during vacuum holding.

Japanese Patent Application No. 2006-282203 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition which is a chemically amplified positive resist composition, comprising 100 parts by weight of a base resin comprising at least recurring units having acid labile groups and recurring units having hydroxyl groups and/or adhesive groups of lactone ring, and 0.1 to 50 parts by weight the polymer comprising recurring units of formula (1):

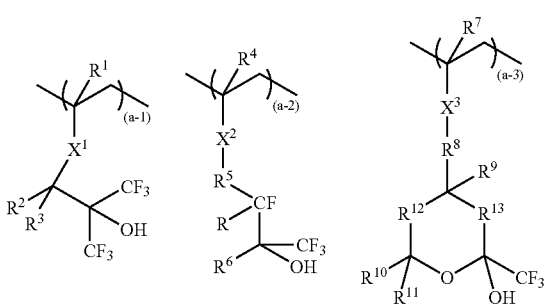

-continued

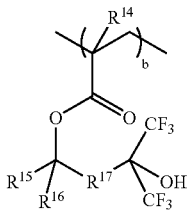

wherein $R^1$, $R^4$, $R^7$, and $R^{14}$ are each independently hydrogen or methyl, $R^2$, $R^3$, $R^{15}$, and $R^{16}$ are each independently hydrogen or a straight, branched or cyclic $C_1$-$C_{20}$ alkyl or fluoroalkyl group, or $R^2$ and $R^3$, and $R^{15}$ and $R^{16}$ may bond together to form a ring with the carbon atom to which they are attached, and in this case, $R^2$ and $R^3$, and $R^{15}$ and $R^{16}$, taken together, stand for a straight, branched or cyclic $C_2$-$C_{20}$ alkylene or fluoroalkylene group, R is fluorine or hydrogen, or may bond with $R^5$ to form a ring of 3 to 10 carbon atoms in total with the carbon atom to which they are attached, $R^5$ is a straight, branched or cyclic $C_1$-$C_6$ alkylene group in which at least one hydrogen atom may be substituted by a fluorine atom, $R^6$ is a straight or branched $C_1$-$C_{10}$ alkyl group in which at least one hydrogen atom is substituted by a fluorine atom, $R^5$ and $R^6$ may bond together to form a ring with the carbon atoms to which they are attached, and in this case, $R^5$ and $R^6$, taken together, stand for a trivalent organic group of 2 to 12 carbon atoms in total in which at least one hydrogen atom is substituted by a fluorine atom, $R^8$ is a single bond or a $C_1$-$C_4$ alkylene group, $R^{10}$ and $R^{11}$ are each independently hydrogen, fluorine, methyl or trifluoromethyl, $R^{12}$ and $R^{13}$ are each independently a single bond, —O— or —$CR^{18}R^{19}$—, $R^9$, $R^{18}$, and $R^{19}$ are hydrogen, fluorine, methyl or trifluoromethyl, $R^{17}$ is a straight or branched $C_1$-$C_4$ alkylene group or may bond with $R^{15}$ or $R^{16}$ to form a $C_3$-$C_{10}$ aliphatic ring with the carbon atom to which they are attached, $X^1$, $X^2$ and $X^3$ are each independently —C(=O)—O—, —O—, or —C(=O)—$R^{20}$—C(=O)—O— wherein $R^{20}$ is a straight, branched or cyclic $C_1$-$C_{10}$ alkylene group, the subscripts are numbers in the range: $0 \leq (a-1) < 1$, $0 \leq (a-2) < 1$, $0 \leq (a-3) < 1$, $0 < (a-1)+(a-2)+(a-3) < 1$, $0 < b < 1$, and $0 < (a-1)+(a-2)+(a-3)+b \leq 1$.

2. The resist composition of claim 1, further comprising at least one member selected from the group consisting of an organic solvent, a basic compound, a dissolution regulator, a crosslinker, and a surfactant.

3. A pattern forming process comprising the steps of:
applying the resist composition of claim 1 onto a substrate to form a coating,
heat treating the coating and exposing it to high-energy radiation, and
developing the exposed coating with a developer.

4. The process of claim 3, wherein the high-energy radiation has a wavelength of 180 to 250 nm.

5. The process of claim 3, wherein the exposing step is by immersion lithography involving exposing the coating to high-energy radiation through a liquid.

6. The process of claim 5, wherein the immersion lithography involves using high-energy radiation having a wavelength of 180 to 250 nm, introducing a liquid between the resist-coated substrate and a projection lens, and exposing the substrate to the high-energy radiation through the liquid.

7. The process of claim 5, wherein the liquid is water.

8. The process of claim 3, wherein the high-energy radiation is an electron beam.

9. A pattern forming process comprising the steps of:
applying the resist composition of claim 1 onto a mask blank substrate to form a coating,
heat treating the coating and exposing it to high-energy radiation, and
developing the coating with a developer.

10. The resist composition of claim 1, wherein the recurring units (a-1) in formula (1) are selected from the group consisting of the following formulae:

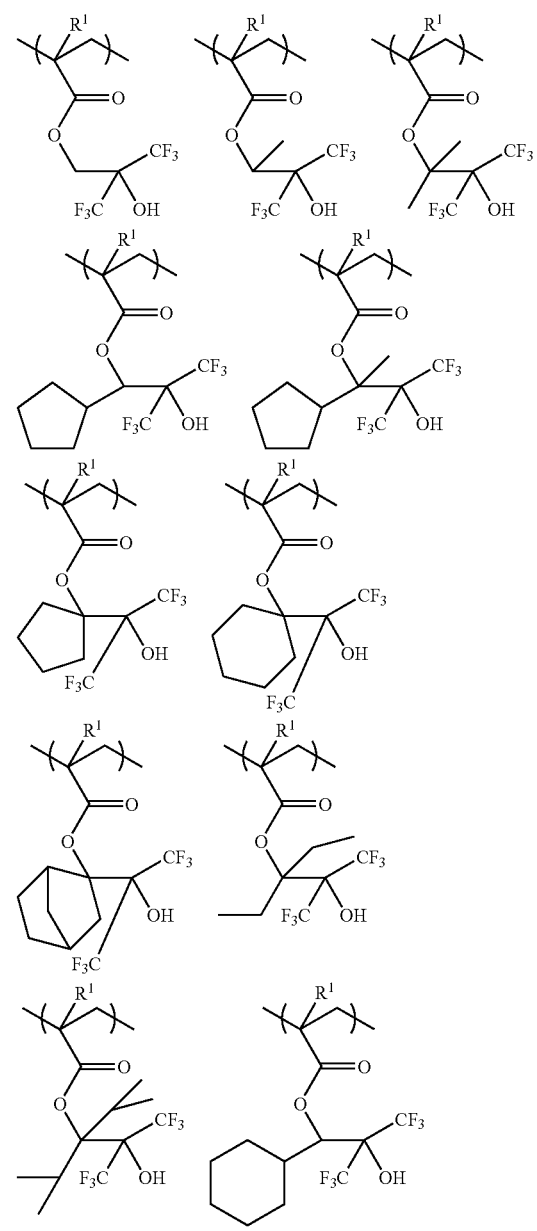

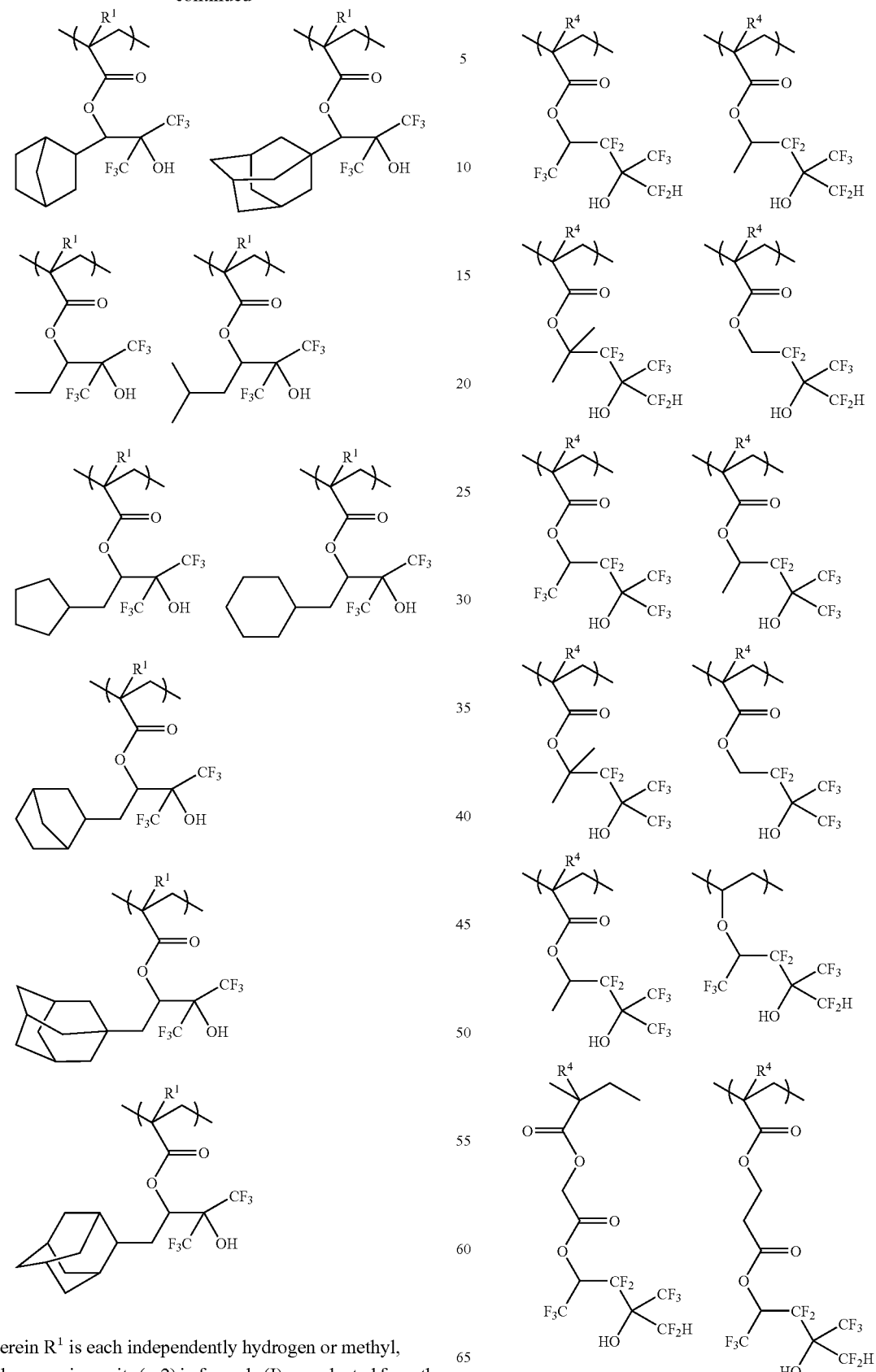
wherein $R^1$ is each independently hydrogen or methyl,
the recurring units (a-2) in formula (I) are selected from the group consisting of the following formulae:

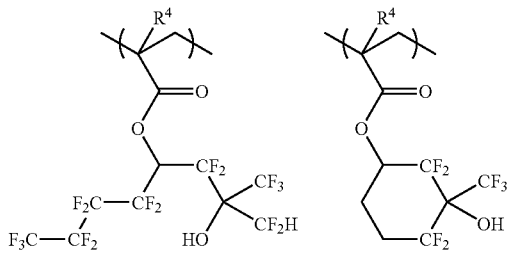
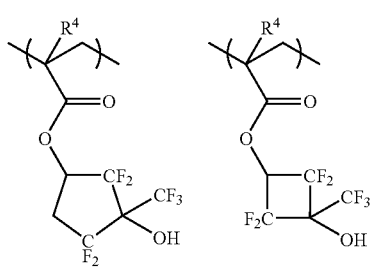
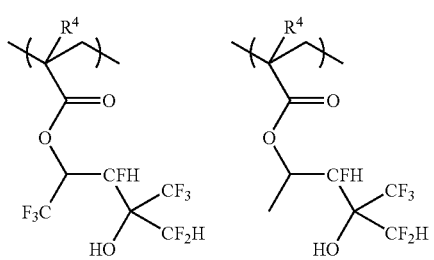
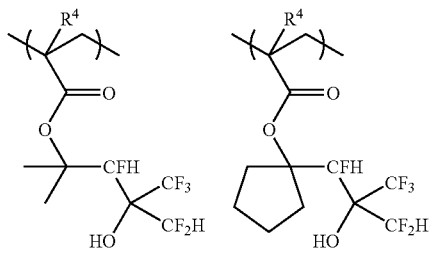
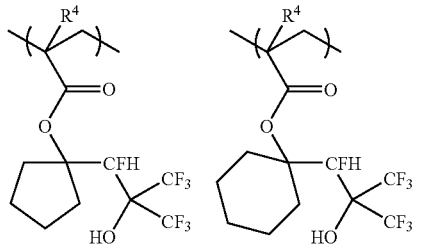
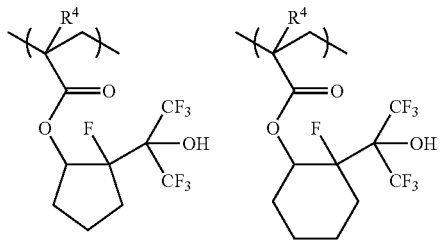
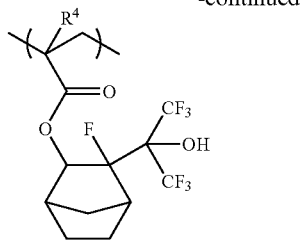
wherein $R^4$ is each independently hydrogen or methyl,
the recurring units (a-3) in formula (I) are selected from the group consisting of the following formulae:
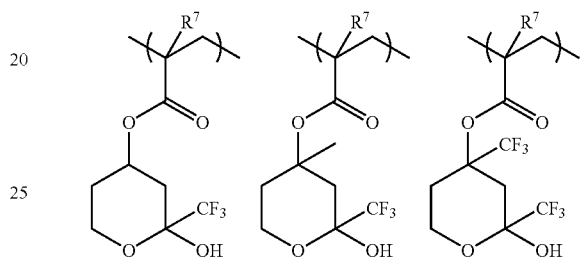
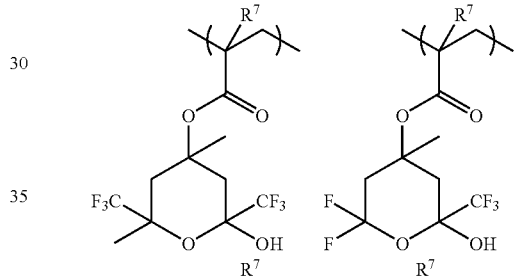
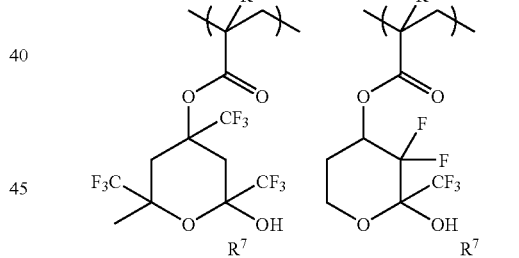
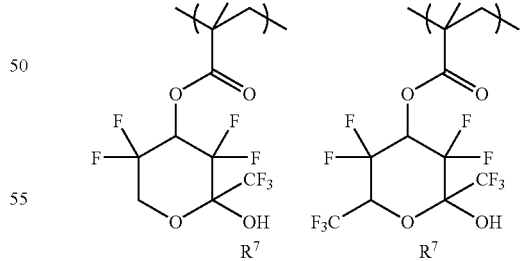
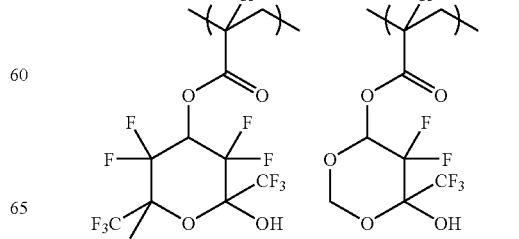

-continued
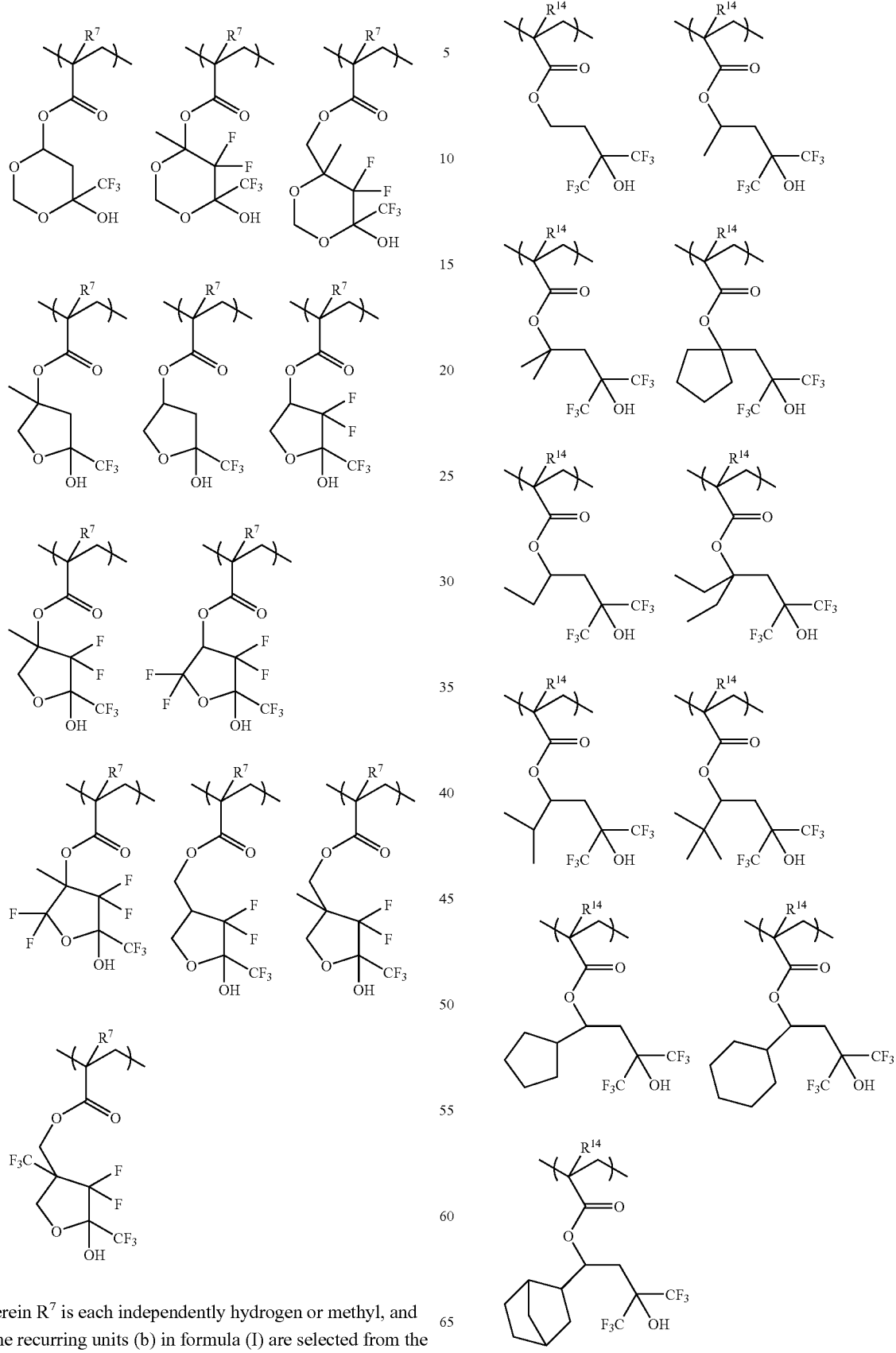
wherein R[7] is each independently hydrogen or methyl, and the recurring units (b) in formula (I) are selected from the group consisting of the following formulae:

97

-continued

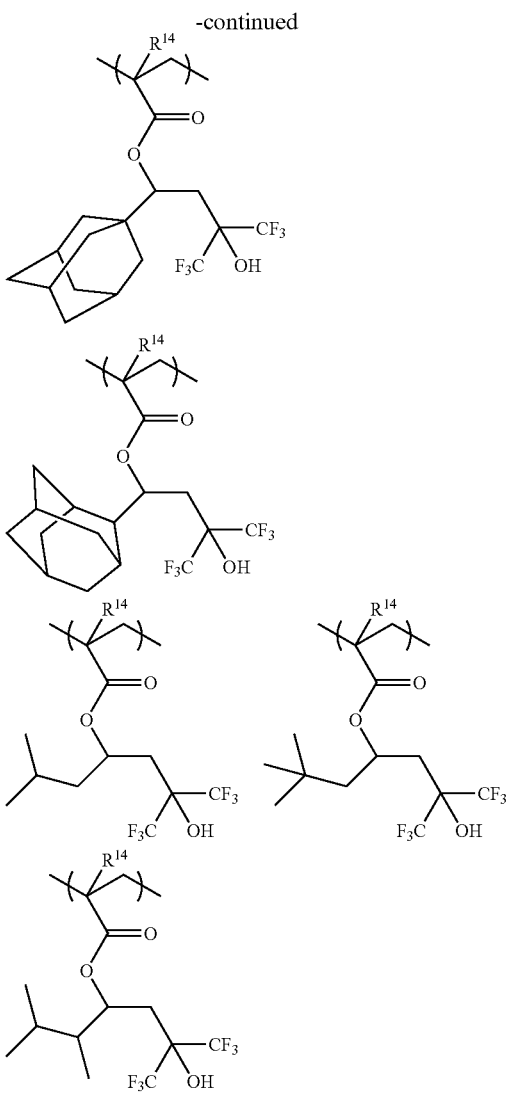

wherein $R^{14}$ is each independently hydrogen or methyl.

11. A pattern forming process comprising the steps of:
applying a resist composition of claim 1 onto a substrate to form a coating,
heat treating the coating and exposing it to an electron beam, and
developing the exposed coating with a developer,
said resist composition comprising a polymer comprising recurring units having the general formula (1):

(1)

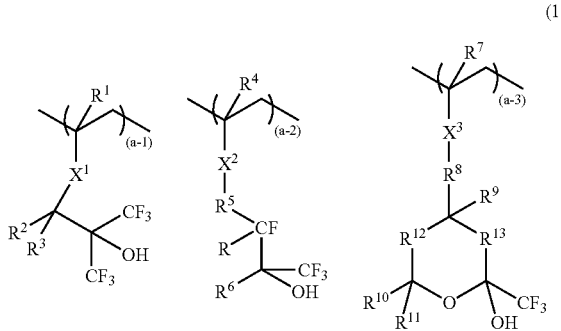

98

-continued

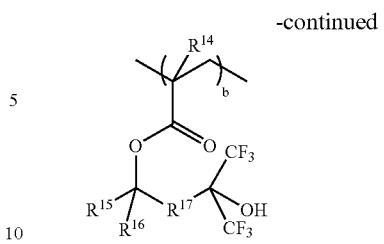

wherein $R^1$, $R^4$, $R^7$, and $R^{14}$ are each independently hydrogen or methyl,
$R^2$, $R^3$, $R^{15}$, and $R^{16}$ are each independently hydrogen or a straight, branched or cyclic $C_1$-$C_{20}$ alkyl or fluoroalkyl group, or $R^2$ and $R^3$, and $R^{15}$ and $R^{16}$ may bond together to form a ring with the carbon atom to which they are attached, and in this case, $R^2$ and $R^3$, and $R^{15}$ and $R^{16}$, taken together, stand for a straight, branched or cyclic $C_2$-$C_{20}$ alkylene or fluoroalkylene group,
R is fluorine or hydrogen, or may bond with $R^5$ to form a ring of 3 to 10 carbon atoms in total with the carbon atom to which they are attached,
$R^5$ is a straight, branched or cyclic $C_1$-$C_6$ alkylene group in which at least one hydrogen atom may be substituted by a fluorine atom,
$R^6$ is a straight or branched $C_1$-$C_{10}$ alkyl group in which at least one hydrogen atom is substituted by a fluorine atom, $R^5$ and $R^6$ may bond together to form a ring with the carbon atoms to which they are attached, and in this case, $R^5$ and $R^6$, taken together, stand for a trivalent organic group of 2 to 12 carbon atoms in total in which at least one hydrogen atom is substituted by a fluorine atom,
$R^8$ is a single bond or a $C_1$-$C_4$ alkylene group,
$R^{10}$ and $R^{11}$ are each independently hydrogen, fluorine, methyl or trifluoromethyl,
$R^{12}$ and $R^{13}$ are each independently a single bond, —O— or —$CR^{18}R^{19}$—,
$R^9$, $R^{18}$, and $R^{19}$ are hydrogen, fluorine, methyl or trifluoromethyl,
$R^{17}$ is a straight or branched $C_1$-$C_4$ alkylene group or may bond with $R^{15}$ or $R^{16}$ to form a $C_3$-$C_{10}$ aliphatic ring with the carbon atom to which they are attached,
$X^1$, $X^2$ and $X^3$ are each independently —C(=O)—O—, —O—, or —C(=O)—$R^{20}$—C(=O)—O— wherein $R^{20}$ is a straight, branched or cyclic $C_1$-$C_{10}$ alkylene group,
the subscripts are numbers in the range: $0 \leq (a-1) < 1$, $0 \leq (a-2) < 1$, $0 \leq (a-3) < 1$, $0 < (a-1)+(a-2)+(a-3) < 1$, $0 < b < 1$, and $0 < (a-1)+(a-2)+(a-3)+b \leq 1$.

12. A resist composition which is a chemically amplified negative resist composition,
comprising a polymer comprising recurring units having the general formula (1):

(1)

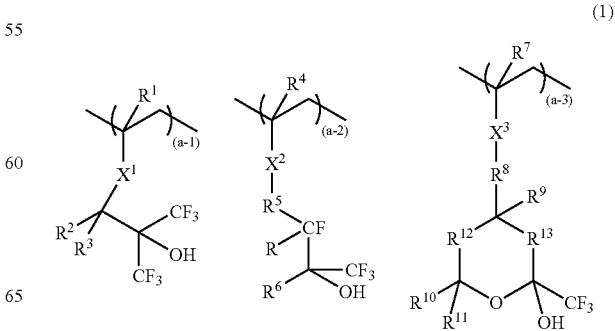

-continued

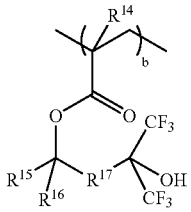

wherein $R^1$, $R^4$, $R^7$, and $R^{14}$ are each independently hydrogen or methyl, $R^2$, $R^3$, $R^{15}$, and $R^{16}$ are each independently hydrogen or a straight, branched or cyclic $C_1$-$C_{20}$ alkyl or fluoroalkyl group, or $R^2$ and $R^3$, and $R^{15}$ and $R^{16}$ may bond together to form a ring with the carbon atom to which they are attached, and in this case, $R^2$ and $R^3$, and $R^{15}$ and $R^{16}$, taken together, stand for a straight, branched or cyclic $C_2$-$C_{20}$ alkylene or fluoroalkylene group, R is fluorine or hydrogen, or may bond with $R^5$ to form a ring of 3 to 10 carbon atoms in total with the carbon atom to which they are attached, $R^5$ is a straight, branched or cyclic $C_1$-$C_6$ alkylene group in which at least one hydrogen atom may be substituted by a fluorine atom, $R^6$ is a straight or branched $C_1$-$C_{10}$ alkyl group in which at least one hydrogen atom is substituted by a fluorine atom, $R^5$ and $R^6$ may bond together to form a ring with the carbon atoms to which they are attached, and in this case, $R^5$ and $R^6$, taken together, stand for a trivalent organic group of 2 to 12 carbon atoms in total in which at least one hydrogen atom is substituted by a fluorine atom, $R^8$ is a single bond or a $C_1$-$C_4$ alkylene group, $R^{10}$ and $R^{11}$ are each independently hydrogen, fluorine, methyl or trifluoromethyl, $R^{12}$ and $R^{13}$ are each independently a single bond, —O— or —$CR^{18}R^{19}$—, $R^9$, $R^{18}$, and $R^{19}$ are hydrogen, fluorine, methyl or trifluoromethyl, $R^{17}$ is a straight or branched $C_1$-$C_4$ alkylene group or may bond with $R^{15}$ or $R^{16}$ to form a $C_3$-$C_{10}$ aliphatic ring with the carbon atom to which they are attached, $X^1$, $X^2$ and $X^3$ are each independently —C(=O)—O—, —O—, or —C(=O)—$R^{20}$—C(=O)—O— wherein $R^{20}$ is a straight, branched or cyclic $C_1$-$C_{10}$ alkylene group, the subscripts are numbers in the range: $0 \leq (a-1) < 1$, $0 \leq (a-2) < 1$, $0 \leq (a-3) < 1$, $0 < (a-1)+(a-2)+(a-3) < 1$, $0 < b < 1$, and $0 < (a-1)+(a-2)+(a-3)+b \leq 1$.

13. The resist composition of claim 12, further comprising at least one member selected from the group consisting of an organic solvent, a basic compound, a crosslinker, and a surfactant.

14. A pattern forming process comprising the steps of:
applying the resist composition of claim 12 onto a substrate to form a coating,
heat treating the coating and exposing it to high-energy radiation, and
developing the exposed coating with a developer.

15. The process of claim 14, wherein the exposing step is by immersion lithography involving exposing the coating to high-energy radiation through a liquid, wherein the immersion lithography involves using high-energy radiation having a wavelength of 180 to 250 nm, introducing a liquid between the resist-coated substrate and a projection lens, and exposing the substrate to the high-energy radiation through the liquid.

16. The process of claim 15, wherein the liquid is water.

17. The process of claim 14, wherein the high-energy radiation is an electron beam.

18. A pattern forming process comprising the steps of:
applying the resist composition of claim 12 onto a mask blank substrate to form a coating,
heat treating the coating and exposing it to high-energy radiation, and
developing the coating with a developer.

* * * * *